United States Patent
Srowig et al.

(10) Patent No.: US 12,394,958 B2
(45) Date of Patent: Aug. 19, 2025

(54) LIGHT MODULE AND LIDAR APPARATUS HAVING AT LEAST ONE LIGHT MODULE OF THIS TYPE

(71) Applicant: Elmos Semiconductor SE, Dortmund (DE)

(72) Inventors: Andre Srowig, Dortmund (DE); Fabian Finkeldey, Dortmund (DE)

(73) Assignee: Elmos Semiconductor SE, Dortmund (DE)

( * ) Notice: Subject to any disclaimer, the term of this patent is extended or adjusted under 35 U.S.C. 154(b) by 610 days.

(21) Appl. No.: 17/788,681

(22) PCT Filed: Jan. 7, 2021

(86) PCT No.: PCT/EP2021/050199
§ 371 (c)(1),
(2) Date: Jun. 23, 2022

(87) PCT Pub. No.: WO2021/140160
PCT Pub. Date: Jul. 15, 2021

(65) Prior Publication Data
US 2023/0023489 A1    Jan. 26, 2023

(30) Foreign Application Priority Data

Jan. 7, 2020 (DE) .................... 10 2020 100 142.8
Apr. 23, 2020 (DE) .................... 10 2020 111 075.8
(Continued)

(51) Int. Cl.
*H01S 3/00*         (2006.01)
*G01S 7/481*        (2006.01)
(Continued)

(52) U.S. Cl.
CPC .......... *H01S 5/0428* (2013.01); *G01S 7/4811* (2013.01); *G01S 7/4815* (2013.01);
(Continued)

(58) Field of Classification Search
CPC ............... H01S 5/0428; H01S 5/02345; H01S 5/06216; H01S 5/06835; H01S 5/4031
See application file for complete search history.

(56) References Cited

U.S. PATENT DOCUMENTS 6,697,402 B2    2/2004   Crawford
7,400,310 B2 *  7/2008   LeMay ................ H05B 45/42
                                              345/82
(Continued)

FOREIGN PATENT DOCUMENTS

CN    101545582 A    1/2011
CN    109642952 A    9/2023
(Continued)

OTHER PUBLICATIONS

Extended European Search Report issued Dec. 5, 2023 in correlated European Application No. 23187901.6.

*Primary Examiner* — Kinam Park
(74) *Attorney, Agent, or Firm* — Mindful IP PLLC

(57) ABSTRACT

A light module has a carrier with a circuit die. On the top side of the carrier, a light-emitting diode die and a charge store component are electrically connected to the conduction path terminal areas of a transistor by means of die-to-die bondings. The electrical connection between the two dies and the conduction path of the transistor is as short as possible. A terminal area is situated in each case on the top side of the two dies, which terminal areas are connected to one another using a first bonding wire. The charge store component is charged by means of a charging circuit which is electrically connected to the charge store component via a second bonding wire. The second bonding wire is longer (Continued)

than the first bonding wire. The light module may be part of a LIDAR apparatus.

24 Claims, 26 Drawing Sheets

(30) Foreign Application Priority Data

Jun. 3, 2020 (DE) .................. 10 2020 114 782.1
Sep. 22, 2020 (DE) .................. 10 2020 124 564.5

(51) Int. Cl.
| | |
|---|---|
| G01S 7/484 | (2006.01) |
| G01S 17/10 | (2020.01) |
| H01L 23/00 | (2006.01) |
| H01S 5/02345 | (2021.01) |
| H01S 5/042 | (2006.01) |
| H01S 5/062 | (2006.01) |
| H01S 5/0683 | (2006.01) |
| H01S 5/40 | (2006.01) |

(52) U.S. Cl.
CPC .............. *G01S 7/484* (2013.01); *G01S 17/10* (2013.01); *H01L 24/48* (2013.01); *H01L 24/49* (2013.01); *H01S 5/02345* (2021.01); *H01S 5/06216* (2013.01); *H01S 5/06835* (2013.01); *H01S 5/4031* (2013.01); *H01L 24/05* (2013.01); *H01L 24/06* (2013.01); *H01L 2224/05553* (2013.01); *H01L 2224/0603* (2013.01); *H01L 2224/06152* (2013.01); *H01L 2224/06181* (2013.01); *H01L 2224/48101* (2013.01); *H01L 2224/48105* (2013.01); *H01L 2224/48137* (2013.01); *H01L 2224/48145* (2013.01); *H01L 2224/4903* (2013.01); *H01L 2224/49175* (2013.01)

(56) References Cited

U.S. PATENT DOCUMENTS

| | | | |
|---|---|---|---|
| 8,761,594 B1 | 6/2014 | Gross et al. | |
| 9,155,146 B2 | 10/2015 | Lee | |
| 9,185,762 B2 | 11/2015 | Mark et al. | |
| 9,285,596 B2 | 3/2016 | Soskind et al. | |
| 9,368,936 B1 | 6/2016 | Lenius et al. | |
| 10,193,304 B2 | 1/2019 | Winer et al. | |
| 2003/0180013 A1* | 9/2003 | Rosenberg | H01L 25/167 257/E25.032 |
| 2007/0086495 A1* | 4/2007 | Sprague | H01S 5/06804 372/38.02 |
| 2014/0063593 A1* | 3/2014 | Berendt | H01S 5/0428 359/341.1 |
| 2015/0022668 A1 | 1/2015 | Pekarski et al. | |
| 2018/0045882 A1 | 2/2018 | Chojnacki et al. | |
| 2018/0254605 A1* | 9/2018 | Wojcik | H01S 5/0231 |
| 2019/0312407 A1 | 10/2019 | Halbritter et al. | |
| 2020/0227889 A1* | 7/2020 | Burkard | H01S 5/0428 |
| 2020/0264426 A1 | 8/2020 | Matsui et al. | |
| 2020/0264462 A1 | 8/2020 | Liu et al. | |
| 2021/0242661 A1* | 8/2021 | Hurwitz | H01S 5/02325 |
| 2022/0263293 A1* | 8/2022 | Ali | H01S 5/02255 |
| 2022/0337029 A1* | 10/2022 | Yamamoto | H01L 24/16 |

FOREIGN PATENT DOCUMENTS

| | | |
|---|---|---|
| DE | 19514062 A1 | 11/1995 |
| DE | 19546563 C2 | 9/1997 |
| DE | 19914362 A1 | 10/1999 |
| DE | 102006036167 A1 | 2/2008 |
| DE | 102008062544 A1 | 6/2009 |
| DE | 102008021588 A1 | 12/2009 |
| DE | 102009060873 A1 | 7/2011 |
| DE | 102014105482 A1 | 10/2014 |
| DE | 102016116875 A1 | 3/2017 |
| DE | 102016116368 A1 | 3/2018 |
| DE | 102016116369 A1 | 3/2018 |
| DE | 102017100879 A1 | 7/2018 |
| DE | 102018106860 A1 | 9/2018 |
| DE | 102018106861 A1 | 9/2018 |
| DE | 102017121713 A1 | 3/2019 |
| EP | 2002519 A2 | 12/2008 |
| EP | 3301473 A1 | 4/2018 |
| EP | 3660574 A1 | 6/2020 |
| WO | 2008035983 A1 | 3/2008 |
| WO | 2018154139 A1 | 8/2018 |
| WO | 2019234180 A1 | 12/2019 |

* cited by examiner

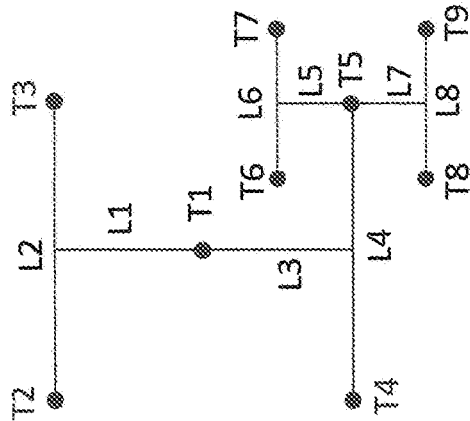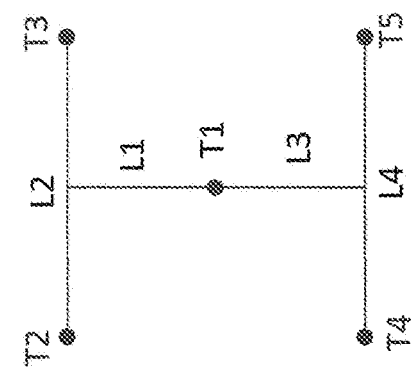
FIG. 25

LIGHT MODULE AND LIDAR APPARATUS HAVING AT LEAST ONE LIGHT MODULE OF THIS TYPE

CROSS REFERENCE TO RELATED APPLICATIONS

This application is a US National Phase of international patent application number PCT/EP2021/050199, filed on Jan. 7, 2021, claiming priority to German patent applications DE 10 2020 100 142.8 dated Jan. 7, 2020, DE 10 2020 111 075.8 dated Apr. 23, 2020, DE 10 2020 114 782.1 dated Jun. 3, 2020, and DE 10 2020 124 564.5 dated Sep. 22, 2020, the contents of which are incorporated herein by reference in their entireties.

TECHNICAL FIELD

The disclosure relates to a light module and a LIDAR device comprising at least one such light module, as well as to an optical system for a LIDAR device and an integrated circuit, in particular a driver circuit, e.g., for a LIDAR device. The disclosure further relates to the application of a LIDAR device, as well as to an optical unit for a LIDAR device.

BACKGROUND

LIDAR (abbreviation for the English term: light detection and ranging) is a method akin to radar for optical distance and velocity measurement, as well as for the remote measurement of atmospheric parameters. Instead of using radio waves, such as with radar, light or laser beams are used. If, for example, semiconductor lasers are implemented, this is sometimes also referred to as LADAR (abbreviation for the English term: light amplification by stimulation emission of radiation detection and ranging). In prior art, it is preferred to use mechanical mirrors to deflect the light or laser beams in different directions.

From DE-A-10 2009 060 873, a driver circuit for an LED is known, while it is left open how the components are to be mounted in order to minimize the parasitic inductances and capacities in an optimal manner.

DE-A-10 2008 062 544 describes a laser array circuit.

From DE-A-10 2016 116 368, a driver circuit for light-emitting opto-electronic components is known. According to FIG. 1 of this document, the charging circuit 2, 3, 4, 5, 9, 10, 11, 12, 13, 14 charges a capacitor 18 to 21 via a series resistance 3. The light emitting opto-electronic components 22 to 25 are interconnected by their cathodes to form a first star point. A driver switch 26 connects this star point to the reference potential GND when one or more of the light emitting opto-electronic components are to emit light. A buffer condenser of the charging circuit 9 serves for a fast charging of the actual energy reserve capacitor 18 to 21. In this known concept, the series resistance affects the energy balance.

From U.S. Pat. No. 10,193,304, a driver circuit is known in which the charging of the capacitors is affected such that the current stays below the response threshold of the lasers.

From EP-A-2 002 519 (see FIG. 2), a compact structure with four layers (two circuit boards, capacitors, laser and switching IC) is-known which, for the solution sought within the framework of the disclosure, is too complex and operates too slowly.

From EP-A-3 301 473, a driver circuit for an individual LED is known that is suitable for the emission of short pulses. It is not described or illustrated how the necessary inductance can be reached.

From DE-A-10 2016 116 369, a LED driver circuit is known in which each LED has its own driver switch, whereby the effort is increased and the compactness of the device is impaired.

From DE-A-10 2008 021 588, a laser driver circuit is known in which a plurality of driver switches are connected in parallel so that they can generate pulses in a manner offset with respect to each other and can cool between the pulses, while other driver switches can generate the further pulses.

From DE-A-10 2017 121 713, driver switches are known that are formed by sub-units, where each sub-unit has its own capacitor for providing the switching energy.

From DE-A-199 14 362 and DE-A-19 514 062, a control means for a gas laser are known, respectively.

From U.S. Pat. No. 9,185,762 (DE-A-10 2014 105 482), a circuit for reducing the switch-off time of a laser diode.

From DE-A-10 2017 100 879, a circuit for quickly switching an individual laser diode on and off is known. There, a configuration example is provided as well.

From DE-A-10 2018 106 860 and US-A-2018/0045882, two variants of a direct connection between a laser die and the die of an integrated driver switch are known. Here, the driver switch is connected between the supply voltage and the anode of the laser diode which, as will become clear hereinafter, prevents a particularly compact solution to a laser array.

DE-A-10 2018 106 860 describes a laser diode module in which a plurality of charge storage capacitors and a plurality of laser diode dies are arranged on a substrate. The electric connection of the laser diodes with a driver IC may be made using a bonding wire. The connection of the charge storage capacitors with a driver IC is made using a lead frame.

From US-A-2018/0045882, a laser module is known in which a laser diode die configured as an edge emitter and a charge storage capacitor are arranged on a circuit die. Among others, a power transistor is arranged in the circuit die for the electric connection of the charge storage capacitor with the laser diode. The conduction path of the power transistor can be contacted via two surface contacts of the circuit die. In addition, the circuit die has two further surface contacts provided for electric connection with the respective one contact of the charge storage capacitor and the laser diode die. The second contact of the charge storage capacitor is connected by means of a flexible circuit board with one of the two surface contacts for the conduction path of the charge storage capacitor. In the same manner, the second contact of the laser diode dies is connected with the other contact for the conduction path of the power transistor via a flexible circuit board. The electric current flowing from the capacitor to the laser diode to ignite the laser diode, thus flows through the two flexible circuit boards and via the conduction path. The electric circuit is closed by an electric connection between the laser diode and the charge storage capacitor, which is formed in the circuit die. The overall length of this electric circuit is comparatively great, which is why both electric losses and impairments by parasitic inductances are to be suspected.

DE-A-10 2016 116 875 describes a driver circuit. According to FIG. 12 of this document, it comprises a common driver switch S3 for several lasers D1, D7, the common driver switch S3 being connected with the cathodes of the lasers and being able to connect the same with the reference potential. Here, the energy for the laser pulse is drawn from a common storage capacitance C. The lasers are selected via separate switches S2. The known circuit has the disadvantage that a parasitic voltage drops over these switches S2.

From DE-B-10 2006 036 167, a laser driver circuit is known in which the resonances of the parasitic inductances and of the capacities are tuned such that they support predefined properties of the light pulses to be generated.

U.S. Pat. No. 6,697,402 describes a laser driver with laser current detection via a shunt resistor between a cathode terminal and a reference potential.

From U.S. Pat. No. 9,368,936, an individual driver circuit is known. A coil is used as the energy storage.

U.S. Pat. No. 9,155,146 describes a circuit for the energy supply of a LED chain.

From DE-A-10 2018 106 861, it is known to drive a laser diode using a H-bridge.

A driver circuit is known from DE-C-195 46 563, in which, when the driver transistor initiates the light emission, the charging circuit is disconnected from the laser diode by an inductance for the short duration of the light pulse emission.

SUMMARY

It is an object of the disclosure to provide a light module in particular for use with a LIDAR device, which avoids the above disadvantages of prior art and has additional advantages.

Further, it is another object of the disclosure to provide a LIDAR device without movable components by means of one or a plurality of light modules according to the disclosure. Finally, it is still another object of the disclosure to provide an optical system enabling optimized imaging optics and stripe-shaped illumination light, which is suited primarily for use in a LIDAR device. Lastly, a further object of the disclosure aims at providing a driver circuit for, in particular, power transistors for a short-time conduction of high currents (current pulses).

These objects of the disclosure are achieved with the subject matters of the independent claims. Individual examples of these subject matters of the disclosure are explained in the dependent claims.

The disclosure thus provides a light module comprising
a carrier provided with an upper side, in which a circuit die with integrated circuits is arranged,
the circuit die having an upper side,
a transistor, in particular a power transistor, formed in the upper side of the circuit die,
the transistor having a conduction path which can be switched to a conducting or blocking state, said path having a first end portion and a second end portion, of which the first end portion is electrically connected with a first conduction path terminal area and the second end portion is electrically connected with a second conduction path terminal area, which are both exposed at the upper side of the carrier, and the transistor comprising a control terminal for switching the conduction path to a conducting or blocking state,
a light-emitting diode die comprising a light-emitting diode die, in particular a light-emitting diode die comprising a laser diode, with a lower side comprising a first terminal area and an upper side comprising a second terminal area,
the light-emitting diode die being arranged with its first terminal area located on the first conduction path terminal area of the transistor and these two terminal areas being electrically connected with one another,
a charge storage component comprising a charge storage, said component comprising a lower side having a first terminal area and an upper side having a second terminal area,
the charge storage component being arranged with its first terminal area located on the second conduction path terminal area of the transistor and these two terminal areas being electrically connected with one another,
at least one first bonding wire which electrically connects the second terminal area of the light-emitting diode die with the second terminal area of the charge storage component,
a charging circuit for charging the charge storage component with electric charge, the circuit being integrated in the circuit die and having an output, and a control circuit for controlling the transistor and the charging circuit, the control circuit being integrated in the circuit die,
the charging circuit having assigned thereto a charge terminal area exposed on the upper side of the carrier, with which the output of the charging circuit is electrically connected,
the terminal area of the charging circuit being electrically connected with the second terminal area of the charge storage component via at least one second bonding wire, and
the control circuit controlling the charging circuit to charge the charge storage component up to a degree of charge necessary for the generation of a light pulse by the light-emitting diode die, the control circuit subsequently controlling the transistor to switch its conduction path to a conducting state.

The light module according to the disclosure comprises a carrier in which a circuit die with integrated circuits is located. The contacting of the circuit die is affected using a lead frame with a plurality of conductor tongues or fingers which end in terminal areas located on the upper side of the carrier. Thus, as it were, the carrier is the housing, typically of a plastics mass, in which the circuit die and the lead frame are embedded.

The electrical connection of the individual components of the light module are optimized with a view to a reduction of parasitic impedances, in particular parasitic inductances, so that high current pulses can be generated within a very short time which cause a powerful high-energy light pulse.

For this purpose, a transistor is located in the upper side or near the upper side of the circuit die, the transistor typically being a power transistor. One of the two terminal areas of a light-emitting diode die is electrically connected with the conduction path of the transistor. This light-emitting diode die, which preferably is a laser diode die, is suitably connected with an exposed terminal area formed in the upper side of the carrier by die-to-die bonding, which terminal area is electrically connected with one of the two end portions of the conduction path of the transistor via the lead frame and within the circuit die. This connection should be as short as possible, which is why, among other things, the arrangement of the transistor directly in or below the upper side of the circuit die is advantageous. The active area of the transistor is thus located at the upper side of the circuit die. The charge storage component, which as a rule is a capacitor, is now also located there. The charge storage component is also configured as a die and has a lower-side terminal area which is electrically connected with the conduction path terminal area of the transistor. The charging circuitry comprises a charging circuit integrated in the circuit die, which circuit is controlled by a control circuit also integrated in the circuit die. The connection to the charging circuit is lead out from the circuit die to the upper side of the carrier via the lead frame and terminates there in a terminal area which is electrically connected with the upper-side terminal area of the charge storage component by means of a (second) bonding wire. The charge storage component itself is in turn connected with the light-emitting diode die by means of a first bonding wire which is much shorter when compared to the second bonding wire, where this second bonding wire connects the upperside terminal areas of the light-emitting diode die and the charge storage component. The control circuit of the circuit die eventually also controls the transistor with interposition of a driver circuit also integrated in the circuit die. A possible configuration of this driver circuit will be addressed in detail hereinbelow.

The hybrid structure of the light module according to the disclosure provides for a minimization of parasitic inductances and ohmic resistances as well as capacitances, in particular in the discharging circuit that is defined by the conduction path of the transistor, the light-emitting diode die and the charge storage component. Preferably, the two latter components are arranged immediately next to each other on the upper side of the carrier, so that the first bonding wire can be made as short as possible. The connections between the upper-side conduction path terminal areas of the carrier for the transistor up to the actual conduction path of the transistor is also optimized, so that parasitic impedances are largely minimized here as well. The charging circuitry comprises the output of the charging circuit, the second bonding wire and the charge storage component, and is also optimized with respect to the reduction of parasitic influences by inductances and resistances as well as capacitances. Basically, it has been found that the parasitic inductance of the charging circuitry may well be advantageously greater than the parasitic capacitance of the discharging circuitry. In this case, as it were, the electric connection of the charge storage components to the charging circuitry is blocked in a way, when the discharging circuitry is closed upon the transistor being switched to be conducting, so that the charge storage can supply the light-emitting diode effectively with maximum electric energy preferably within the shortest time possible and with a quick increase. Not least, the pulse-like driving of the transistor with a great edge steepness of the electric switching pulse for the transistor also contributes to this. This in turn is supported by a driver circuit discussed below, which is advantageously designed in a corresponding manner.

As already indicated above, it is advantageous if
the at least one first bonding wire has a first parasitic inductance and a first parasitic ohmic resistance,
the at least one second bonding wire has a second parasitic inductance and a second parasitic ohmic resistance,
the electric connection of the first terminal area of the light-emitting diode die with the first end portion of the conduction path of the transistor comprises a third parasitic inductance and a third parasitic ohmic resistance, and
the electric connection between the first terminal area of the charge storage component and the second end portion of the conduction path of the transistor comprises a fourth parasitic inductance and a fourth parasitic inductance,
the electric connection of the output of the charging circuit with the charge terminal area assigned to the charging circuit comprises a fifth parasitic inductance and a fifth parasitic ohmic resistance,
wherein the first parasitic inductance, the third parasitic inductance and the fourth parasitic inductance have a magnitude that is, in total, less than the total of the magnitude of the third parasitic inductance and the fifth parasitic inductance and in particular less than ½ or less than ¼ or less than ⅕ of the total of the third parasitic inductance and the fifth parasitic inductance.

The length of the first bonding wire may in particular be less than ½ or less than ⅓ or less than ⅕ of the length of the second bonding wire. The value of the first parasitic inductance and/or the first parasitic ohmic resistance is advantageously smaller than the value of the second parasitic inductance and/or the second parasitic ohmic resistance. The parasitic inductances or the ohmic resistances of both bonding wires are preferably smaller than the other above mentioned parasitic inductances or the ohmic resistances. It is further advantageous if the first parasitic ohmic resistance, the third parasitic ohmic resistance and the fourth parasitic ohmic resistance in total have a magnitude that is smaller than the magnitude of the third ohmic resistance and the fifth ohmic resistance in total and in particular smaller than ½ or smaller than ¼ or smaller than ⅕ of the third ohmic resistance and the fifth ohmic resistance in total.

As already explained above,
the electrically interconnected components, i.e., the light-emitting diode die, the charge storage component, the at least one first bonding wire and the transistor with its conduction path together form a discharging circuit with a first parasitic inductance and a first parasitic ohmic resistance, and
the charge storage component with its electric connection to the output of the charging circuit forms a charging circuitry via the at least one second bonding wire, which circuitry has a second parasitic inductance and a second parasitic ohmic resistance, wherein the first parasitic inductance is smaller than the second parasitic inductance and in particular smaller than ½ or smaller than ¼ or smaller than ⅕ of the second inductance.

Further, it is advantageous if the first parasitic ohmic resistance is less than the second parasitic ohmic resistance and in particular less than ½ or less than ¼ or less than ⅕ of the second parasitic ohmic resistance.

It has been found that it may be useful if a plurality of first bonding wires is implemented connected in parallel to each other and a plurality of second bonding wires is also implemented connected in parallel to each other, so as to realize the above-mentioned electric connections of the upper-side terminal areas of the light-emitting diode die, the charge storage component and the terminal area for the charging circuit.

In a further advantageous example, a plurality of light-emitting diode dies and a plurality of charge storage components can be provided
wherein
each light-emitting diode die has a charge storage component assigned thereto,
the upper side of the carrier comprises, for each light-emitting diode die, an exposed first terminal area that is electrically connected with the first end portion of the conduction path of the transistor, and, for each charge storage component, an exposed second terminal area that is electrically connected with the second end portion of the conduction path of the transistor,
in the circuit die for each charge storage component, a charging circuit assigned thereto is integrated, and a terminal area is arranged exposed on the upper side of the carrier for each charging circuit, each light-emitting diode die being arranged with its first terminal area arranged lying on the assigned first conduction path terminal area of the transistor and these two terminal areas being electrically connected with one another, each charge storage component being arranged with its first terminal area arranged lying on the assigned second conduction path terminal area of the transistor and these two terminal areas being electrically connected with one another, the second terminal area of each light-emitting diode die is connected, by means of at least one first bonding wire, with the second terminal area of the charge storage component assigned to the respective light-emitting diode die, the terminal area of each charging circuit is connected, by means of at least one second bonding wire, with the second terminal area of the charge storage component assigned to the respective charging circuit, and wherein the control circuit sequentially controls the charging circuits to charge the respective charge storage components up to a charge degree necessary to generate a light pulse by the light-emitting diode die assigned to the respective charge storage component and, prior to controlling the next charging circuit, controls the transistor to switch its conduction path to be conductive.

The above-described configuration of the light module now comprises an individual transistor which selectively closes one of a plurality of discharging circuitries to each of which a different one of the light-emitting diodes and a different one of the charge storages belong. All light-emitting diodes are interconnected to form a common first star point (for example, the cathodes of the light-emitting diodes) and are connected with the one end portion of the conduction path of the transistor. The other end portion of the conduction path is connected, for example, with the reference potential with which also the one contact of the charge storage is connected, whose other contact is in turn connected with the other contact of the light-emitting diode that is not connected with the light emitting diode (for example, with the anode thereof). The charge storages are charged sequentially under control of the control circuit. After each charging process, the transistor is switched to be conductive so that only the light-emitting diode, whose associated charge storage is charged, is illuminated. This circuit concept simplifies the circuit design and the number of switching elements, since only an individual transistor is required, which should advantageously be formed with a large surface area to have the required current carrying capacity. If a plurality of such transistors were used, the number of transistors per circuit die would quickly reach its limits.

In the above-described example, a plurality of individual connection path terminal areas may be provided for the transistor on the upper side of the carrier. However, since, in each case, a star point (namely, for example, the anodes of all light-emitting diodes on the one hand and the one contacts of all charge storages on the other hand) is connected to both end regions of the conduction path of the transistor, a common and therefore larger first conduction path terminal area, as well as a common and therefore correspondingly large second conduction path terminal area of the transistor can be formed on the upper side of the transistor.

As already described above, the light-emitting diode die preferably comprises a laser diode, i.e., a laser diode die is formed, where it is feasible to configure the laser diode as an edge emitter.

In a further advantageous example, a first supply voltage terminal area for a supply voltage potential may be provided exposed on the upper side of the carrier, wherein a supply voltage reference potential can be supplied to the second conduction path terminal area of the transistor or, if a plurality of such second conduction path terminal areas are present, to all of these second conduction path terminal areas of the transistor or to a second conduction path terminal area common to all of these second conduction path terminal areas.

Moreover, a buffer capacitor component forming a buffer capacitor may expediently be provided, having a lower side on which a first terminal area is arranged, and an upper side on which a first terminal area is arranged, wherein the buffer capacitor component is arranged resting with its first terminal area on the second conduction path terminal area or the second terminal areas or the second conduction terminal area common to all of these second conduction path terminal areas and the terminal areas on both sides are connected to one another, and wherein the second terminal area of the buffer capacitor component is electrically connected with the first supply voltage terminal area via at least one third bonding wire.

To minimize the length of the first bonding wires connecting the upper-side terminal areas of the light-emitting diode die and the associated charge storage component, it is advantageous if the light-emitting diode dies and the charge storage components are each arranged successively along two adjacent lines, wherein each light-emitting diode die and the respective associated charge storage component are arranged opposite one another.

When a light module with a plurality of light-emitting diode dies is used, each defines an optical axis along which a light beam from the respective light-emitting diode die is directed, wherein the line along which the light-emitting diode dies are successively arranged, either extends in the shape of an arc around a center and the optical axes of the light-emitting diode dies extend radially with respect to this arc-shaped line, or extends in a straight line and the optical axes of the light-emitting diode dies extend perpendicularly thereto.

It is advantageous, if the capacitors typically used as charge storages and the buffer capacitor already mentioned above are formed as a common component which has a lower side with a common lower-side terminal area and an upper side with at least one first upper-side terminal area and a second upper-side terminal area and a dielectric between the lower-side terminal area on the one hand and the at least one first upper-side terminal area, as well as the second upper-side terminal area on the other hand, wherein the buffer capacitor is formed between the second upperside terminal area and the portion of the lower-side terminal area lying under this second upperside terminal area, and each charge storage capacitor is formed between another one of the first upper-side terminal areas and the portion of the lower-side terminal area lying under this respective first upper-side terminal area.

As already described above, the carrier comprises a potting compound in which a lead frame with a plurality of conductor tongues and the circuit die electrically connected with the conductor tongues are embedded, wherein the conductor tongues comprising the terminal areas exposed on the upper side of the carrier.

The transistor of the light module according to the disclosure, which is in particular configured as a power transistor, is suitably driven by means of digital voltage signals which by nature do not have sufficient power to drive the comparatively large-area gate of a power MOSFET, for example. A power transistor may be understood as the parallel connection of a plurality of individual transistors. Each individual transistor comprises an individual control terminal (in the form of e.g., a gate electrode), the entirety of the individual control terminals forming the overall control terminal of the power transistor. For the power transistor to be switched homogenously, the digital driver signal must be applied to each of the individual driver terminals. It should also be noted that the lengths of the electric connection between the output of the control circuit, which is typically designed in digital technology, with each of the individual control terminals are the same and are correspondingly designed geometrically with respect to their paths.

In this context, it has proven advantageous,
if the transistor of the circuit die is formed therein as a voltage-controlled overall transistor, implemented in analog circuit technology and having an overall control terminal and an overall conduction path, for conducting an electric current via the overall conduction path and for blocking the current,
wherein the overall control terminal extends over an overall control terminal surface of the circuit die,
if the control circuit comprises a driver circuit, implemented in digital circuit technology, for driving the overall driver terminal of the overall transistor for conducting and blocking the current, or that the circuit die comprises a driver circuit, implemented in digital circuit technology and controllable by the control circuit for driving the overall control terminal of the overall transistor for conducting and blocking the current,
wherein the overall transistor is subdivided into a plurality of individual transistors implemented in analog circuit technology or comprises a plurality of such individual transistors,
wherein each individual transistor comprises an individual control terminal and the individual control terminals of the individual transistors each extend over control terminal individual areas of the die which are equal in size or are uniformly distributed over the control terminal total area of the overall transistor, wherein the driver circuit comprises a plurality of individual driver circuits, each with one input and u outputs, where u is a natural integer greater than or equal to 2, hierarchically divided into different stages, wherein the output of an individual transistor circuit of an i-th stage, where i is 1 to v and v is a natural integer greater than or equal to 2, is connected with the inputs of u individual driver circuits of the (i−1)-th stage (i.e., wherein each individual driver circuit has a fan-out of u, where u is a natural integer greater than or equal to 2),
wherein the arrangement of an individual driver circuit of the i-th stage and the individual driver circuits of the (i+1)-th stage, whose inputs are connected with the outputs of the individual driver circuit of the i-th stage, forms a self-similar structure,
wherein the self-similar structures of an i-th stage are larger in area than the self-similar structures of an (i+1)-th stage, and the self-similar structures of the (i+1)-th stage are interleaved with the self-similar structure of an i-th stage from which it originates, and
wherein the outputs of the individual driver circuits of the v-th stage are connected with the control terminal individual areas of the individual transistors.

By interleaving of individual self-similar structures per driver stage, it is achieved that, as described above, the electric connection lines (including the electric connections and circuit components of the individual driver circuits of the individual driver stages) are equal in length and are identical or similar with respect to their geometric arrangement and their geometric course, i.e. e.g. symmetrical or mirror-symmetrical.

By "fanning out" the one individual transistor driver signal of the control circuit to a plurality of individual digital signals, each of which must drive comparatively small-area electrodes of the individual transistors, an optimization of the switch-on times and the edge steepness is achieved, so that a high-energy current pulse switched by the power transistor can be used and the light-emitting diode, preferably the laser diode, can be driven.

In a further advantageous example, it may be provided that each individual driver circuit comprises one input and four outputs, that each of the individual driver circuits of the i-th stage and the four individual driver circuits of the (i+1)-stage together with the electric connection of the four outputs of the individual driver circuit of the i-th stage with the inputs of the four individual driver circuits of the (i+1)-th stage forms an H-shaped structure, wherein the individual driver circuits of the (i+1)-th stage are arranged at the four ends of the H-shaped structure and the individual driver circuit of the i-th stage is arranged in the middle between the four ends, and that the H-shaped structures have the same orientation from stage to stage.

Further, it may be suitable, if each individual driver circuit comprises one input and two outputs, that each of the individual driver circuits of the i-th stage is arranged in the middle between the two individual driver circuits of the (i+1)-th stage and, together with the electric connection of the two outputs of the individual driver circuit of the i-th stage with the inputs of the two individual driver circuits of the (i+1)-stage, forms a straight structure, and if these self-similar structures are respectively rotated by 90° to each other from stage to stage.

It may further be advantageous if the individual driver circuits are configured as inverter circuits and if the individual transistors are configured as power transistors, in particular as MOSFET transistors. The digital inverter circuit is the simplest concept for the individual driver circuits as used, according to this example of the disclosure, in the plurality of driver stages of the driver circuit.

Regarding the geometrical design and arrangement of the terminal area of the light module, it may be useful if the upper side of the carrier has a rectangular shape with two longitudinal edges and two transverse edges shorter in comparison to these longitudinal edges, wherein the at least one first conduction path terminal area of the transistor is arranged at one of the two transverse edges and terminal areas for the power supply of the control circuit, the at least one charging circuit, the at least one charge storage component and the at least one light-emitting diode die are arranged at the other transverse edge.

In an advantageous example, it may be provided that on each of the longitudinal edges of the upper side of the carrier, one of two transfer signal terminal areas of at least one pair of transfer signal terminal areas is arranged, which are electrically connected with each other and serve to supply transfer signals intended for the circuit die, such as e.g. a reset signal, a diagnosis signal, a bus communication signal, a trigger signal for triggering the generation of a light pulse by the at least one light-emitting diode die, wherein the transfer signals, if a plurality of light modules is arranged side-by-side, can be transferred from one light module to the respective adjacent light module or from one light module, after processing in the circuit die thereof, to the respective adjacent light module.

In another advantageous example, it may be provided that the light modules are arranged side by side with the longitudinal edges of their upper sides, in particular when the longitudinal edges are aligned in parallel, wherein the transfer signal terminal areas of identical pairs of transfer signal terminal areas of two respectively adjacent light modules are electrically interconnected.

It may further be advantageous if the light-emitting diodes dies of all light modules arranged side by side are arranged on a common arcuately bent line or on a straight line.

The above-mentioned objects are further achieved according to the disclosure with a LIDAR device for optically scanning a space and for capturing a distance image representing that space, comprising at least one light module according to one or a plurality of the above-mentioned examples, wherein a light beam with an ellipsoidal or oval-shaped light beam cross section with a first half-axis and a second half-axis longer than the first half-axis or with a circular cross section is emitted from each light-emitting diode die of each light module when the respective light-emitting diode die is driven, an emitter optical element for expanding the light beam of each light-emitting diode die by stretching the ellipsoidal or oval-shaped light beam cross section along the second half-axis and compressing the light beam cross section along the first half-axis, or vice versa, to form a light beam fan directed towards the space to be scanned and having a line-shaped and/or slit-shaped cross section, or by stretching the circular light beam cross section to form a light beam fan directed towards the space to be scanned and having a line-shaped and/or slit-shaped cross section, wherein the cone-shaped light beams generated by the light-emitting diode dies arranged side by side enter the space as light beam fans under different angles, a photo sensor comprising a plurality of photo detectors arranged in a number of lines or columns equal to the total of light-emitting diode dies of the at least one light module, wherein each line or column comprises the same number of photo detectors, a receiver optical element for directing potential reflection light from the space to be scanned onto the photo sensor, wherein reflection light potentially caused due to the respective light beam fan impinges on another of the plurality of lines or columns of photo detectors of the photo sensor, and an evaluation unit for the evaluation of signals from the photo detectors to acquire distance information and/or to determine a distance image of the space to be scanned.

The LIDAR device according to the disclosure thus operates with a plurality of light-emitting diodes that are controlled sequentially, in order to convert the light beam bundles, which typically have an ellipsoidal or oval-shaped cross section or a circular cross section into light beam stripes of linear shape, after the individual, respectively emitted light beam bundles have passed the emitter optical element. Here, each light beam line meets a different line- or stripe-shaped region of the scene to be imaged, i.e., of the distance image to be captured. The light successively reflected from there per stripe reaches, via image receiving optics, the individual lines or columns of a 2D photo sensor comprising a plurality of photodetectors configured in particular as photodiodes. Thus, the exposure of the photo sensor is performed in the manner of a "rolling shutter". The individual photo detector signals are then evaluated by an evaluation unit. Here, the evaluation may wither be made following the time-of-flight concept or in dependence on the intensity.

An advantage of the above-described LIDAR device is that it operates without mechanisms to the extent that no movable components are required.

Thus, the receiver optical element suitably is an imaging lens or an imaging object lens as it is typically used in cameras. The emitter optical element may comprise a cylindrical lens and a Powell lens, or it may comprise a lens combining the functions of these two lens types.

The advantage of using a Powell lens is that it is possible to compensate for inhomogeneities regarding the intensity distribution over the cross-sectional area of the light beam. Such inhomogeneities of light intensity typically occur with Gaussian emitters and are found in particular in edge emitter light-emitting diodes or laser diodes. Using the Powell lens or special lenses with corresponding surfaces, it is possible to compensate for these inhomogeneities of light intensity over the longitudinal extension of the light beam stripes, as used in the LIDAR device according to the disclosure.

In an advantageous example, at least two light modules can be provided, wherein the light-emitting diode dies of each light module are respectively arranged side by side along a circular arc line extending over a predefined angle, and respective adjacent light modules are arranged rotated relative to each other by the predefined angle.

In a further advantageous example, at least two light modules may be provided, wherein the light-emitting diode dies of each light module are arranged side by side along a straight line and respective adjacent light modules are arranged rotated by an angle relative to one another, so that the optical axes of those light-emitting diode dies of the light modules that are arranged at the same position in the sequence of light-emitting diode dies of each light module intersect at a common point. The advantage of this arrangement of the light-emitting diode dies is that now the distance of each light-emitting diode die to the lens of the emitter optical element is the same.

According to an alternative to the LIDAR device of the present disclosure, the same is provided with one light module with an individual light-emitting diode die according to one or a plurality of the above mentioned examples, wherein a light beam with an ellipsoidal or oval-shaped light beam cross section with a first half-axis and a second half-axis longer than the first half-axis or with a circular cross section is emitted from the light-emitting diode die when driven, an emitter optical element for expanding the light beam of the light-emitting diode die by stretching the ellipsoidal or oval-shaped light beam cross section along the second half-axis and compressing the light beam cross section along the first half-axis, or vice versa, to form a light beam fan directed towards the space to be scanned and having a line-shaped and/or slit-shaped cross section, or by stretching the circular light beam cross section to form a light beam fan directed towards the space to be scanned and having a line-shaped and/or slit-shaped cross section, a movable optical deflection element for deflecting the light beam fan under different angles into the space to be scanned to scan the space by means the light beam fan sweeping over the same, a photo sensor with a plurality of photodiodes arranged in lines and columns, a receiver optical element for directing potential reflection light from the space to be scanned to the photo sensor.

wherein potential reflection light, caused due to each light beam fan being deflected into the space under a different angle, impinges on a different one of the plurality of lines or columns of photo detectors of the photo sensor, and an evaluation unit for the evaluation of signals from the photo detectors to acquire distance information and/or to determine a distance image of the space to be scanned.

In this variant of the LIDAR device, a movable mechanical element is used, namely a pivotable mirror or polymer optics, for example. Examples of such basically known movable optical elements can be found in EP-A-3 660 574 or US-A-2020/0264462 as micro-mechanical/micro electrical systems (MEMS) in the form of MEMS mirrors and in WO-A-2008/035983 and WO-A2018/154139 as a polymer optical element with a piezo drive. Thus, in LIDAR systems with movable optical deflection elements, the circuit concept according to the disclosure can be used advantageously for the electrical driving of the light-emitting diode die with high energy and the greatest possible edge steepness, with the result that high-intensity light pulses of sufficient length can be generated.

In a suitable development of the above-described variant of the LIDAR device, it may be provided that the optical deflection element operates refractively and is designed in particular as a prism, or that the optical deflection element operates reflectively and is designed in particular as a mirror.

Both above mentioned variants of the LIDAR device use a photo sensor in which the photo detectors are arranged in lines and columns. For the electronic switching elements assigned to the individual photodetectors, space is required on the sensor chip either between adjacent photo detector lines or adjacent photo detector columns or photo detector columns, depending on the design, which is why the individual photo detector lines or photo detector columns cannot capture the entire stripe-shaped illuminated scene. However, if the photo sensor or the entire LIDAR device is allowed to oscillate about an axis, with the respective oscillation or tilt angle being detected, it is possible, if the scene is detected per tilt angle, to also capture those stripe-shaped regions of the illuminated scene during the oscillation that were previously imaged onto the spaces between adjacent lines. Thereby, the resolution with which the scene is captured is increased.

In this respect, it is thus advantageous to provide a tilting movement device for tilting the at least one light module or for tilting the arrangement of a plurality of light modules of for tilting the photo sensor, wherein the evaluation of the signals of the photo detectors of the photo sensor is performed as a function of the respective tilt angle under which the light-emitting diode dies of the light module or modules emit light and/or the photo sensor receives reflection light.

As an alternative or in addition, it may further be provided that each light-emitting diode die emits a light beam as a scanning light beam with an ellipsoidal or oval-shaped or circular light beam cross section, the emitter optical element expands the scanning light cone to a scanning light fan lying in a light fan plane, the scanning light fans of the scanning light beams of all light-emitting diode dies are offset from each other by an angular offset, reflection radiation, substantially in the form of reflection light cones, potentially emanate from scanning points illuminated by a scanning light fan in the space to be scanned, and the receiver optical element images reflection light cones, which potentially emanate from scanning points illuminated by a scanning light fan in the space to be scanned, onto a photo detector column or line of the photodetector.

In a further suitable example, it may be provided that the light-emitting diode dies are arranged side by side in a line, the orientation of which is the same as the orientation of a photo detector column of the photodetector, and that each scanning light fan illuminates scanning points in the space to be scanned, which are arranged side by side in a line, the orientation of which is the same as the orientation of a photo detector line of the photodetector.

In a suitable example, it may further be provided that the light-emitting diode dies are arranged side by side in a line, the orientation of which equals a photo detector line of the photodetector, and that each scanning light fan illuminates scanning points in the space to be scanned, which are arranged side by side in a line, the orientation of which is the same as the orientation of a photo detector line of the photodetector.

In a further suitable example, it may be provided that the light-emitting diode dies are arranged side by side in a line, the orientation of which is the same as the orientation of a photo detector column of the photodetector, and that each scanning light fan illuminates scanning points in the space to be scanned, which are arranged side by side in a line, the orientation of which is the same as the orientation of a photo detector column of the photodetector.

In a suitable example, it may further be provided that the light-emitting diode dies are arranged side by side in a line, the orientation of which equals a photo detector line of the photodetector, and that each scanning light fan illuminates scanning points in the space to be scanned, which are arranged side by side in a line, the orientation of which equals a photo detector column of the photodetector.

As far as the optical properties of the LIDAR device are concerned, it is advantageous, if the emitter optical element comprises a lens with an optical axis, in particular with a substantially cuboid shape and with a height, a width and a thickness oriented along the extension of the optical axis and with a first main side, as well as a second main side facing away from the same, through each of which the optical axis passes, wherein the first main side has a planar surface, wherein the second main side has a surface formed as a superposition of a convex protrusion and a concave indentation arranged in the center of the width of the lens, wherein the protrusion extends around an imaginary first axis located outside the lens and the indentation extends around a second axis also located outside the lens, which is directed perpendicularly to the first axis.

This design of the main sides of the emitter optical element is advantageous in that it results in a homogenization of the intensity with which individual subsections of a stripe-shaped portion of the scene is illuminated. The emitter optical element may comprise one or a plurality of lenses. In this case, the two main sides form the end faces of the one lens or of the group of several lenses. The first main side may be facing the scene to be captured, so that the second main side is facing the light module or modules. However, it is also possible that the first main side faces the light module or modules and the second main side is facing the scene.

In the emitter optical element described above, it is advantageously provided that the first axis is located in a half space adjoining the first main side of the lens, and the second axis is located in a half space adjoining the second main side of the lens.

In an alternative example of the emitter optical element, the same comprises a lens with an optical axis, in particular with a substantially cuboid shape and with a height, a width and a thickness oriented along the extension of the optical axis and with a first main side, as well as a second main side facing away from the same, through each of which the optical axis passes,
- wherein the first main side is formed as a superposition of a planar surface with a concave first indentation arranged in the center of the width of the lens and with a bending of the lens in the regions thereof on both sides of this indentation and directed toward the second main side,
- wherein the second main side is formed as a superposition of a first convex protrusion and a convex second protrusion arranged in the center of the width of the lens,
- wherein the second protrusion extends around an imaginary first axis located outside the lens,
- wherein the second protrusion extends around an imaginary second axis also located outside the lens, which is directed perpendicularly to the first axis, and
- wherein the indentation extends around an imaginary third axis also located outside the lens, which is directed parallel to the second axis.

Here, it may further be advantageously provided that the first axis and the second axis and the third axis are located in a half space adjoining the first main side of the lens and that the bending of the lens in its regions on both sides of the indentation of the first main side extends around a fourth axis that extends parallel to the second axis and to the third axis and is located in a second half space adjoining the second main side.

A possible design of the lens may be defined by
the first main side having a surface that is defined by a function of the form $$z = RY + AR2*x^2 + AR3*|x^3| - \text{Sign}(RY)*\text{qrt}(RY2-y2) + PB2*x^2 + PB3*|x^3| + PB4*x4 + PB6*x6 + PC2*x^2 + PC3*|x3|$$

with $$RY = R0Y + AR2*x^2 + AR3*|x^3|,$$

Sign( ) as a signum function of a function parameter,
Sqrt( ) as the square root of a function parameter,
x for a point along the width of the lens,
y for a point along the height of the lens,
z for a point along the thickness and thus along the optical axis of the lens, starting from the x-y center plane of the lens, and
ROY for a radius of curvature of the lens,
the second main side having a surface that is defined by a function of the form $$z = -(d + PC2*x^2 + PC3*|x^3|),$$

where d is the thickness of the lens in the optical center,
wherein the parameters PB2 and PB3 are different from zero, and
at least two of the parameters AR2, AR3, PB4, PB6, PC2 and PC3 are different from zero.

Here, it may be provided that the parameters AR2 and AR3 are different from zero and at least two of the parameters PB4, PB6, PC2 and PC3 are different from zero and/or that the parameters PB4 and PB6 are different from zero and at least one of the Parameters PC2 and PC3 is different from zero and/or that the parameters PC2 and PC3 are different from zero.

The LIDAR device according to the disclosure comprising light modules according to the disclosure has versatile fields of application. The one or the plurality of light modules and the LIDAR device may be used, for example, for
- the detection of objects in the vicinity or in a partial region of the vicinity of a stationary or mobile platform, in particular an autonomously moving platform, such as, for example a robot or a stationary or driving, in particular an autonomously driving vehicle, such as, for example, a watercraft, a land vehicle or an aircraft for, in particular, the transport of persons or freight, or
- the detection of objects in the automation of manufacturing processes, or
- the non-invasive imaging of living organisms and/or biological organs of a living being, or
- the examination of biological tissues,
- the creation of three-dimensional distance images of objects in a detection space, and/or
- the monitoring of the environment of buildings.

The advantages of the driver circuit for the power transistor for generating stable digital signals via the relatively large driver electrode of the power transistor have already been described above. According to the disclosure, this driver circuit, as an integrated electric circuit for switching electric currents, is now provided with
- a die,
- a voltage-controlled overall transistor, implemented in analog circuit technology in the die and having an overall control terminal and an overall conduction path, for conducting an electric current via the overall conduction path and for blocking the current,
- wherein the overall control terminal extends over a control terminal overall surface of the die,
- a driver circuit, implemented in digital circuit technology in the die, for driving the overall driver terminal of the overall transistor to conduct and block the current,
- wherein each individual transistor comprises an individual control terminal and the individual control terminals of the individual transistors each extend over individual control terminal areas of the die which are equal in size or are uniformly distributed over the overall control terminal area of the overall transistor,
- wherein the driver circuit comprises a plurality of individual driver circuits, each with one input and u outputs, where u is a natural integer greater than or equal to 2, hierarchically divided into different stages, wherein the output of an individual transistor circuit of an i-th stage, where i is 1 to v and v is a natural integer greater than or equal to 2, is connected with the inputs of u individual driver circuits of the (i−1)-th stage (i.e., wherein each individual driver circuit has a fan-out of u, where u is a natural integer greater than or equal to 2), wherein the arrangement of an individual driver circuit of the i-th stage and the individual driver circuits of the (i+1)-th stage, whose inputs are connected with the outputs of the individual driver circuit of the i-th stage, forms a self-similar structure, wherein the self-similar structures of an i-th stage are larger in area than the self-similar structures of an (i+1)-th stage, and the self-similar structures of the i-th stage are interleaved with an (i+1)-th stage with the self-similar structure of an i-th stage from which it originates, and wherein the outputs of the individual driver circuits of the v-th stage are connected with the control terminal individual areas of the individual transistors.

In an advantageous example, it may be provided that each individual driver circuit comprises one input and four outputs, that each of the individual driver circuits of the i-th stage and the four individual driver circuits of the (i+1)-stage together with the electric connection of the four outputs of the individual driver stage of the i-th stage with the inputs of the four individual driver circuits of the (i+1)-th stage forms an H-shaped structure, wherein the individual driver circuits of the (i+1)-th stage are arranged at the four ends of the H-shaped structure and the individual driver circuit of the i-th stage is arranged in the middle between the four ends, and that the H-shaped structures have the same orientation from stage to stage.

In a further advantageous example, it may be provided that each individual driver circuit comprises one input and two outputs, that each of the individual driver circuits of the i-th stage is arranged in the middle between the two individual driver circuits of the (i+1)-th stage and, together with the electric connection of the two outputs of the individual driver circuit of the i-th stage with the inputs of the two individual driver circuits of the (i+1)-stage, forms a straight structure, and that these self-similar structures are respectively rotated by 90° to each other from stage to stage.

In an advantageous example, it may further be provided that the individual driver circuits are configured as inverter circuits and that the individual transistors are configured as power transistors, in particular as MOSFET transistors.

The optical unit of the LIDAR device for the illumination of the scene has already been discussed further above. According to a variant, the LIDAR device is provided with one or a plurality of light modules, wherein each light-emitting diode die emits a light beam with an ellipsoidal or circular cross section, wherein each light beam has a light beam axis, wherein the light beam axes lie substantially on a common light beam axis plane, and the light beam axis plane defines an optical axis, with a lens arranged on the optical axis of the light beam axis plane, which expands each light beam in a direction perpendicular to the laser beam axis plane, so that for each of the light beams, a light fan is obtained in a light fan plane perpendicular to the light beam axis plane, with a photo sensor having a photo detector array comprising a plurality of photo detector lines each having a plurality of photo detector pixels, and with imaging optics for real optical imaging of a scene illuminated by the light fans onto the photo sensor, wherein the imaging optics image the projection of the light beam fans in the far field onto an ideally homogeneously white and/or substantially diffusely uniformly and homogeneously reflecting projection plane perpendicular to the optical axis of the light beam axis plane onto the photo sensor as an image of the scene in the form of a projection image of the light beam fans.

In this LIDAR device, the lens is formed such that the value of the illumination intensity of a first section of the image of the projection of a first light beam fan onto a first photo detector pixel of the photo detector array of the photo sensor differs by no more than 10% or by no more than 5% or by no more than 2% from the value of the illumination intensity of a second section of the image of the projection of the first light beam fan, different from the first section, onto a second photo detector pixel, different from the first photo detector pixel, or of a second light beam fan onto a second photo detector pixel different from the first photo detector pixel of the photo detector array of the photo sensor, the lens has a first surface and a second surface facing away therefrom, the first surface is defined by a function of the form $$Z = RY + AR2*x^2 + AR3*|x^3| - \text{Sign}(RY)*\text{Sqrt}(RY2-y2) + PB2*x2 + PB3*|x^3| + PB4*x4 + PB6*x6 + PC2*x^2 + PC3*|x^3|$$

with $$RY = R0Y + AR2*x^2 + AR3*|x^3|,$$

Sign( ) as a signum function of a function parameter,
Sqrt( ) as the square root of a function parameter,
x for a point along the width of the lens,
y for a point along the height of the lens,
z for a point along the thickness and thus along the optical axis of the lens, starting from the
x-y center plane of the lens, and
R0Y for a radius of curvature of the lens,
the second surface is defined by a function of the form $$z = -(d + PC2*x^2 + PC3*|x^3|),$$

where d is the thickness of the lens in the optical center,
wherein the parameters PB2 and PB3 are different from zero, and
at least two of the parameters AR2, AR3, PB4, PB6, PC2 and PC3 are different from zero.

Here, it may be provided that the parameters AR2 and AR3 are different from zero and at least two of the parameters PB4, PB6, PC2 and PC3 are different from zero and/or that the parameters PB4 and PB6 are different from zero and at least one of the Parameters PC2 and PC3 is different from zero and/or that the parameters PC2 and PC3 are different from zero. The first surface may be facing the scene, so that the second surface is facing the light module or modules. However, an inverted structure or mounting of the lens is also possible.

As already described above, it is desirable, in particular in the application of LIDAR devices, to be able to generate light pulses being as high-energetic as possible. This is achieved by a pulse-like driving of a (preferably power) transistor with a high edge steepness of the driving pulse. The preparation of the transistor driver is usually performed by means of circuit components implemented in digital circuit technology, which eventually must drive a comparatively large-area power transistor. For the equally strong driving, uniformly distributed over the surface of the driver electrode of the power transistor, special precautions must be taken, which, as far as known, have not yet been solved satisfactorily in prior art.

Prior art will be explained by way of example with reference to FIG. 23. FIG. 23 illustrates an exemplary circuit according to prior art, reduced to the essentials, for driving a laser diode LD by means of a driver circuit I, as well as, for example, a field effect transistor M and an unspecified control circuit CTR which in this case is the block CTR of the circuit in FIG. 5, for example. The exact structure of the unspecified pre-driver or control circuit CTR is not relevant to the following considerations and will therefore not be discussed further.

The driver circuit I has an input and an output. The laser diode LD comprises a cathode and an anode. The laser diode LD may also be a light-emitting diode. The field effect transistor M comprises a gate terminal, a drain terminal and a source terminal.

The pre-driver circuit (implemented herein in an exemplary manner as the control CTR) is connected with the input of the driver circuit I in an electrically conductive manner. The output of the driver circuit I is connected with gate terminal of the field effect transistor M in an electrically conductive manner. In FIG. 23, the field effect transistor M is shown exemplarily as a self-conducting p-channel MOSFET. The drain terminal of the field effect transistor M is electrically connected with the cathode of the laser diode LD. The anode of the laser diode LD is electrically connected with a first reference potential HV. The source terminal of the field effect transistor M is electrically connected with a second reference potential Gnd. The second reference potential Gnd has a smaller magnitude than the first reference potential HV.

In such a circuit for driving a laser diode LD or a light-emitting diode, the control circuit CTR and the driver circuit I and the field effect transistor M are implemented as separate blocks in a CMOS architecture or as discrete components.

For the driving of pulsed laser diodes or light-emitting diodes by means of short high-current pulses, it is known in prior art to use, in particular, GaN field effect transistors as discrete components with an external discrete pre-driver, or CMOS high-current transistors with integrated pre-driver.

Therefore, it is a further object of the disclosure to provide a solution that avoids the above-mentioned disadvantages of prior art and has further advantages. An aspect of the disclosure is to avoid the previously noticeable and hindering limitation of the maximum achievable switching speed, which occurs due to the significant signal propagation times, in particular of the gate signal, because of the two-dimensional extension of high-current MOS transistors with low resistance.

Thus, a feature of the disclosure is a light module and in particular a laser module that allows for the emission of comparatively long, high-energy, intensive laser or light pulses with a large edge steepness. Let it be assumed that the laser module comprises n lasers arranged linearly side by side. The lasers are preferably semiconductor lasers which preferably have a common cathode contact. When, in the following, reference is made to a laser module or a laser or lasers, this should be understood as synonymous with and a generalized form of referring to a light module with light sources in the form of LEDs.

The laser module proposed thus comprises a linear laser array of n lasers, where n is a positive integer greater than or equal to 1 and, for example, greater than or equal to 2 or greater than or equal to 4 or greater than or equal to 8 or greater than or equal to 16. The number n is preferably a power o 2. Here, the lasers are preferably arranged side by side along a first (imaginary) line with a first distance from laser to laser. The lasers are preferably configured in the same manner. The lasers are preferably produced in a common crystal.

Each of the n lasers preferably has exactly one capacitor of n capacitors assigned thereto as a respective energy source for its laser pulse. Whether or not a laser emits a laser pulse at the next pulse signal, is preferably determined by whether or not the capacitor assigned to this laser was charged by a charging circuit prior to the generation of the pulse signal. The n capacitors are preferably arranged side by side along a second (imaginary) line. This second line of the arrangement of capacitors preferably extends parallel to the first line of the arrangement of lasers. The second distance from capacitor to capacitor for the n capacitors arranged along this second line, is preferably equal to the first distance from laser to laser by which the lasers are arranged spaced from each other along the first line. Thus, a linear capacitor array of n capacitors is obtained.

Furthermore, the laser module comprises a driver switch serving to trigger and operate the lasers with electric charge from the capacitor assigned to the respective laser.

For a laser to emit a laser pulse upon the arrival of the pulse signal, the capacitor assigned thereto must have been charged before by a charging circuit assigned to this capacitor. Therefore, the laser module preferably comprises n charging circuits, wherein each charging circuit being capable of selectively charging another of the n capacitors (hereinafter referred to as the capacitor assigned to this charging circuit) via a charging line inductance. In the course of the development of the disclosure, it was realized that the magnitude of this charging line inductance has a positive effect on the discharge speed of the respective capacitor and thus on the steepness of the pulse edge, since this inductance separates the charging circuit from the capacitor for high frequencies. Thus, in case of a large charging line inductance, output capacitances of the charging circuit no longer have an effect with steep laser edges. The laser pulse thus becomes potentially steeper due to the blocking charging line inductance.

Thus, each of the n capacitors is preferably assigned a respective one of the n lasers as the laser assigned to this capacitor. Upon the arrival of the pulse signal, the driver switch is closed. The driver switch is preferably a transistor of an integrated circuit. By closing the driver switch, the driver switch discharges that capacitor of the n capacitors, which is charged, via the laser assigned to this capacitor and a discharging line inductance which connects this capacitor preferably with the anode of the laser. The assigned laser can emit a laser pulse upon the arrival of the pulse signal and the subsequent closure of the driver switch only if the capacitor assigned to this laser had previously been charged by the charging circuit. By closing the driver switch upon the arrival of the electric pulse signal, the driver switch preferably connects the cathode of the laser with a reference potential. Of course, circuits are also conceivable or imaginable or possible, in which the anode and the cathode of the laser are interchanged. These functionally equivalent circuits and arrangements are explicitly encompassed by the disclosure.

Thus, it is a finding of the disclosure that the magnitude of the discharging line inductance should be as high as possible, while the inductance of the discharging line should be as small as possible. Here, the connection line from e.g., the anode of the laser to its capacitor and the lead inductance from the capacitor to the reference potential contribute to the discharging line inductance. The overall discharging line inductance should be as small as possible. In the course of the development of the disclosure, it was realized that it is advantageous to use a plurality of thin bonding wires for the connection, instead of one thick bonding wire with a high current carrying capacity, since the overall inductance of the plurality of bonding wires connected in parallel is smaller than the parasitic inductance of the thick bonding wire. Although there is a transformer coupling effect between the bonding wires arranged in parallel, however, the advantages of the small overall inductance and thus of the fast switching times outweigh the disadvantages by far.

The charging line inductance is maximized. The bonding wire length for connecting the first terminal of the capacitor with the charging circuit assigned thereto is therefore preferably maximized in order to increase the charging line inductance as far as possible and to thereby obtain a maximum separation between the parasitic output capacitances of the charging circuit and the anode of the laser.

Thus, preferably, the magnitude of the charging line inductance is larger and in particular significantly larger than the magnitude of the discharging line inductance.

The laser module preferably comprises an integrated circuit in which the cathodes of the lasers of the linear laser array are interconnected from n lasers (i.e., the laser line) to form a star point without the use of bonding wires. To this end, the laser module is preferably connected by a common backside contact, which in the example presented is the common cathode of the n lasers, directly with a contact of the driver switch, so that one terminal connects this driver switch with the cathodes of the n lasers practically without inductance. The crystal (i.e., the die) of the integrated circuit dissipates the thermal loss of then lasers. Preferably, the rear of the linear laser array is thus connected with a contact of the driver switch in a thermally and electrically conductive manner, which switch is preferably monolithically integrated into the crystal of the preferably used integrated circuit. This connection may be made by bonding or soldering or another suitable electrically and thermally conductive connection technique such as e.g., thermo-compression of bond balls or another flip-chip assembly method. Preferably, the stack of the crystal (die) of the linear laser array or the crystals (dies) of the individual diode lasers and the crystal (die) of the integrated circuit with the driver switch and preferably with the charging circuit is mounted in a thermally and preferably also electrically conductive manner on a heat sink by the rear of the integrated circuit, for example by means of thermally and preferably electrically conductive bonding or soldering.

As already mentioned before, the driver switch and preferably the n charging circuits for the n capacitors of the individual-line capacitor array are part of the integrated circuit. Preferably, the driver circuit is electrically connected in a bondless manner with the first star point which connects e.g., the cathodes of the n lasers.

In the crystal of the integrated circuitry, as mentioned before, preferably the driving circuitry and the n charging circuits are integrated into the active surface opposite the rear side of the crystal. Thus, the n charging circuits are a part of the active surface of the integrated circuit, which means that they are located substantially directly under the surface of the crystal or at the surface of the same. Parallel to the linear laser array of n lasers, the linear capacitor array of n capacitors is now also mounted on the active surface of the monolithic crystal (die) of the integrated circuit.

Here, this parallelism does not only refer to a temporal parallelism, but also to a spatial parallelism. The n lasers of the laser array are preferably arranged along a first straight line. The n capacitors of the capacitor array are preferably arranged along a second straight line, which preferably is parallel to the second line or may, secondly, be thought of as being located at the bottom side of the capacitor array. Likewise, the first line may be thought of as being located at the bottom side of the laser array. The first line and the second line then define a plane that is preferably coincident with the active surface of the crystal of the electric circuit or is at least parallel to the same and is spaced from the same by bonding means, such as adhesive or solder, only so little that the plane and the surface of the die may be referred to as being substantially the same.

Each of the n capacitors of the capacitor array has a first terminal and a second terminal. For a reduction of the discharging line inductance, the first terminal of each capacitor of the linear capacitor array is connected with the anode of the laser of the linear laser array assigned to this capacitor by a multiple bonding with a first bonding wire length. The second terminals of the n capacitors of the capacitor array are interconnected to form a second star point. For a further reduction of the discharging line inductance, this second star point is connected, via a plurality of bonding wires having a second bonding wire length, with a reference potential contact on the upper side of the crystal of the integrated circuit. This structure has substantial advantages. If only one of the n capacitors of the capacitor array has been charged by the charging circuit assigned thereto and all other capacitors are not charged, these uncharged capacitors are substantially charged to a voltage near 0V or to a voltage so low that it is by far insufficient to "ignite" the lasers assigned to those other capacitors. Upon the arrival of the pulse signal, the driver switch now connects the first star point with the reference potential. Firstly, the respective previously charged capacitor are discharged via the laser assigned thereto. Secondly, however, the first terminals of all other capacitors are also connected with the reference potential via their lasers. Since the associated capacitors of these lasers are substantially uncharged, these other capacitors force the potential of the second terminals of these capacitors, which form the second star point, to also be close to the reference potential. It is preferred that the first terminals of the capacitors of the linear capacitor array are connected with the charging circuit of the n charging circuits assigned to the respective capacitor of the n capacitors of the capacitor array via a respective third bonding wire having a third bonding wire length and intersecting the second star point. The third bonding wire length is preferably longer than the second bonding wire length. The second bonding wire length is preferably longer than the first bonding wire length.

This laser module thus defined can be used in a LIDAR module. It is proposed to use the following basic structure of a LIDAR system:

The proposed LIDAR system preferably comprises the above linear laser array of n lasers, a photo sensor with a 2D photo detector array of n×m photo detectors (hereinafter sometimes also referred to as photo diodes) with m photo detectors (m being an integer greater and in particular much greater than 1) in each of n columns or lines, a driver circuit for the n lasers, n×m receiver circuits for the n×m photo detectors and an evaluation circuit for the measuring signals of the n×m receiver circuits. On the laser side, i.e. for the laser beams, the optical system of the LIDAR system preferably comprises a Powell lens or a functionally equivalent optical system which hereinafter is to be encompassed by the term Powell lens, and on the photo detector side, i.e. in the beam path from the scene illuminated by the lasers in a stripe-by-stripe manner to the photo sensor, preferably comprises a second optical system hereinafter referred to as a receiver lens. Each laser of the n lasers emits a respective laser beam when energized with electric current. The Powell lens preferably expand each laser beam into a light fan. In reality, each light fan will have a strongly ellipsoidal beam cross section transverse to its propagation direction. For the purposes of this disclosure, it is assumed in a simplifying manner in this description that the short half-axis of the cross-sectional ellipse or the cross-sectional oval has a length of practically 0 cm. Since the real cross section is different from 0 cm, the disclosure is not restricted hereby. Thus, thus assumption of a fan thickness of 0 cm only serves to simplify the description. Each light fan has an opening angle. Each light fan has a light fan plane and a fan origin point. The Powell lens is arranged relative to the linear laser array of the n lasers such that preferably the surface normals of the n light fan planes of the light fans of the n lasers preferably lie in a common plane below one another and together with the straight line along which the n lasers are preferably arranged. Preferably, the n lasers of the laser array generate n laser beams whose n light fans are tilted perpendicular to their respective fan plane in a substantially common fan origin point by a respective fan angle with respect to a freely selectable light fan of the n light fans, namely about a substantially common rotational axis through this fan origin point.

On the photo detector side, a similar tilting takes place. By design, each photo detector typically already has a receiver lobe that describes the space direction dependent sensitivity of the respective photo detector. Preferably, all n×m photo detectors are configured the same. Preferably, they are monolithically integrated on a semiconductor crystal. Preferably, the photo detectors are one or n photo detector lines, where, per photo detector line, the m photodetectors are arranged linearly along a straight line in the respective photo detector line. However, it is also conceivable to use only one line of photo detectors. The n×m photo detectors are preferably semiconductor components. For example, avalanche photodiodes (APD) and/or individual photon avalanche diodes (SPAD) are suitable. The receiver lens deforms the n×m receiver lobes of the n×m photo detectors into n×m receiver fans. Again, it is assumed for purposes of simplification that the receiver fans have a receiver fan thickness of substantially 0 cm. In reality, this assumption is not correct, and the receiver fan actually is a receiver lobe with a typically strongly ellipsoidal cross section, analogous to the light fan of the lasers. This simplification of assuming a receiver fan thickness of 0 cm is also intended to simplify the description and thus does not restrict the disclosure. The n×m receiver fans each have a receiver fan plane. Thus, n×m receiver fan planes are defined by the second optical system. Each receiver fan plane of the n×m receiver fan planes of the b×m photo detectors is not parallel to the n laser fan planes of the n light fans of the n lasers. Preferably, each receiving fan plane of the n×m receiver fan planes of the b×m photo detectors is perpendicular to each of the n laser fan planes of the n light fans of the n lasers. Thus, preferably k=n×m intersection lines are obtained which represent the sensitivity line of a pairing of the receiver fan of one of the n×m receiver fans, which is assigned to one of the n×m photo detectors, and one light fan of the n light fans which is assigned to one laser of the n lasers. The Powell lens assumes two functions in the system. These functions may be distributed between the two surfaces of the Powell lens. However, the two functions may also be implemented with an individual lens surface. These two functions are a. the vertical focusing of all lasers and
b. the so-called horizontal flat fielding of the laser line, i.e. the equal distribution of the laser power, in order to homogeneously illuminate a line of the image to be captured, with this equal distribution being the same for all lasers.

A cylindrical surface substantially realizes the function a. Higher order terms extend the mathematic function that describes the cylindrical surface, in order to minimize imaging errors. The vertical radius of curvature is a function of the horizontal distance from the center of the lens, which causes a better focus at the ends of the lines.

A polynomial for the surface shape of the lens implements function b. The polynomial describes the thickness of the lens as a function of the horizontal distance to the center. Thereby, the lens can redistribute the energy of the laser beams almost arbitrarily in the horizontal direction.

A horizontal curvature of the lens described by a polynomial as a function of the horizontal distance to the center provides for a further optimization. This polynomial allows for a correction of the (pincushion) distortion of the lens.

All polynomials also have a weak influence on the respective other functions (vertical focusing, horizontal energy distribution, distortion correction), so that all parameters tuned to each other during optimization. For this purpose, one function is optimized iteratively at a time. Thereafter, the resultant errors in the other functions are corrected one after the other. By cyclical repetition, the structure stabilizes, while the errors typically becoming ever smaller. The entire process is then repeated, until the errors are small enough.

The parameters obtained as an example in the course of the development of the disclosure are not yet fully optimized, but they are better than in prior art.

The equations for the lens are:
equation for the surface structure of the front side:

$$z=RY+AR2*x^2+AR3*|x^3|-\text{Sign}(RY)*\text{Sqrt}(RY^2-y^2)+PB2*x^2+PB3*|x^3|+PB4*x^4+PB6*x^6+PC2*x^2+PC3*|x^3| \text{ where } RY=R0Y+AR2*x^2+AR3*|x^3|$$

Here, Sign ( ) is the signum function and Sqrt ( ) is the square root of the function parameter.

Here, z is the distance to the x-y center plane, the optical axis is the z axis.

Equation of the surface structure of the rear side:

$$z=-(d+PC2*x^2+PC3*|x^3|)$$

Here,
X is the horizontal axis,
y is the vertical axis,
Z is the optical axis,
R0Y is the radius of curvature of the cylinder term that defines the focal length. R0Y=12.6 mm was used as an example in the disclosure. The radius of curvature is determined by the distance from laser to laser and the distance between the sensors in the sensor line, as well as by the focal length of the receiver lens. Here, the following applies $$f_{tx}/p_{tx}=f_{rx}/p_{rx}$$

where
$f_{tx}$ is the focal length of the lens of the lasers,
$f_{rx}$ is the focal length of the lens of the sensor line,
$p_{tx}$ is the distance from laser to laser,
$P_{rx}$ is the distance from receiver to receiver in the sensor line, d is the thickness of the lens in the optical center. In the disclosure, d=2.2 mm was used as an example.

AR2, AR3
   are coefficients of the higher order polynomials for the gradient of curvature, PB2, PB3, PB4, PB6
   are coefficients describing the horizontal thickness profile of the lens, PC2, PC3
   are coefficients describing the curvature of the lens (the same for both surfaces).

In the context of the development of the disclosure, various lenses were tested.

The parameters of a first lens were as follows:
AR2=0, AR3=0
PB2=−0.0085, PB3=0.0008, PB4=0, PB6=0
PC2=0, PC3=0

The parameters of a second lens were as follows:
AR2=0.01, AR3=0.0006
PB2=−0.0085, PB3=0.0008, PB4=0, PB6=0
PC2=0, PC3=0

The parameters of a third lens were as follows:
AR2=0.01, AR3=0.0005
PB2=−0.015, PB3=0.0015, PB4=−0.000024, PB6=0
PC2=0, PC3=0

The parameters of a fourth lens were as follows:
AR2=0.028, AR3=−0.0028
PB2=−0.0115, PB3=0.00038, PB4=−0.000034, PB6=0.00000013
PC2=0.028, PC3=−0.0032

Hereinafter, the electrical functions of an exemplary LIDAR system according to the disclosure will be described.

At an emission time, the driver circuit causes one of the n lasers to emit a laser light pulse. For this purpose, prior to emission, a monitoring circuit causes e.g., one of the n charging circuits of the above-described laser module to charge the capacitor assigned thereto. All other capacitors are intended to be uncharged and to remain uncharged for the duration of the process of emitting a light pulse by the laser assigned to the capacitor to be charged. After the completion of the charging operation, which is stopped e.g., in a time-controlled manner after a predefined or calculated time or is stopped after a capacitor target voltage is reached or exceeded, the charging circuit is preferably disconnected from the capacitor to be charged, e.g., by means of a switch and/or by switching the output of the charging circuit to a high-resistance state. After one of the combinations of a laser and a capacitor of the n pairs of lasers and associated capacitors is armed in this manner by charging the capacitor, the abrupt discharge of the capacitor via the laser and the driver switch can be affected by closing the same. To this end, a monitoring circuit, which is preferably part of the driver circuit, preferably generates a pulse signal that preferably closes said driver switch and thus, for example, connects the cathode of the laser with the reference potential. The charged capacitor is connected with this reference potential preferably by its second terminal and is connected with the anode of the laser preferably by its first terminal. Thus, the previously charged capacitor is abruptly discharged via the laser associated with the same. The laser emits a light pulse. The other lasers of the n lasers do not emit a light pulse, since their associated capacitors are not charged or not sufficiently charged. Theoretically, it is possible to charge more than one capacitor and to then successively use different charging patterns and to then calculate back to the simple case of an individual charged capacitor.

The light pulse is now expanded into a light fan via said Powell lens and is emitted into the free space in front of the device. In this free space, after a first light propagation time, the light pulse then impinges on an object, assumed as an example herein, and is reflected from there as a reflected light pulse. After a second light propagation time, the reflected light pulse then reaches the second optical system which distributes the photons of the reflected light pulse over the n×m photo detectors. Here, the second optical system then assigns a photon of the reflected light pulse to one of the n×m photo detectors, if the propagation vector of the respective photon is directionally within the corresponding sensitivity fan assigned to this photo detector—or in other words—if the direction from which the photon came is within the sensitivity fan.

Preferably, each photo detector and the receiver circuit assigned thereto thus receive the reflected light of this laser pulse within their respective receiver fan. In addition, the receiver circuits are preferably provided with means to detect the propagation delay of the light pulses from the time of emission to the receiving time in the photo sensor. Thus, n×m light propagation delay information is obtained preferably for each laser pulse, which information represents the light propagation delay of a light pulse from the time of emission (emission time) by a laser to the time of receipt (receiving time) by a respective photo detector as a light pulse reflected by the scene. Using the speed of light, e.g., the speed of light in air, this light propagation delay information can be converted into a length or a distance.

If this measurement is performed for each of the n lasers, the resulting n measurements yield k=n×m light propagation delay values and thus k=n×m distances, namely one distance for each pixel assigned to a photo diode.

To obtain these distances, the respective receiver circuit transmits the respective measured value for the receiving time of the respective laser pulse at the respective photo diode to the evaluation circuit. From the control circuit, the latter receives information about which of the n lasers has emitted the light pulse. From this, the evaluation circuit can then determine which sensitivity line belongs to which distance. It should be noted that a sensitivity line in the sense of this disclosure is a pair formed by the receiver fan of one of the n×m photo diodes and one of the light fans of the n lasers.

After all n lasers of the laser array have emitted a light pulse once, k distances are obtained for the k sensitivity lines. If these are plotted on the sensitivity line, exactly one point is obtained for each sensitivity line, which has caused the reflection of the light pulse for the light fan of this sensitivity line and has been received by the photo sensor with the sensitivity fan sensitivity line. In this manner, k=n×m distances are determined in the three-dimensional space, which can preferably be converted from the distance sensitivity line coordinate system e.g. into a Cartesian coordinate system for further use.

Thus, the evaluation circuit forms a three-dimensional pixel cloud from the angle of the laser fan of the respective laser pulse and the angle of the respective receiver fan of the respective photo detector and the respective receiving time of the respective laser pulse at the respective photo detector relative to the respective time of emission.

It is particularly advantageous if the n surface normals of the n light fans have angular distances ($a_{1,2}$, $a_{\lambda-3}$, $a_{3,4}$, to $a_{n-2,n-1}$, $a_{n-1,n}$) that are substantially the same between two respective adjacent light fans.

Likewise, it is particularly advantageous if the n×m surface normals of the n×m sensitivity fans have m angular distances ($b_{1,2}$, $b_{2,3}$, $b_{3,4}$, to $b_{m-2,m-1}$, $b_{m-1,m}$) on the horizontal, which are substantially the same between two respective adjacent light fans.

It is particularly advantageous to implement the laser module described farther above in a LIDAR system described above.

The disclosure further comprises a laser module with a linear laser array of n lasers, where n is a positive integer. The n lasers are preferably mounted on a module carrier and/or a driver IC. Each laser beam of each laser has a laser beam axis. All laser beam axes and/or at least two laser beam axes intersect at one point. Based on this, it is possible to define a combination of p laser modules, where p is a positive integer, in which each laser module comprises a linear laser array of n lasers, where n is a positive integer, and in which the lasers of each module can be numbered in the same manner, and in which each laser beam of each laser has a laser beam axis, and in which the laser beam axis of the respective k-th lasers, where 0<k≤n, of all p laser modules intersect in a common point, and/or in which the laser beam axes of the respective k-th lasers, where 0<k≤n, of at least two of the p laser modules intersect in a common point.

However, it is better if the laser beam axes of all n×p lasers of all p laser modules intersect in a common point. As an alternative, at least two laser beam axes of at least two lasers of the n×p lasers of all p laser modules can intersect at one point. Preferably, the driver IC is said integrated circuit. Such a driver IC preferably has a rectangular shape. In this case, the driver IC has two short sides and two long sides as edge sections. The driver IC has contacts or one contact DisC preferably at a first edge section of the rectangular shape, which is formed by a short side, said contacts being intended and suitable to contact one or a plurality of rear side contacts of diode lasers. On a second edge section of its rectangular shape formed by the other short side, the IC has contacts VDDA, GNDA, VDDD, GNDD, VDDP, GNDP, VDDH, GND which serve to supply power to the driver IC and/or to the above-mentioned lasers D1 to Dn and/or to the power storages belonging thereto, i.e., the capacitors C1 to Cn. Here, the first edge section is located opposite the second edge section.

The driver IC has, preferably on a third edge section of its rectangular shape that is formed by one of the long sides, at least one transfer contact for a signal that can be transmitted to other driver ICs. On a fourth edge section of its rectangular shape that is formed by the other long side, the driver IC has a further transfer contact that is electrically connected with the transfer contact of another driver IC.

Preferably, one of the transfer contacts is a contact for a reset signal RES which transfers the driver IC to a defined state. Preferably, one transfer contact is a contact for a trigger signal TRIG which causes the driver IC in a predefined state to control its lasers D1 to Dn if this is provided based on the state of the system. Preferably, one or a plurality of transfer contacts are designated for receiving to contact signals of a data bus. The one or the plurality of the transfer contacts on the one edge section of the driver IC are preferably directly electrically connected with one or more corresponding transfer contacts on the opposite edge of an adjacent driver IC. However, it is also conceivable that a linear data bus (e.g., a LIN bus) is interrupted at least temporarily by the driver ICs as bus nodes and that internal device parts of the driver IC can receive the data on the one side of the driver IC and can transmit them on the other side of the IC, possibly also in a modified form. In this case, the signals of the one or the plurality of transfer contacts on the one edge section of the driver IC are processed in a sub-device of the driver IC, in particular in a data bus interface, before they are transmitted to one or a plurality of corresponding transfer contacts on the opposite edge section of an adjacent driver IC.

Further, the present disclosure comprises a combination of laser modules into in particular a LIDAR system comprising at least two laser modules, i.e., comprising at least a first laser module and a second laser module, wherein the laser modules are substantially cuboid-shaped with two small sides and two long sides and wherein the laser-modules are arranged with their long sides adjacent to each other.

The laser modules each comprise a driver IC in a cuboid housing, as described above, which are arranged side by side on a carrier.

The driver ICs of the laser modules are typically identical in design with regard to the used transfer contacts of their driver ICs. One respective transfer contact of the driver IC of the first laser module is then preferably electrically connected with the corresponding transfer contact of the driver IC of the second laser module by an individual bonding wire per such a pair of transfer contacts. This has the advantage that only small losses occur. This is advantageous in particular for a fast synchronous transmission of the trigger signal TRIG, since all lasers are to be ignited successively in a time-synchronized manner and thus emit their radiation package.

The disclosure also comprises a special capacitor array for a laser module and/or for a combination of laser modules and/or for use together with a driver IC, as respectively described above. The capacitor array has, for example, a rectangular shape and has an upper side and a lower side. On its upper side, the capacitor array has n contacts K1' to Kn' arranged in a line along a first edge of the rectangle. The capacitor array has a further contact KG' that extends along a second edge of the rectangle on the upper side of the capacitor array. The second edge of the rectangle is located opposite the first edge of the rectangle. The further contact KG' extends along the third and fourth edges by a distance that is shorter than the extension of the third and fourth edges of the rectangle and ends at a distance from the contacts K1' to Kn'. The capacitor array has a lower side contact KR that covers the lower side of the capacitor array. Each of the n contacts K1' to Kn' forms a capacitance C1 to Cn with the backside contact KR, wherein the further contact KG' forms another capacitance CVDD together with the backside contact KR, and wherein the capacitors C1 to Cn and CVDD comprise a common dielectric that extends between the n contacts K1' to Kn' and the further KG' on the one hand and the lower side contact KR on the other hand.

The devices presented can be used as a LIDAR system or as a part of such a LIDAR system in a mobile device. Here, the mobile device may, for example, be in particular a robot or a missile or a space missile or a hull or a watercraft or a vehicle or a rail vehicle or a plane or a spacecraft. By an oscillation of the mobile device, the resolution of the distance information of the illuminated scene may be increased.

The devices presented can be used as a LIDAR system or as a part of such a LIDAR system in automation technology. They may be used, for example, in a device for detecting the shape of an object or a building or in a device for the automation of processes or in a device for the three-dimensional detection of the shape of three-dimensional bodies.

The laser module proposed allows for the generation of short light pulse for a LIDAR system that does not require any movable parts. However, the advantages are not limited to this.

The light module, the common capacitor component, the combination of a plurality of light modules, the circuit die and the integrated circuit for switching electric currents, as described above and defined in the set of claims with regard to their features, should be understood as independent disclosures which may also be implemented independently. The same applies to the features of the individual dependent claims of the set of claims, which define independent disclosures, i.e., do not necessarily have to be exclusively related to other features of other dependent claims.

Even if the features of the disclosure or of the individual aspects of the disclosure, described above and/or below, are described in the context of other features, they should be understood as independent, individual features which can be realized independently and are essential to the disclosure both individually and together with further features possibly described in connection with the same.

If, in the above and the following, "light" of diodes or reflection light is mentioned, this primarily refers to light in a wavelength range outside that of visible light. However, the disclosure can also be realized using visible light.

BRIEF DESCRIPTION OF THE DRAWINGS

The disclosure will be described in detail with reference to several examples. In the Figures:

FIGS. 25a-25b show, in part (a) of the Figure, a simplified layout of a basic structure of the self-similar structure as a stick layout and shows, in part (b) of the Figure, how to combine further basic structures, so that eventually the self-similar structure is obtained.

DESCRIPTION

In the examples in FIGS. 1 to 4, the components of a LIDAR system are shown schematically, which comprises an emitter in the form of a laser diode line LDZ of n=four lasers D1, D2, D3, D4, as well as a receiver in the form of a 2D (photo diode) sensor S with four lines and a number of n=256 photo diodes per line, as well as lenses (emitter lens SL and cylindrical lens ZL) for fanning out the beams of the lasers into a strongly ellipsoidal cross section for the illumination of a line of a distance image to be captured, and a lens (receiver lens EL) for imaging the respective illuminated line.

Figure 1:
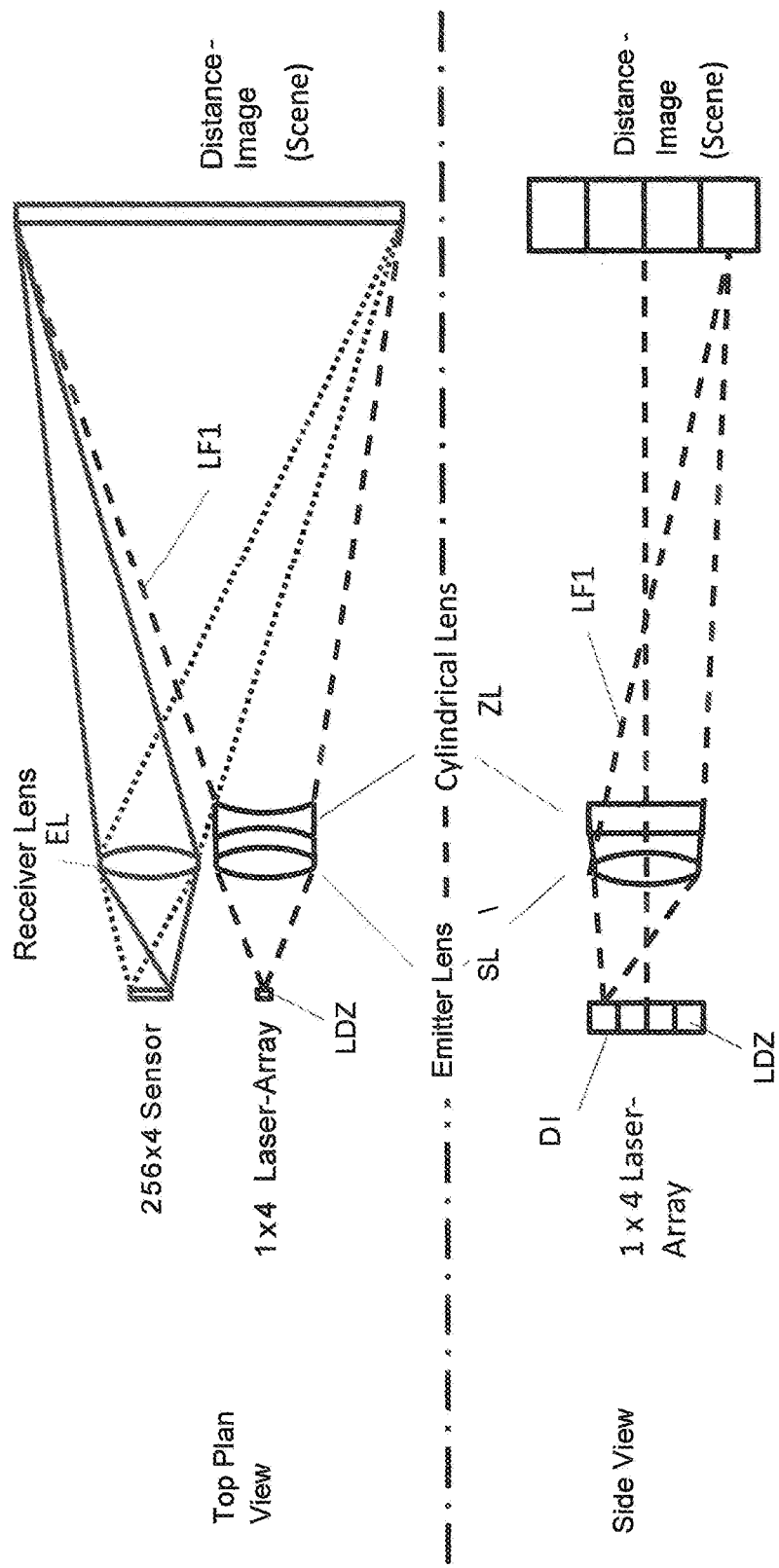
FIG. 1 shows the beam path of an exemplary LIDAR system with, as an example, n=4 lasers and, as an example, m=256 photo detectors of a sensor in top plan view and in side view, the first laser emitting a laser pulse and the laser surfaces thereof illuminating the first line of an image that is sensed by the photo diodes of the first line of the sensor by light reflection.

FIG. 1 illustrates the beam path of the LIDAR system in top plan view and in side view, when the first laser D1 emits a laser pulse. The first laser D1 emits a light pulse that is expanded into a first light fan LF1 by the lens SL, ZL which preferably comprises a Powell lens. The first light fan LF1 is shown in broken lines. The first light fan LF1 illuminates a first stripe of the space or the scene (distance image) in front of the LIDAR system. A receiver lens EL images this illuminated first (image) stripe onto a line of the sensor S. In FIG. 1 (as well as in FIGS. 2 to 4), the imaging of the two image points at the two ends of the illuminated image stripe onto the two photo diodes at the two ends of the respective line of photo diodes of the sensor S is illustrated by the dotted and the solid lines. The illuminated first image stripe is different from the second illuminated image stripe (FIG. 2), the third illuminated image stripe (FIG. 3) and the fourth illuminated image stripe (FIG. 4). In the example of FIG. 1, the sensor array 256 photo diodes per line. This sensor line thus captures an image stripe. The receiver lens EL is preferably also a Powell lens.

Figure 2:
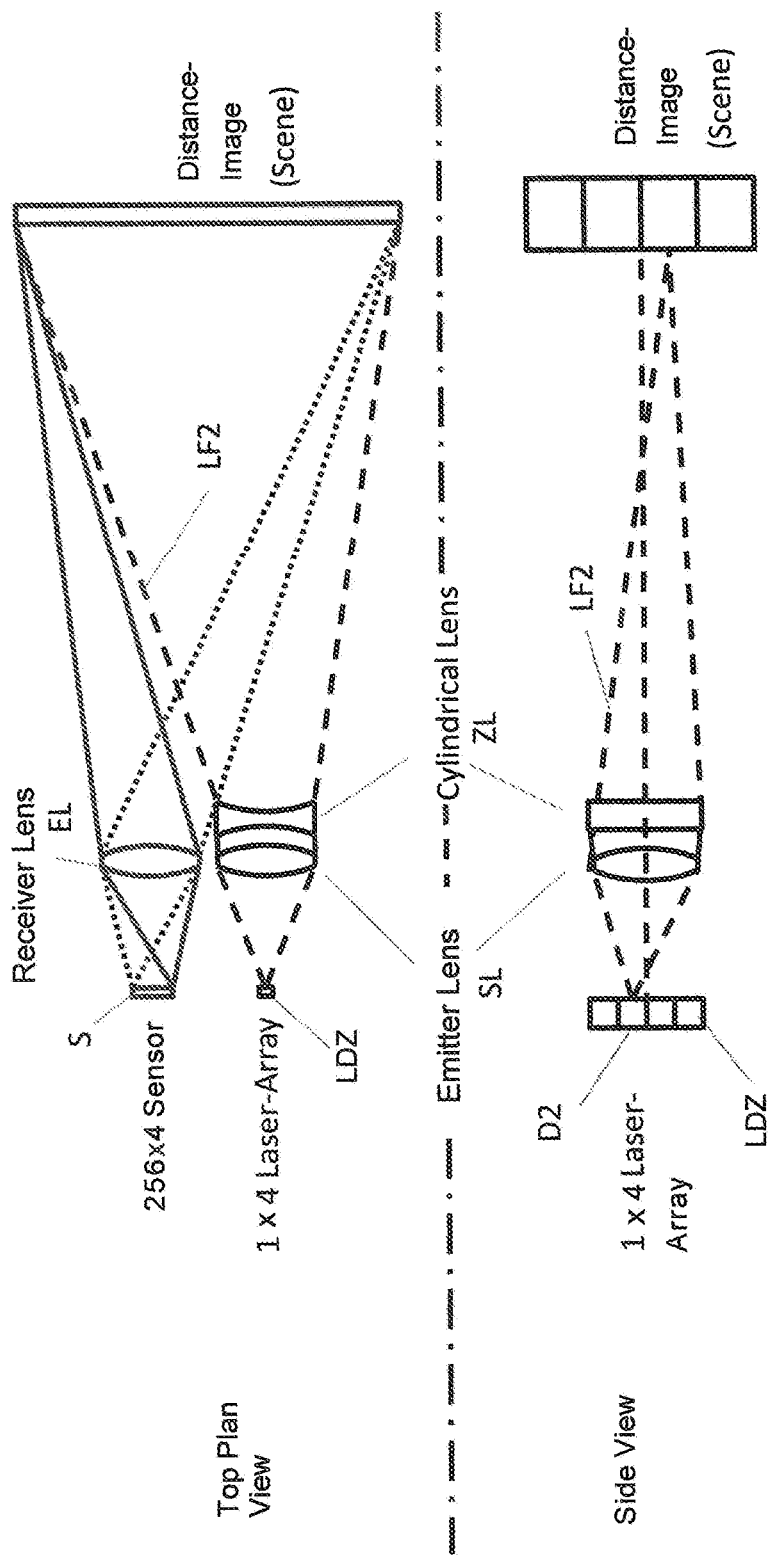
FIG. 2 shows the beam path of the LIDAR system with the four lasers and the 256 photo detectors in plan view and in side view, with the second laser emitting a laser pulse.

FIG. 2 illustrates the beam path of the LIDAR system in top plan view and in side view, when the second laser D2 emits a laser pulse. The second laser D2 emits a light pulse that is expanded into a second light fan LF2 by the lens SL, ZL which preferably comprises a Powell lens. The second light fan LF2 is shown in broken lines. The second light fan LF2 illuminates a second stripe of the space or the scene (distance image) in front of the LIDAR system. A receiver lens EL images this illuminated first stripe onto a line of the sensor S. The illuminated second image stripe is different from the first illuminated image stripe in FIG. 1, the third illuminated image stripe in FIG. 3 and the fourth illuminated image stripe in FIG. 4.

Figure 3:
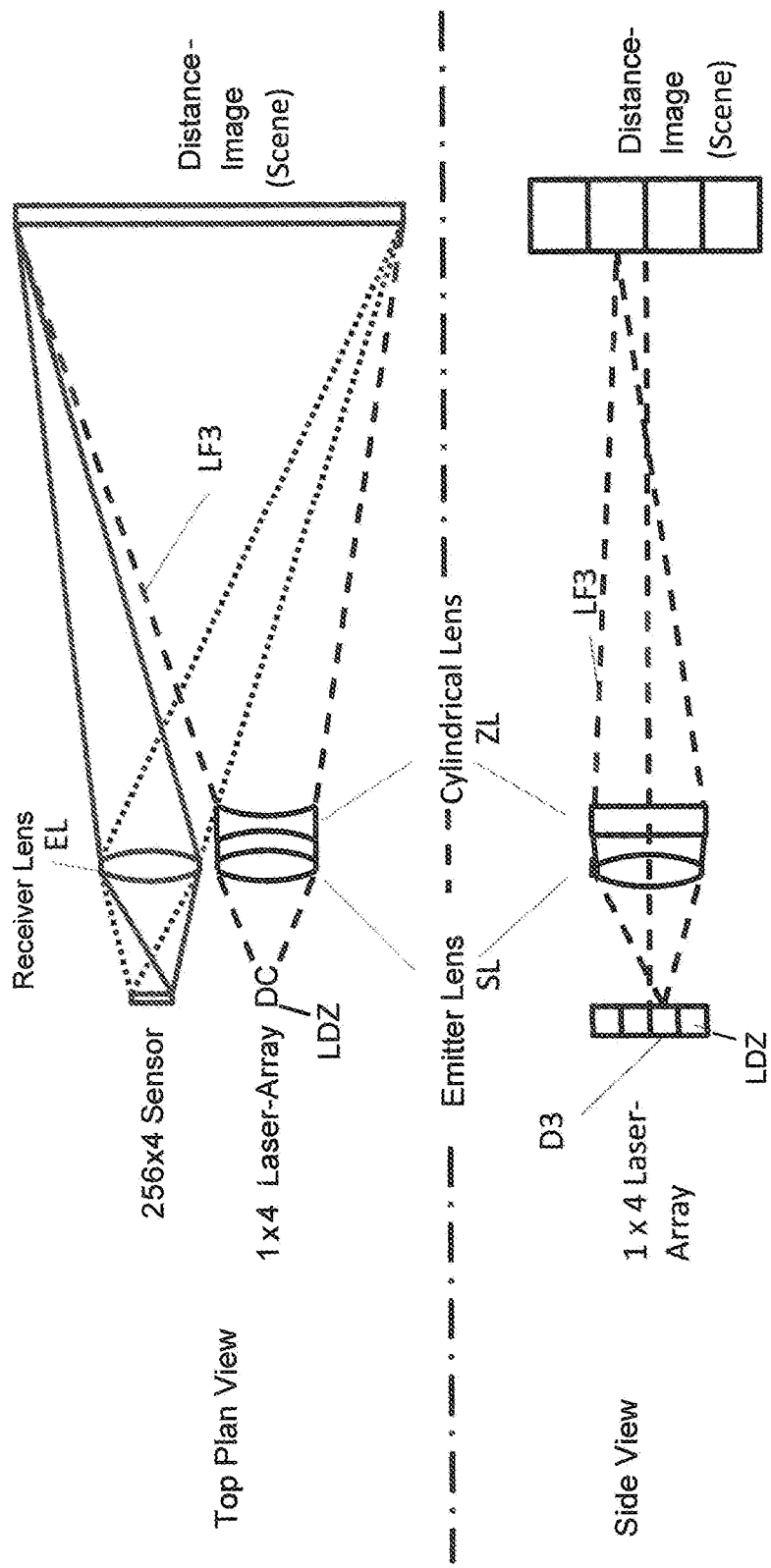
FIG. 3 shows the beam path of the LIDAR system with the four lasers and the 256 photo detectors in plan view and in side view, with the third laser emitting a laser pulse.
Figure 4:
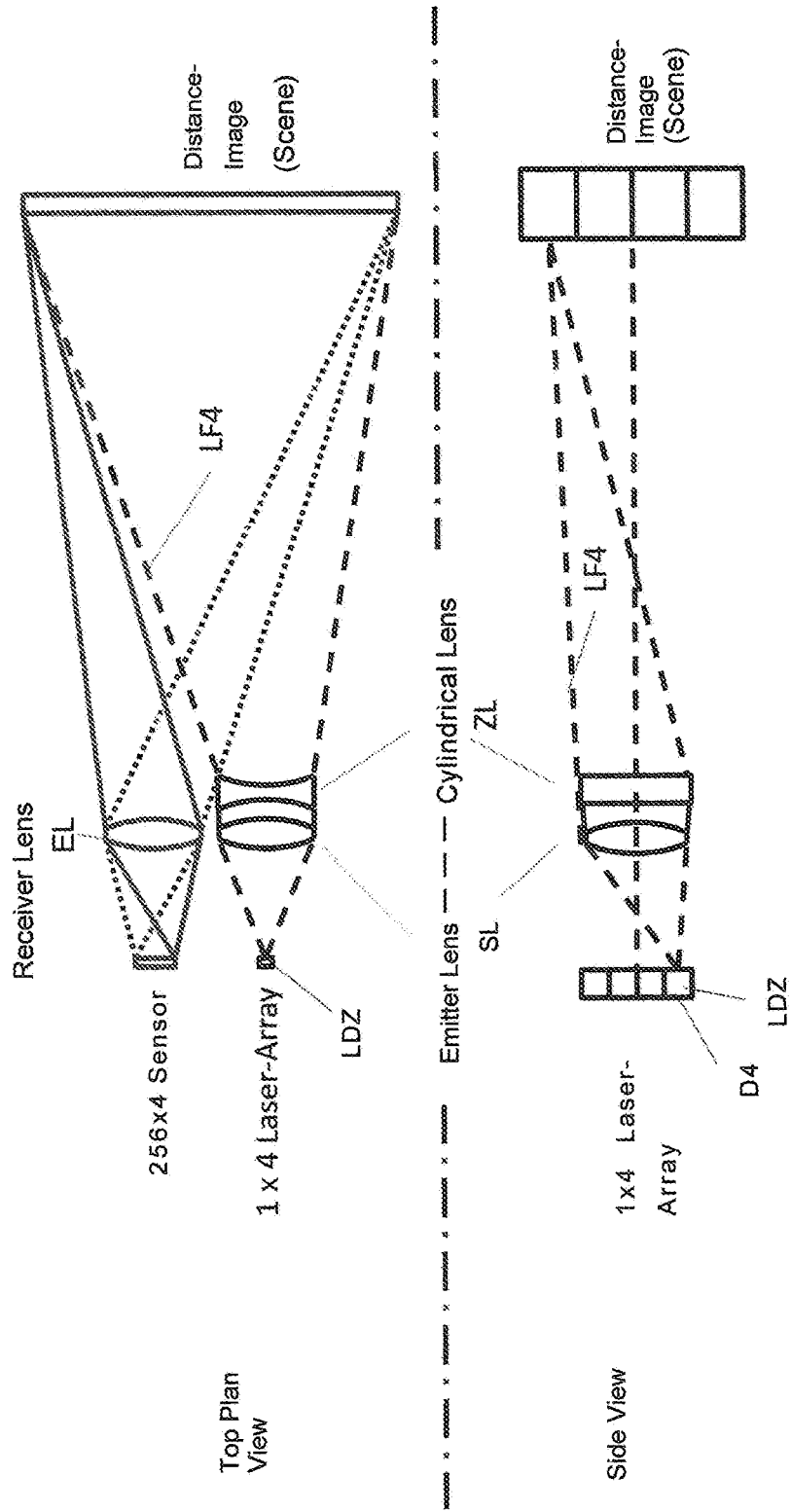
FIG. 4 shows the beam path of the LIDAR system with the four lasers and the 256 photo detectors in plan view and in side view, with the fourth laser emitting a laser pulse.

FIG. 3 illustrates the beam path of the LIDAR system in top plan view and in side view, when the third laser D3 emits a laser pulse. The third laser D3 emits a light pulse that is expanded into a third light fan LF3 by the lens SL, ZL which preferably comprises a Powell lens. The third light fan LF3 is shown in broken lines. The third light fan LF3 illuminates a third stripe of the space or the scene (distance image) in front of the LIDAR system. A receiver lens EL images this illuminated third stripe onto a line of the sensor S. The illuminated third image stripe is different from the second illuminated image stripe in FIG. 2, the first illuminated image stripe in FIG. 1 and the fourth illuminated image stripe in FIG. 4.

FIG. 4 illustrates the beam path of the LIDAR system in top plan view and in side view, when the fourth laser D4 emits a laser pulse. The fourth laser D4 emits a light pulse that is expanded into a fourth light fan LF4 by the lens SL, ZL which preferably comprises a Powell lens. The fourth light fan LF4 is shown in broken lines. The fourth light fan LF4 illuminates a fourth stripe of the space or the scene (distance image) in front of the LIDAR system. A receiver lens EL images this illuminated fourth stripe onto a line of the sensor S. The illuminated fourth image stripe is different from the second illuminated image stripe in FIG. 2, the third illuminated image stripe in FIG. 3 and the first illuminated image stripe in FIG. 1.

Figure 5:
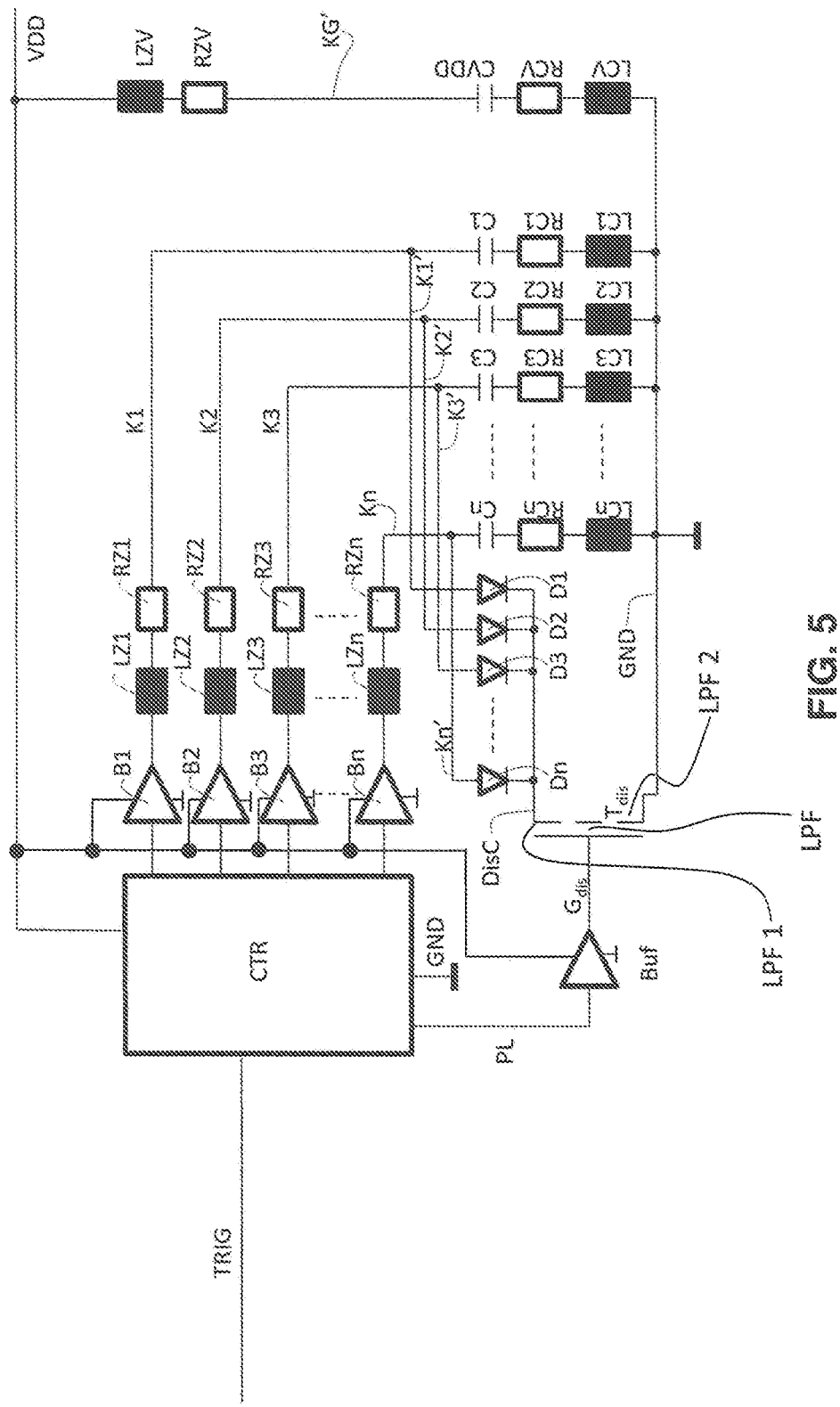
FIG. 5 shows an exemplary wiring for the proposed LIDAR system.

FIG. 5 shows an exemplary wiring for the proposed LIDAR system, A control circuit CTR causes one of the charging circuits B1 to Bn to charge a capacitor C1 to Cn via a charging line K1 to Kn assigned to this charging circuit. Here, each of the n charging lines K1 to Kn has a (primarily parasitic) resistance RZ1 to RZn and a parasitic inductance LZ1 to LZn. Each of the charging lines K1 to Kn is preferably connected with a first terminal of exactly one of n capacitors C1 to Cn. The second terminal of each of the n capacitors C1 to Cn is connected with the reference potential via a line. Each of the lines between the second terminal of a capacitor C1 to Cn and the reference potential comprises a parasitic resistance RC1 to RCn and a parasitic inductance LC1 to LCn. The anode of preferably exactly one of the n lasers D1 to Dn is preferably connected with the first terminal of preferably exactly one of the n capacitors C1 to Cn via preferably exactly one of n discharging line K1' to Kn'. The cathode of the n lasers D1 to Dn are interconnected to form a common first star point. This common star point is connected with the reference potential GND via the driver switch $T_{dis}$ when the pulse signal $G_{dis}$ arrives. The second terminals of the n capacitors C1 to Cn are also connected with the reference potential GND.

From the pulse pre-signal PL, an exemplary buffer Buf generates the pulse signal $G_{dis}$ for opening the driver switch $T_{dis}$. Preferably, the control circuit CTR can generate this pulse pre-signal PL, when the process of charging the capacitor to be charged by the associated charging circuit B1 to Bn is completed and the respective charging circuit B1 to Bn is switched to neutral.

A backup capacitor CVDD is preferably part of the capacitor array KA of the n capacitors C1 to Cn. The backup capacitor CVDD stabilizes the supply voltage VDD or another system-relevant voltage. It serves to prevent effects of current surges, which occur when the lasers are ignited, on other components of e.g., a vehicle connected to the supply voltage VDD, which components have the supply voltage VDD as the vehicle voltage.

The backup capacitor CVDD has its first terminal connected to the supply voltage BDD via a line Inductance LZV and via a Line resistance RZV.

The backup capacitor CVDD has its second terminal connected to the reference potential GND via a line resistance RCV and via a line inductance LCV.

Figure 6:
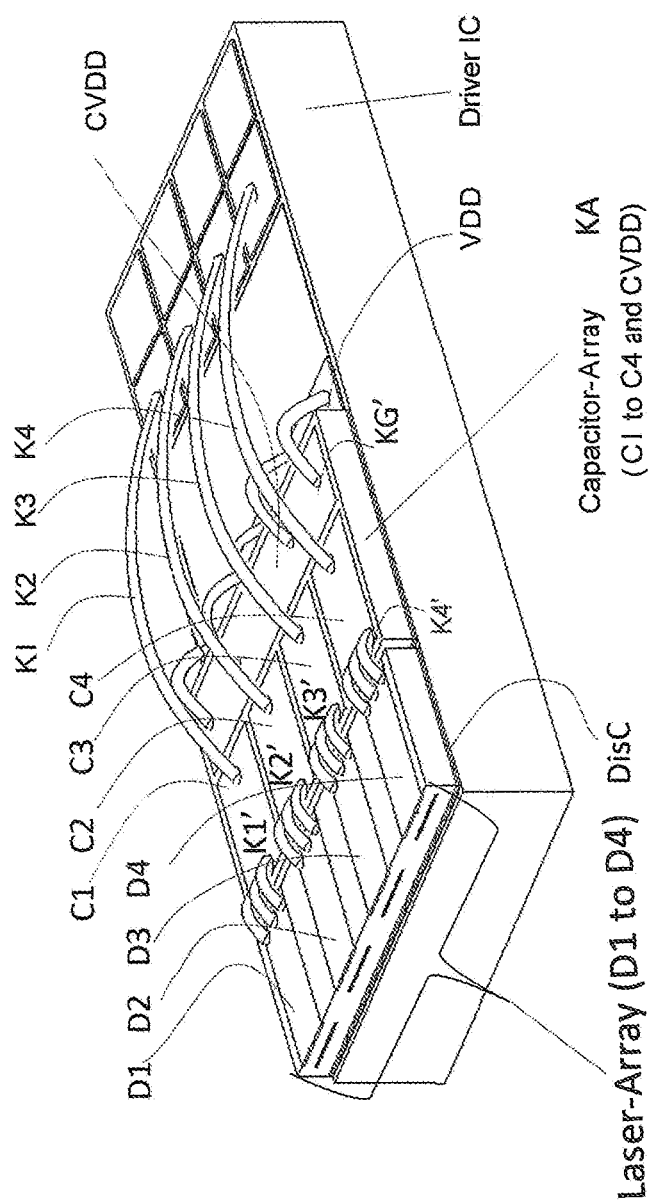
FIG. 6 shows a proposed configuration of a laser module for the LIDAR system of FIG. 5.

FIG. 6 shows an example configuration of the laser module for the LIDAR system of FIG. 5.

The driver IC forms the basis of the module. Preferably, the driver IC is a monolithic integrated circuit. It preferably comprises the control circuit CTR and all other micro-integratable (e.g., CMOS) circuit parts of FIG. 5. These may e.g. (but not exclusively) be the driver circuit CTR, the buffer Buf, the driver switch $T_{dis}$ and the n charging circuits B1 to Bn. Furthermore, the control circuit CTR can comprise, for example, a microcomputer with a memory, interfaces and a CPU. Together, these form the driver circuit. In the example in FIG. 6, n=4 Laser D1 to D4 are used as an example, which are e.g., fabricated on a common crystal and form a linear laser array. The lower side of this crystal forms the common cathode of the laser diodes, which, as a first star point DisC, is connected to a driver switch which is fabricated in the crystal of the driver IC and is located at the active surface thereof. Due to the flip chip assembly, it is possible to realize this connection with only small parasitic inductance and resistance values, whereby the edge steepness of the laser pulses. The n lasers are thermally cooled via the crystal of the driver IC. The four capacitors C1 to C4 are also implemented as a common component. In the example in FIG. 6, the second terminals of the four capacitors C1 to C4 are connected to one another by a common contact. The first terminal of each capacitor C1 to C4 is connected to the assigned laser of the four lasers D1 to D4 via a respective one of the four discharging lines K1' to K4'. Due to the selected arrangement, the discharging lines K1' to K4' are particularly short. The illustrated multiple bonding wire connection of the discharging lines K1' to K4' results in a further reduction of the parasitic inductance and thus to a further increase in edge steepness. Likewise, the short bonding wires of the connection between the (second) star point Disk as a common point of connection of the capacitors C1 to Cn and the reference potential, together with the multiple bonding wire connection, results in a reduction of the parasitic inductance of this line connection. This also increases the edge steepness of the emitted laser pulse.

The relatively long bonding wires of the charging lines K1 to Kn are rather beneficial to the edge steepness, since they prevent or largely suppress a discharge of the electric charge of the capacitors C1 to Cn via these lines K1 to Kn.

A backup capacitor CVDD may be a part of the capacitor array KA, as illustrated. On a lower side, the backup capacitor CVDD is connected to the reference potential GND by a second terminal with a very low line resistance RCV and a very low line inductance LCV. The first terminal of the backup capacitor CVDD is connected to the virtual node KG' of the supply voltage VDD. The virtual node KG' of the supply voltage VDD is connected to the supply voltage VDD by very short bonding wire lengths. Thereby, the virtual node KG' of the supply VDD is connected to the supply voltage VDD with a very low line resistance RZV and a very low line inductance LZV.

Figure 7:
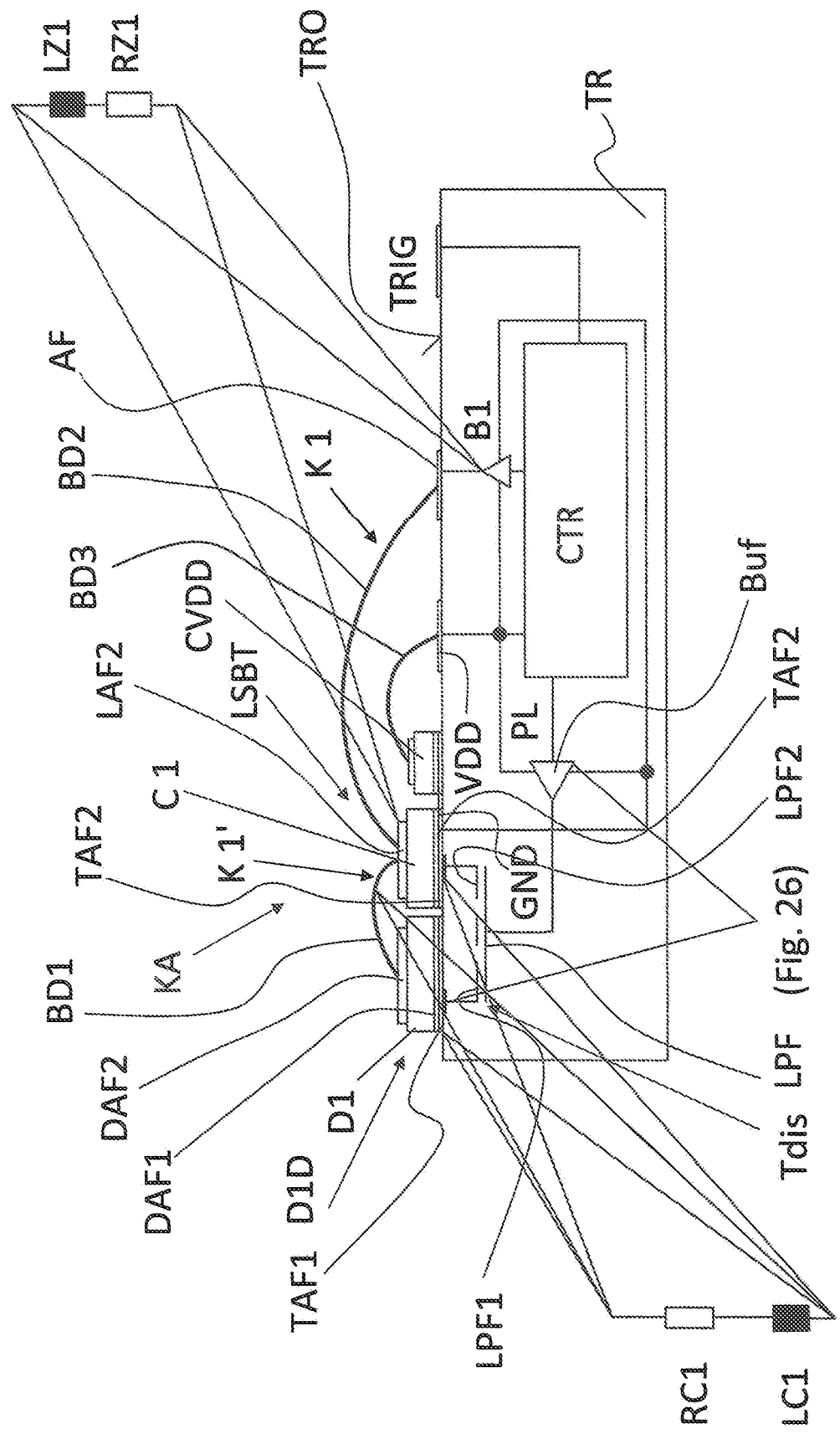
FIG. 7 is a schematic illustration of the hybrid structure formed by the carrier with a circuit die and with various electric and electronic components in a die-to-die connection with terminal areas on the one main side of the carrier.

FIG. 7 schematically illustrates, as an implementation of the circuit in FIG. 5, a hybrid structure of the laser module having, for example, a plastics potting compound as a carrier TR. A circuit die and a lead frame are embedded in the carrier TR; neither is illustrated for reasons of clarity. The control circuit CTR, the transistor driver Buf and the charging circuits B1 to Bn are implemented as integrated circuits of the circuit die. Further, the transistor $T_{dis}$ is located as close as possible to the upper side of the circuit die. As illustrated in FIGS. 5 and 7, the transistor $T_{dis}$ has a conduction path LPF whose end portions LPF1, LPF2 are guided electrically to the upper side TRO via a first conduction path terminal area TAF1 and a second conduction path terminal area TAF2. The laser diodes D1 to Dn are located on the first conduction path terminal area TAF1, which diodes are electrically connected, by die-to-die bonding, to the first conduction path terminal area TAF1 by the lower-side first terminal area DAF1 of their respective DID. Likewise, the capacitors C1 to Cn are connected to the second conduction path terminal area(s) TAF2 of the transistor $T_{dis}$. For this purpose, each capacitor C1 is configured as a separate charge storage component LSBT, while it is also possible that all capacitors C1 to Cn can form a common charge storage component in combination (in this context, see for example the capacitor array KA in FIG. 6). The charge storage components LSBT comprises a lower-side first terminal area LAF1 electrically connected to the second conduction path terminal area TAF2 by die-to-die bonding.

Above both the laser diode die DID and the charge storage component LSBT, a second terminal area DAF2 and LAF2 is located respectively, which are electrically interconnected by a short first bonding wire BD1. These first bonding wires BD1 form the lines K1' to Kn'.

In addition, longer second bonding wires BD2 electrically connect each of the capacitors C1 to Cn to terminal areas AF of the respective assigned charging circuit B1 to Bn, which fields are located on the upper side TRO of the carrier TR. Moreover, a third bonding wire BD3 is shown which connects the supply voltage potential VDD at an upper-side terminal area of the carrier TR to the backup or buffer capacitor CVDD which in turn has its second contact connected to the reference potential GND. For this purpose, the backup or buffer capacitor CVDD is designed as a separate component or a component integrated into the capacitor array KA, which is also electrically connected, e.g., by die-to-die bonding, to the second conduction path terminal area TAF2 to which the reference potential is applied.

In FIG. 7, the spreading line pairs visualize which parasitic components in the discharging circuit and in the charging circuit of the circuit in FIG. 5 correspond to the individual components of the hybrid structure. Here, it should be noted that eventually also the lead frame, not illustrated in FIG. 7, and the internal connections in the circuit die, also not shown in FIG. 7, contribute to the parasitic components.

Figure 24:
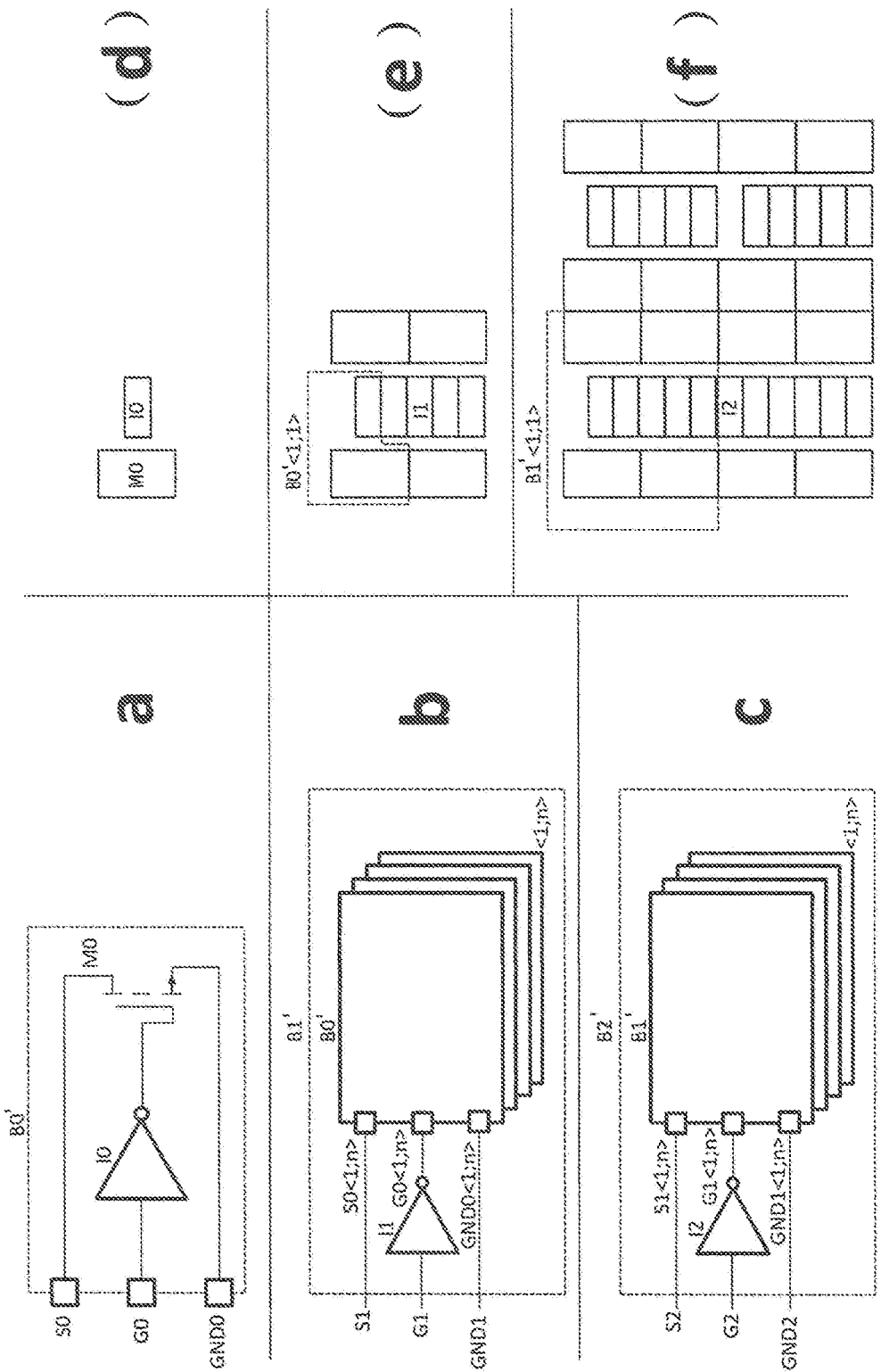
FIGS. 24a-24f show, in the parts (a) to (f) of the Figure, a simplified basic concept of the self-similarity on the basis of the circuit diagram and the circuit layout.
Figure 26:
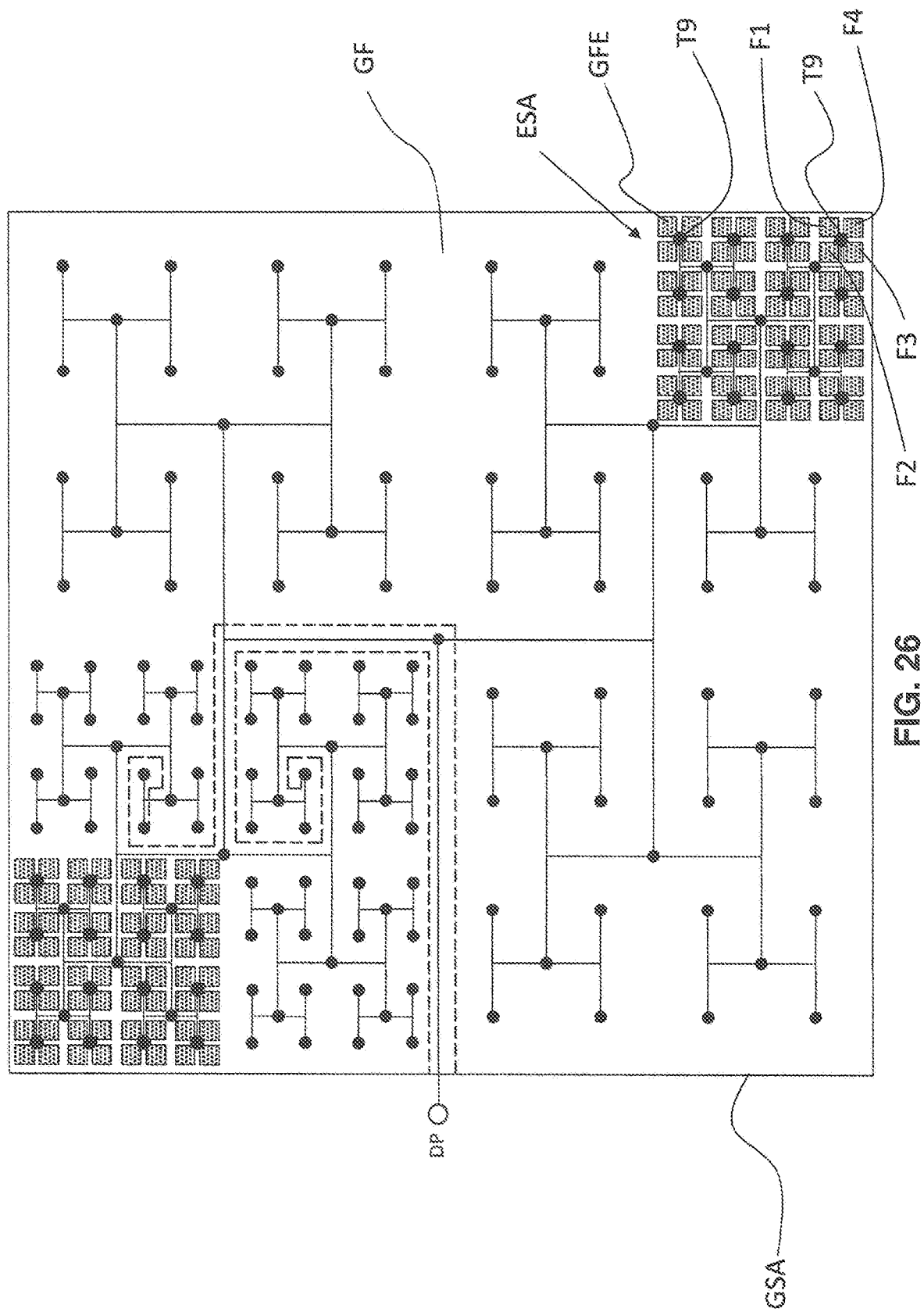
FIG. 26 is a simplified illustration of the self-similarity of the circuit layout.

Finally, FIG. 7 also indicates that the FIGS. 24 to 26 illustrate a detail of the driver Buf and the transistor $T_{dis}$. The output of the driver Buf is connected to the control terminal $GT_{dis}$ of the transistor.

Figure 8:
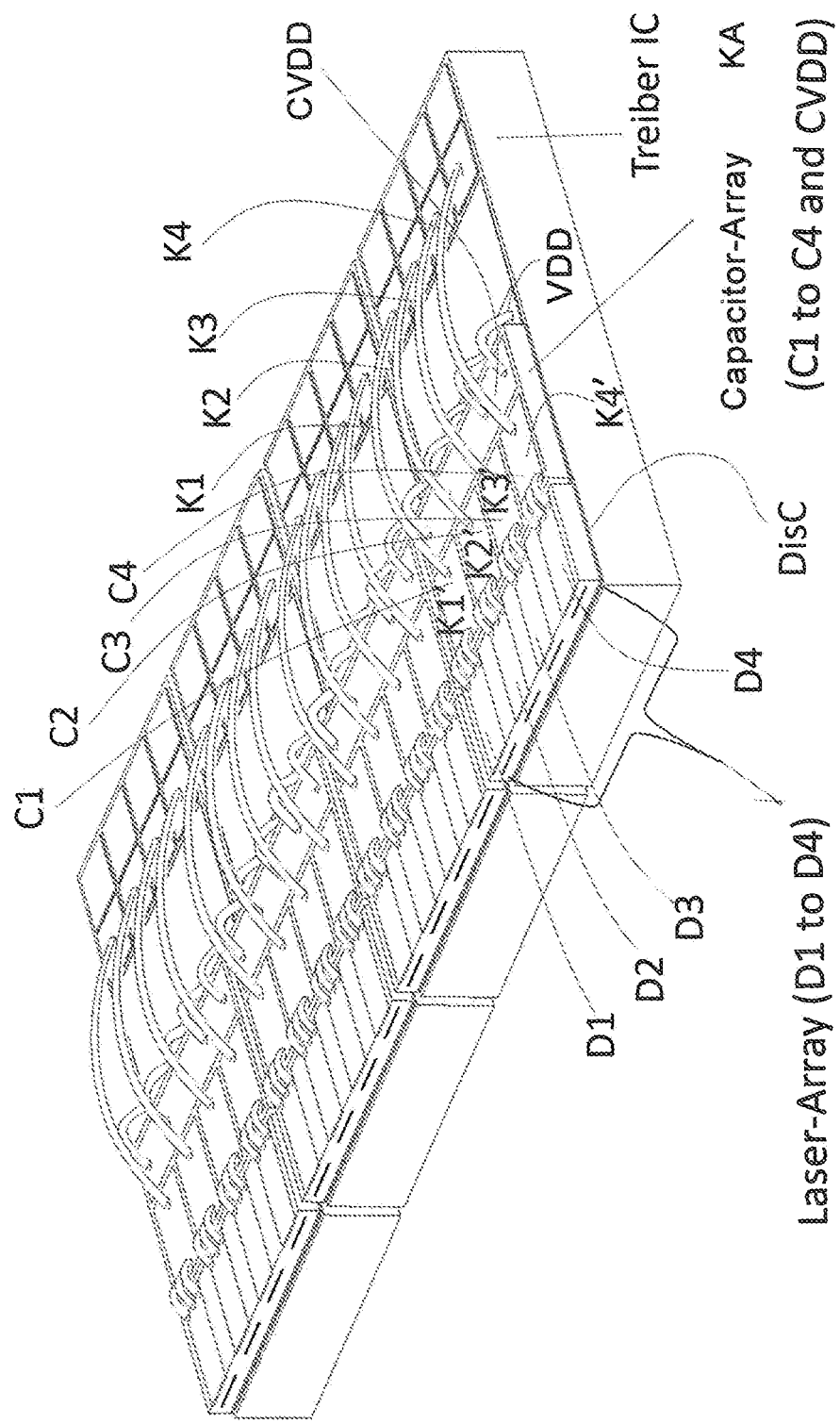
FIG. 8 shows an arrangement with a plurality of laser modules of FIG. 6, FIGS. 9A, 9B, 9C show a capacitor-array C1 to C4 and CVDD for use in a laser module according to FIG. 7 in top plan view, in side view, and showing the internal wiring of the capacitor array.

FIG. 8 shows an arrangement with a plurality of laser modules of FIG. 6. Here, the drive logic and the control are preferably configured such that always only one laser of all laser modules generates a light pulse, the driving of all lasers arranged side by side being affected in chronological sequence from one laser to, for example, the respective adjacent laser.

FIGS. 9A, 9B and 9C show a capacitor-array KA with the capacitors C1 to C4 and CVDD for use in a laser module according to FIG. 8 in top plan view (FIG. 9A), in side view (FIG. 9B), and showing the internal wiring of the capacitor array (FIG. 9C).

The capacitor array KA of C1 to Cn and CVDD is preferably rectangular. The contact surfaces for the discharging lines K1' to Kn' are arranged side by side on the upper side preferably along a first edge of the rectangle (see FIG. 9A). The distance from the center of a contact surface for the connection of a discharging line to the center of the contact surface for the connection of the next discharging line corresponds preferably to the distance between the centroid of the corresponding laser (see D1 to Dn in FIG. 6). The laser and these contact surfaces of the capacitor arrays KA thus preferably have the same pitch=distance from center to center. In the example in FIG. 9, this distance is 500 µm, as an example.

The contact surface for the virtual node KG' of the supply voltage VDD extends along the second edge of the rectangle opposite the first edge of the rectangle, which surface corresponds the first terminal of the backup capacitor CVDD.

The contact surface for the virtual node KG' of the supply voltage VDD preferably extends along the entire second edge of the rectangle. In the example in FIG. 9, the length of this extension is slightly shorter than 2000 µm.

The possibly n contact surfaces for the connections of the discharging K1' to Kn' therefore only occupy a section along the first edge of the rectangle that is smaller than 1/n of the length of the first edge of the rectangle. In the example in FIG. 9, this distance is 375 µm, as an example. As an example, the surface area of these contacts is 0.17 mm² in FIG. 9.

The extension of the possibly n contact surfaces for the discharging lines K1' to Kn' along the third and fourth edges, which is 450 µm in this example, is therefore typically longer than the extension of the contact surface for the virtual node KG' of the supply voltage VDD, which is 100 µm in this example. The size of the contact surface for the virtual node KG' of the supply voltage VDD us approximately 0.2 mm².

A lower-side contact KR of the capacitor array KA (see FIG. 9B) forms the common contact for connecting the common reference potential GND.

The material between the contact surfaces for the nodes K1' to Kn' and KG' forms the dielectric of the capacitor array KA. Between a respective contact surface for the nodes K1' to Kn' and KG' and the lower-side contact, one of the capacitors C1 to Cn and CVDD is thus formed, respectively.

Figure 9:
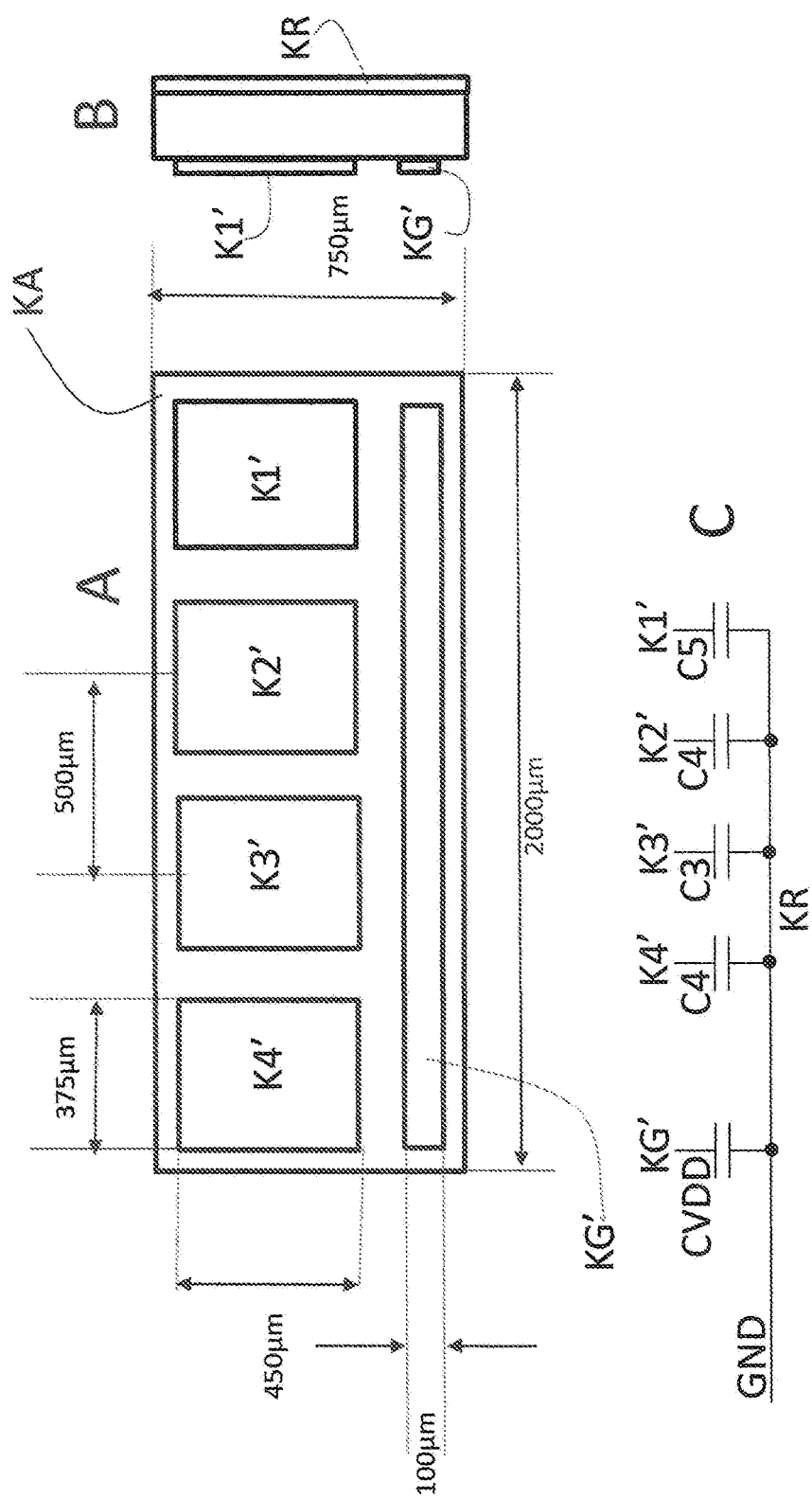

For the sake of clarity, the example in FIG. 9 (as well as the other examples in this description) is directed to n=4, which, however, should by no means be understood as limiting.

Figure 10:
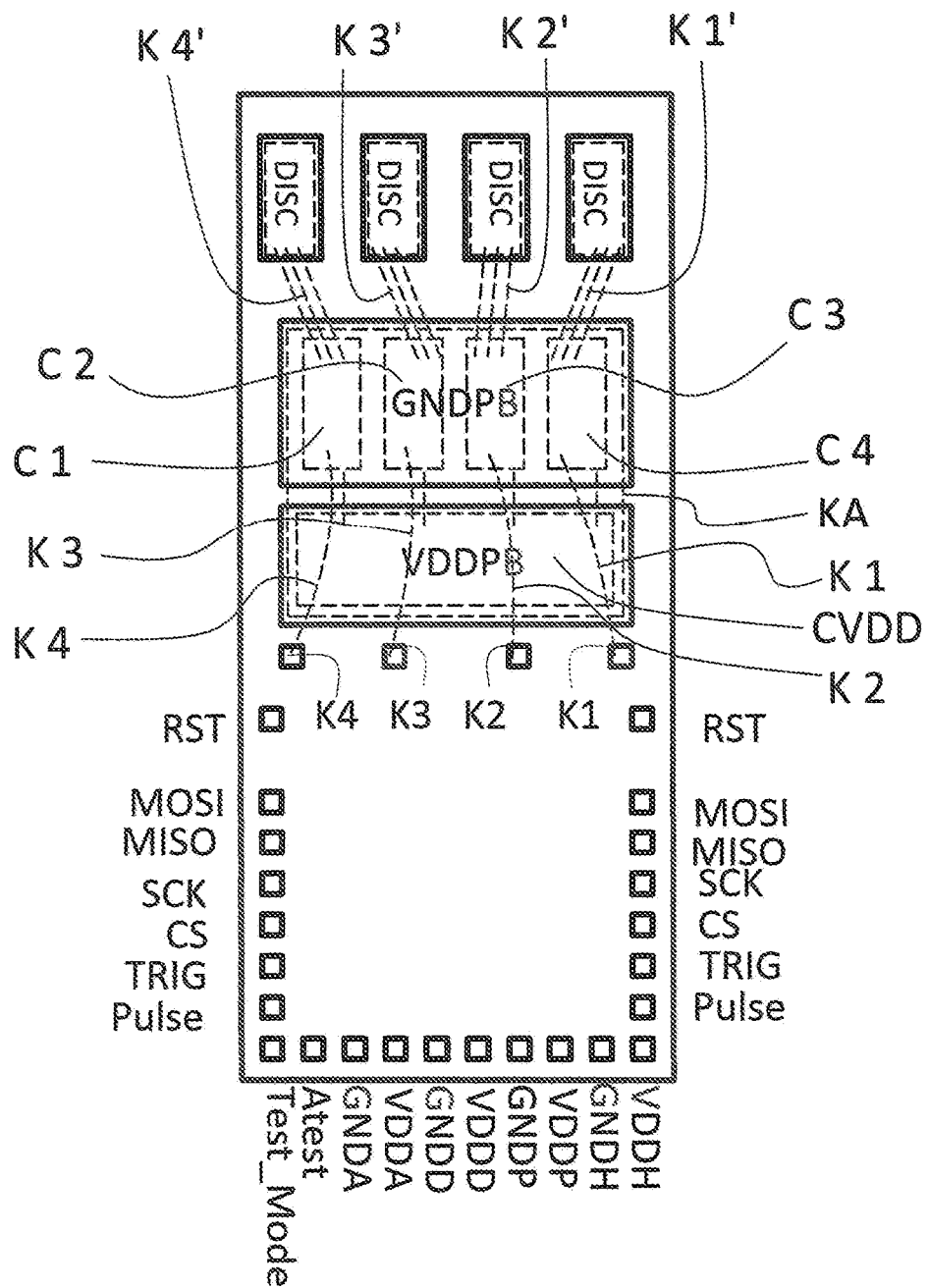
FIG. 10 shows the structure of a proposed driver IC in top plan view.

FIG. 10 shows the structure of an individual proposed driver IC in top plan view. The structure is greatly simplified and is restricted to the essential features.

As already mentioned elsewhere in this description, the number n of lasers D1 to Dn of the module is restricted, as an example, to n=4, for more clarity. The principles of this description can be applied analogously to other numbers n of lasers. Here, n is used instead of the number 4, although the Figure shows n=4. Here, n should always be understood as a positive integer.

As an example, four contact surfaces for the backside contacts of the exemplary four lasers D1 to D4 of the laser module are located on the upper side of the driver IC. Each of the four contact surfaces is connected to the first star point DisC. Of course, an individual contact surface is conceivable instead of four separate contact surfaces.

With regard to the orientation of the illustration of the driver IC in FIG. 10, a contact surface GND, which is connected to the reference potential GND, is located beneath the contact surfaces DisC. The capacitor array KA is placed on this contact surface. Thereby, the lower-side contact KR of the capacitor array KA connected to the reference GND.

Also, with regard to the orientation of the illustration of the driver IC, located below the contact surface GND, a contact surface VDD for the bonding wires is provided for the bonding wires by which the first terminal of the backup capacitor CVDD of the first capacitor array KA, which is the virtual node KG' of the supply voltage VDD, is connected to the supply voltage VDD.

Below the contact surface VDD (again with regard to the orientation of the illustration of the driver IC), the n bonding surfaces (here, for example, n=4) for the outputs of the driver circuits B1 to Bn (here n=4) are located. Using long bonding wires, which represent the charging lines K1 to Kn (here, n=4), the capacitors C1 to Cn, which serve as power reserves for the lasers D1 to Dn (here, n=4), are charged by the driver circuits B1 to Bn.

In the example in FIG. 10, the proposed driver IC requires a plurality of supply voltages via a plurality of supply voltage contacts DDA, GNDA, VDDD, GNDD, VDDP, GNDP, VDDH, GNDH. During the development of the disclosure, it was found that it is advantageous to supply the supply voltages to the driver IC with low impedance via its edge opposite the lasers, since each driver IC can thus have its own low-impedance supply line.

Furthermore, it was found that signals, which could also be applied to the driver ICs with high impedance, can be looped through across the ICs. In the example of FIG. 10, these are, for example, the reset signal RST which is connected horizontally to a corresponding terminal on the opposite side of the driver IC. Furthermore, in the example in FIG. 10 a SPI data bus is shown as an example for a data bus. The input of the SPI data bus MOSI and the output of the SPI data bus MISO and the clock SPI data bus SCK have equivalents on the opposite side of the driver IC. A select signal (chip select CS) is also looped through. The trigger signal for firing the laser pulse is supplied to the terminal TRIG at the one side of the driver IC and is looped through to other side unaltered.

The lasers of the modules are fired with the edge of this trigger signal.

Another optional example for a signal that is supplied to all driver ICs and is also looped through is applied to the terminal Pulse. This may, for example, be a diagnosis signal a diagnostic interface.

Figure 11:
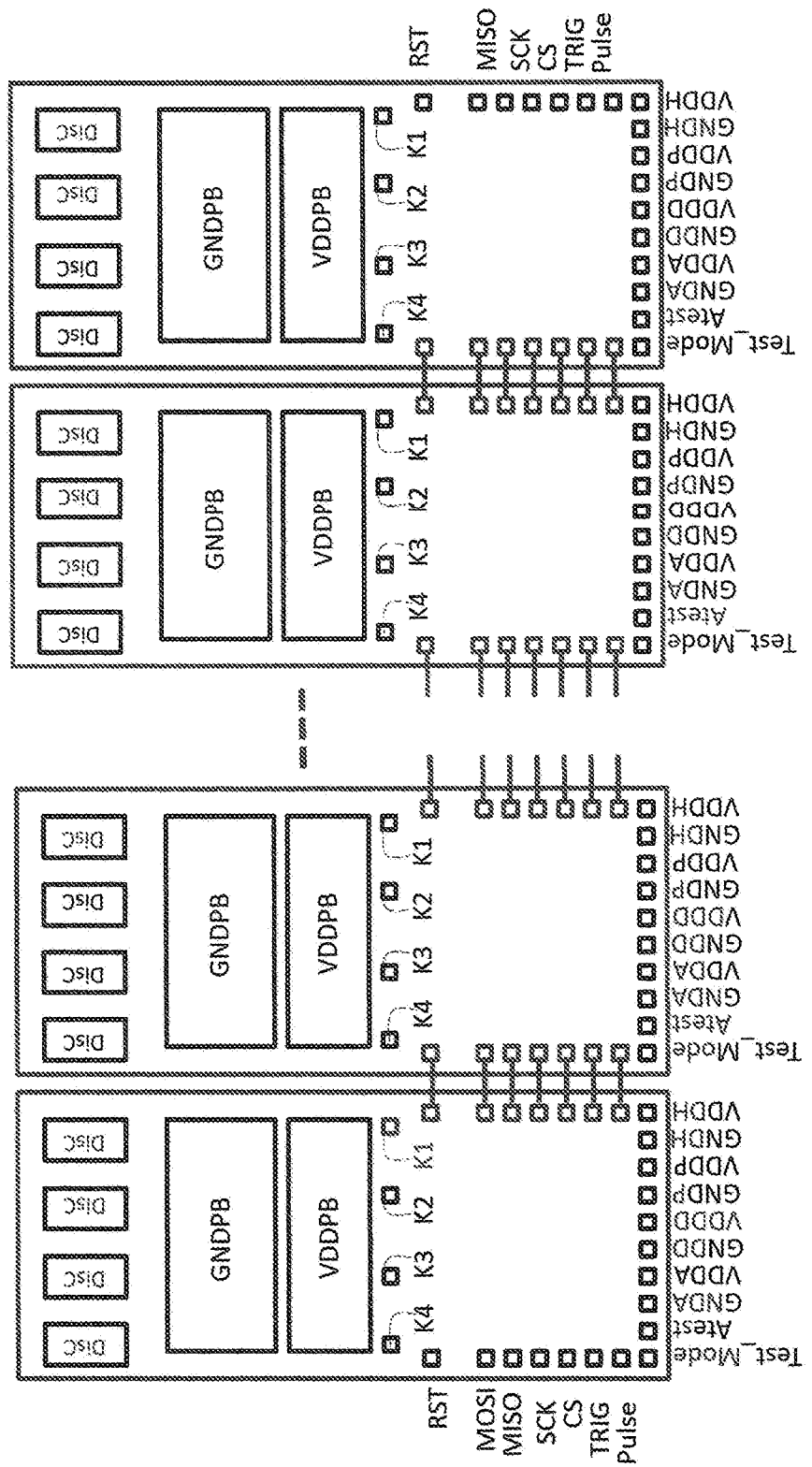
FIG. 11 shows the series arrangement of laser-modules on the driver-IC-level.

FIG. 11 illustrates the sequence of a plurality of laser module in FIG. 10 on the driver level.

The contact surfaces on the longitudinal sides of two adjacent driver ICs are interconnected by bonding wires. It is obvious that this design ensures a low-impedance supply of electric power to all laser modules since the control signals are looped through.

Figure 12:
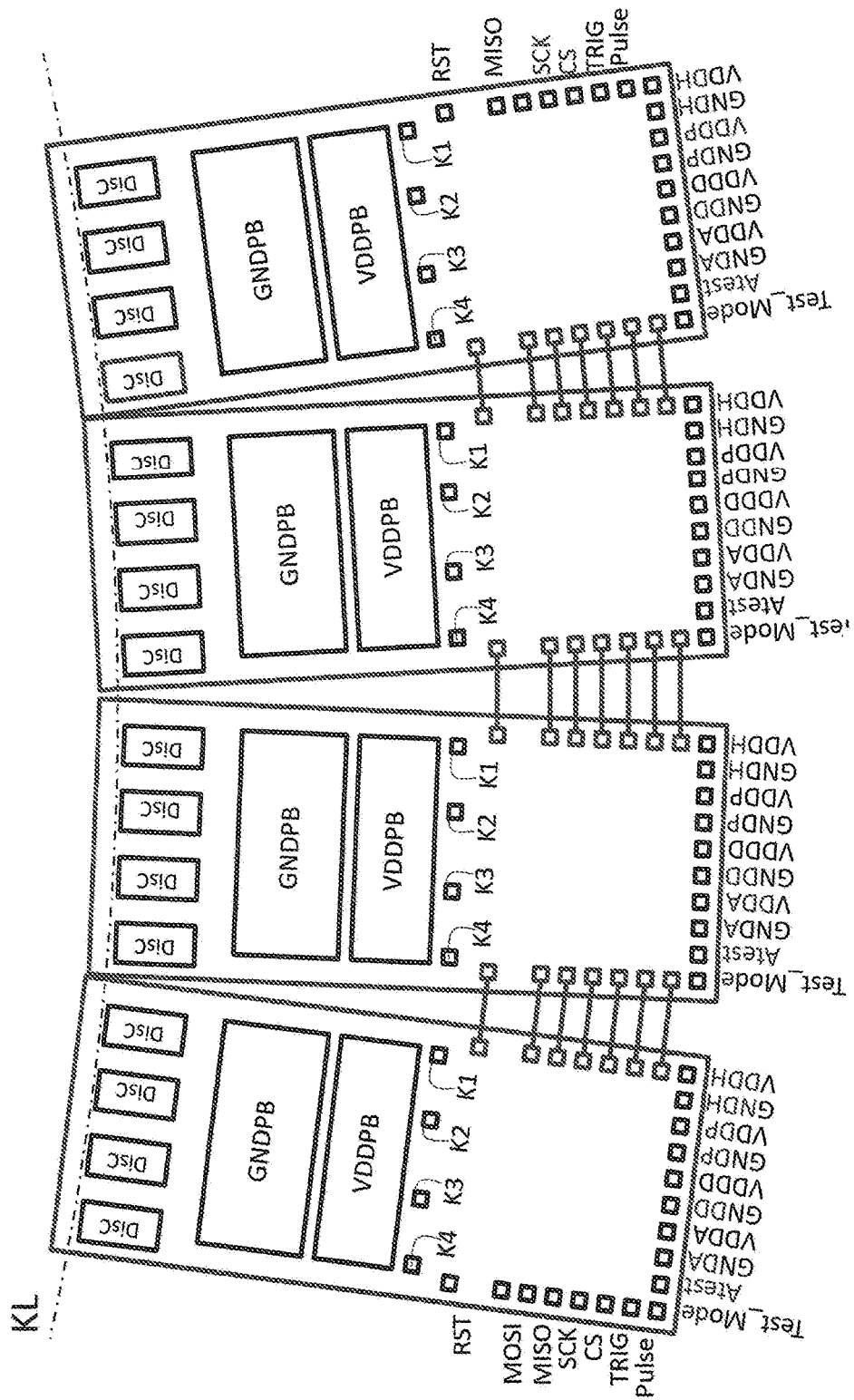
FIG. 12 shows the alignment of the laser modules of FIG. 11 along a curved line.

FIG. 12 shows the alignment of the laser modules of FIG. 11 along a curved line KL. This has the advantage that the generation of the laser beam fan is drastically simplified. Firstly, the laser modules can be arranged perpendicular to this curved line KL. Secondly, within a laser module, the lasers can be arranged along this curved line KL so that eventually all lasers of all modules are arranged along this curved line KL. The curved line KL can be convex or concave. The laser beam of each laser of each laser module has a laser beam axis. If only the laser modules are arranged along the curved line KL and this curved line KL is a segment of a circular arc, the laser beam axes of the respective first lasers D1 of all laser modules intersect at a common point in space. This point may also be located behind the lasers.

If the lasers D1 to Dn of a laser module are arranged along a curved circular line KL, the laser beam axes of the lasers D1 to Dn of this laser module intersect at one point.

If the lasers D1 to Dn of a laser module are arranged along a curved common circular line KL, the laser beam axes of all lasers D1 to Dn of laser modules intersect at one point.

It is not intended to exclude an arrangement of only a part of the lasers and/or only a part of the laser modules along the curved line KL.

Figure 13:
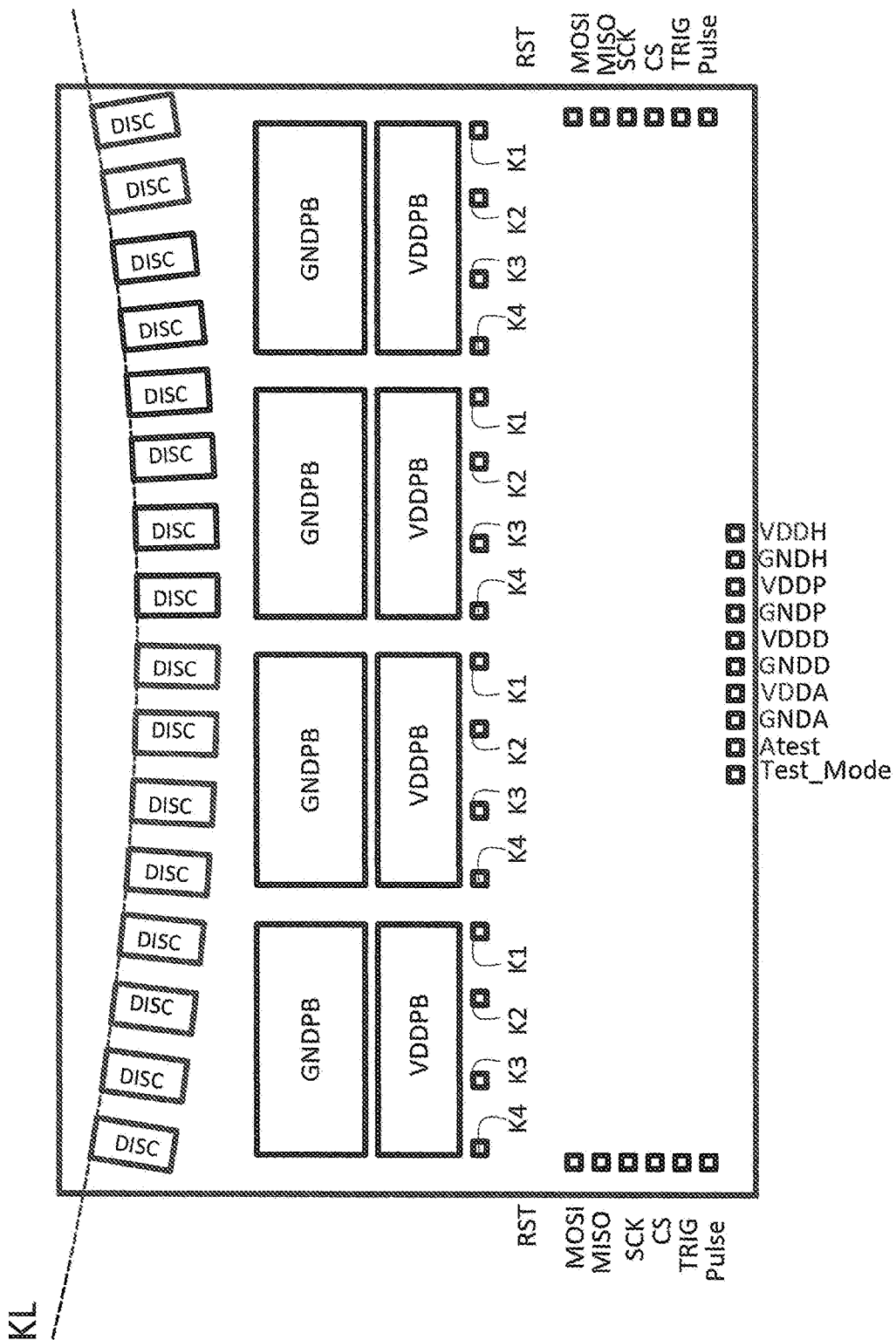
FIG. 13 is a top plan view on an alternative light module with 16 laser diodes on an individual carrier, arranged along a curved line.

The disclosure is not limited to the arrangement or to a sequence of a plurality of light modules, each with, for example, four laser diode dies. For example, the arrangement of the at least four light modules illustrated in FIGS. 8, 11 and 12 can also be realized by an individual light module, on which the laser diode dies are then arranged either along a straight line or along the curved line KL (see FIG. 13). Along the outer edge of such a light module, whose dimensions are larger, terminal areas are provided for the above-mentioned signals and voltages to be applied to the light module(s). The overall light module may either comprise a common and thus large-area capacitor array KA or a plurality of capacitor sub-arrays.

Figure 14:
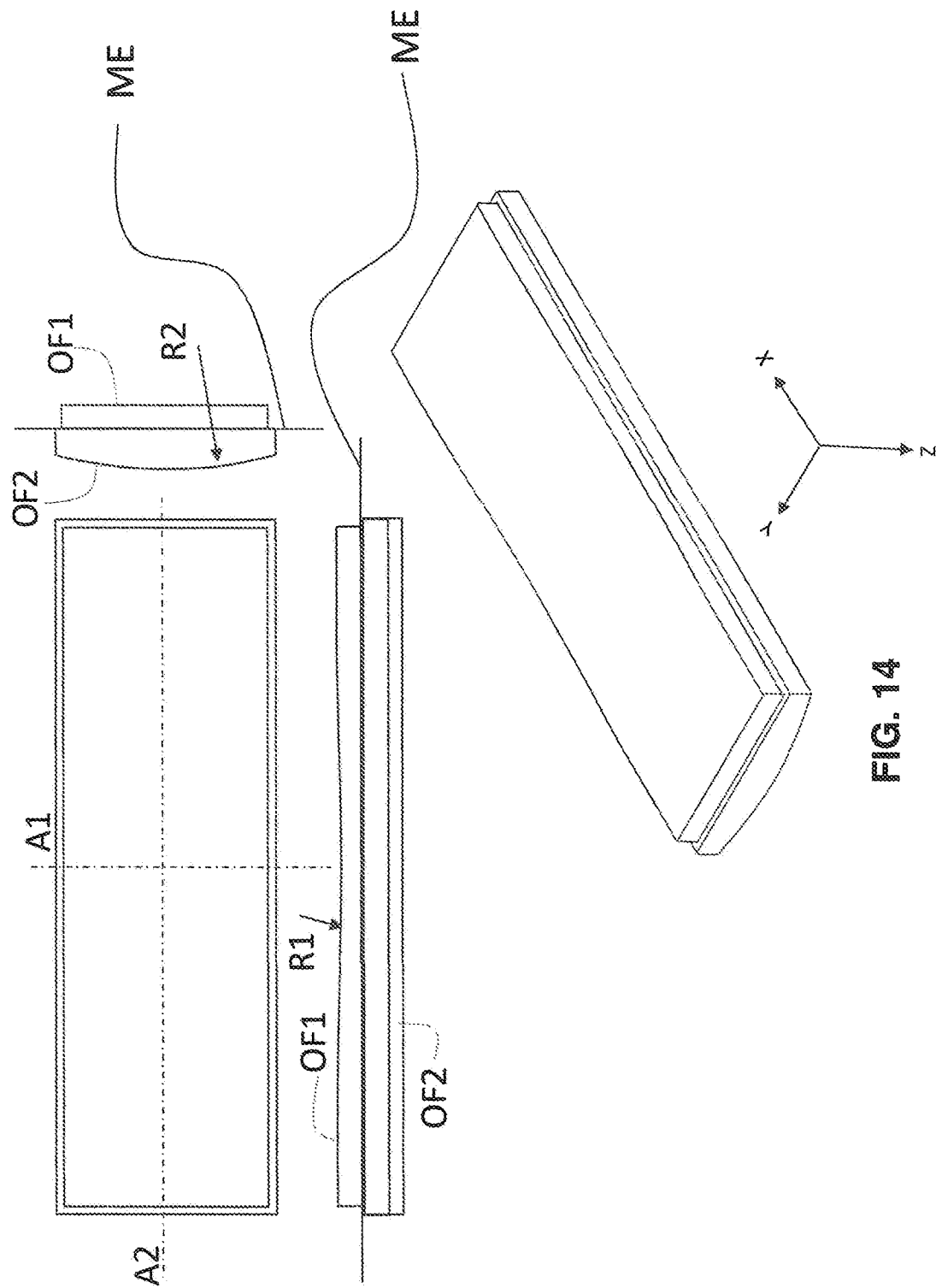
FIG. 14 shows an exemplary Powell lens.

FIG. 14 shows an exemplary Powell lens. On the first surface OF1, the surface is curved around a first axis A1, and on the second surface OF2, it is curved around a second axis A2. Here, the two axes are oriented perpendicular to each other. ME denotes the x-y center plane in the lens center referred to the z extension of the lens (the extension in the direction of the optical axis).

Figure 15:
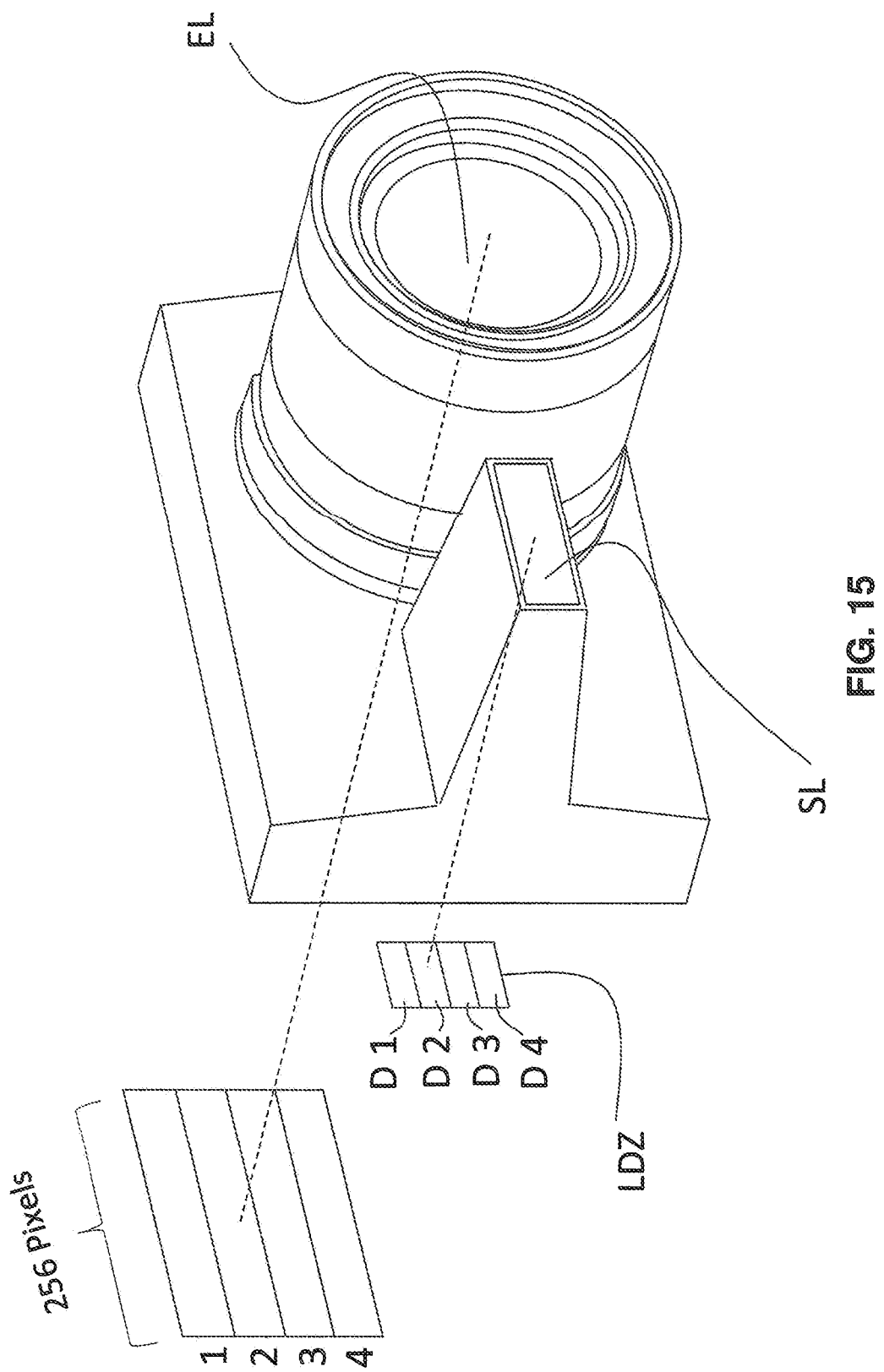
FIG. 15 shows an exemplary arrangement of the emission system with the emitter lens and the receiver system with the receiver lens.

FIG. 15 shows an exemplary arrangement of the emission system with the emitter lens and the receiver system with the receiver lens. The laser diode (array) lines LDZ with n=4 laser diodes, as described as an example above, and the sensor S with n=4 lines each with e.g., 256 pixels are shown in an exploded and schematic view. If, for example, four laser modules were implemented, as illustrated in FIGS. 8, 11 and 12, a laser diode line LDZ with 16 laser diodes and a photo sensor with 16 lines each with e.g., 256 pixels would be obtained.

Figure 16:
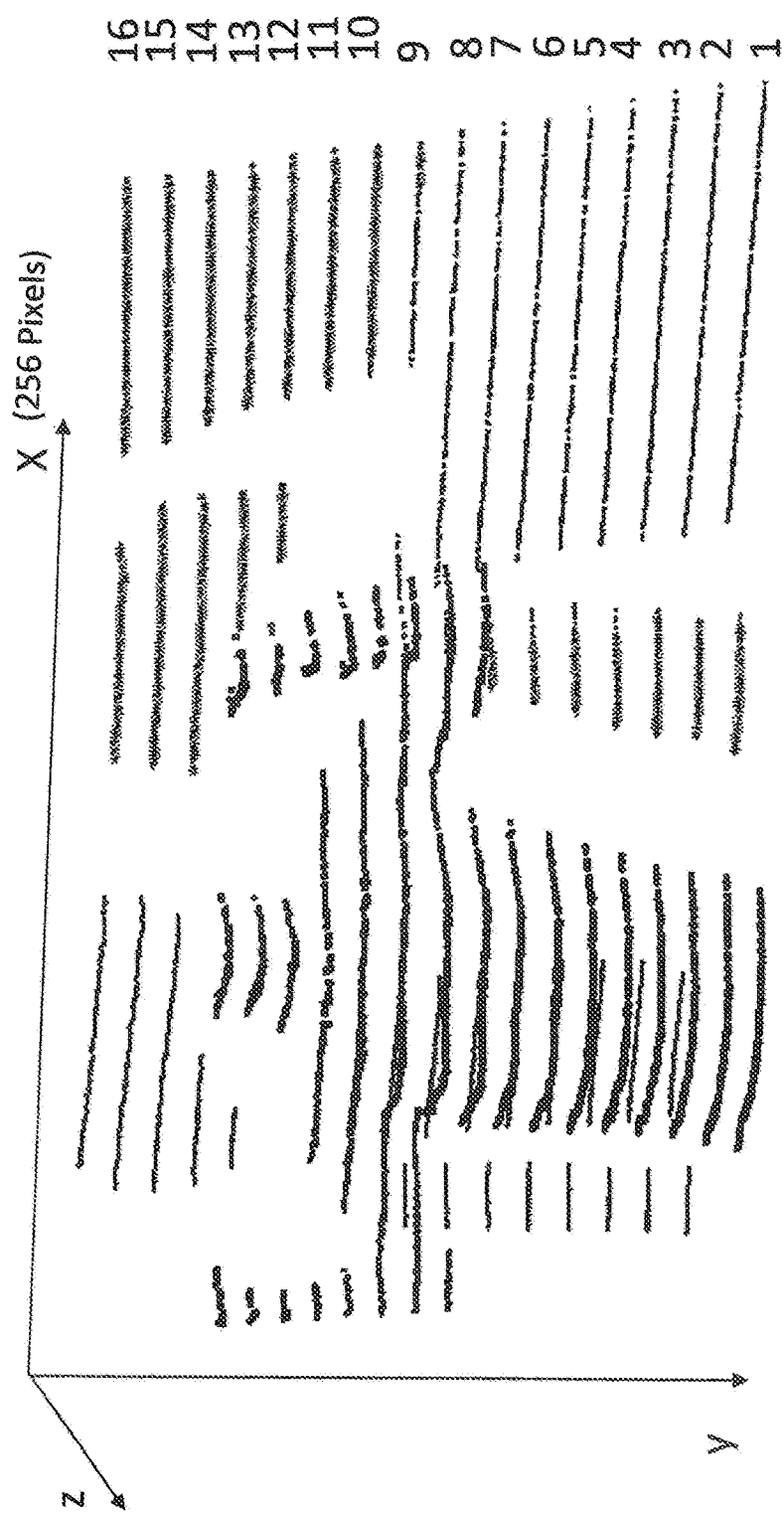
FIG. 16 shows a real measurement result as a point cloud in an exemplary Cartesian coordinate system as a target coordinate system with n=16 lasers and m=256 photo detectors in the photo detector line.

FIG. 16 shows a real measurement result as a point cloud in an exemplary Cartesian coordinate system as a target coordinate system with n=16 lasers and m=256 photo detectors in the photo detector line.

Figure 17:
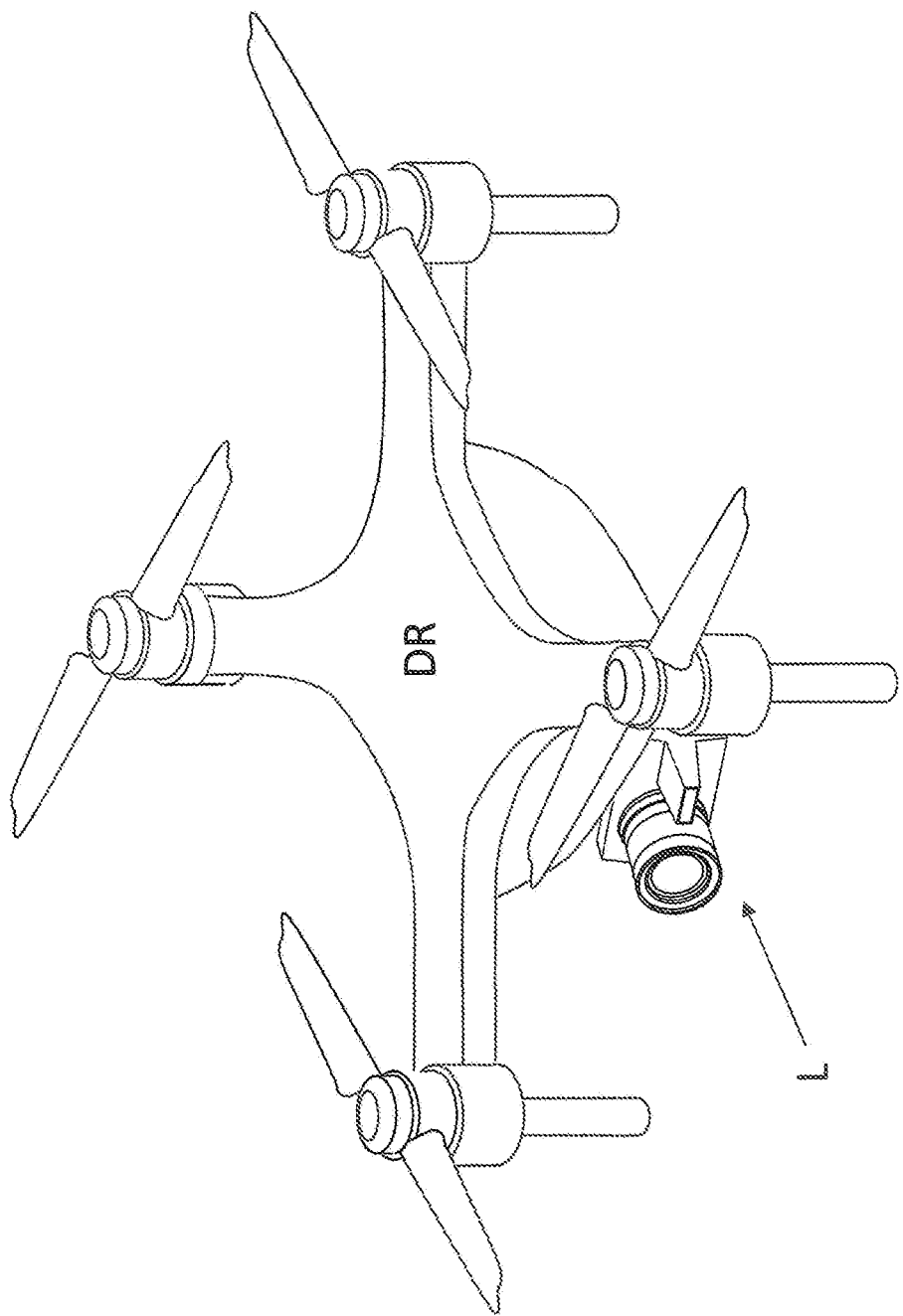
FIG. 17 shows an exemplary drone with a LIDAR module mounted thereto.

FIG. 17 shows a drone according to the disclosure with a LIDAR module according to the disclosure mounted thereto. The LIDAR system according to the disclosure can be used very well with drones, since it is particularly lightweight and comprises no mechanical parts such as e.g., oscillating mirrors.

Other prior art solutions are not as compact and cannot provide this information at such a low weight and low power consumption.

However, the proposed LIDAR system can also be implemented in other vehicles, floating bodies, missiles, rail vehicles, as a scanner in automation technology and the like. It is advantageous, if the vehicle performs oscillating pitching movements so that the "gaps" in the distance image, which are caused by the distance between adjacent photo detector lines of the sensor, can be scanned, whereby the image resolution can be increased. A complete distance image is captured per pitch angle and the information from the photo detector lines is subsequently combined to form the complete image. Thereby, information is also obtained about regions of the distance image, which, without pitching movements being performed, are imaged onto the gaps between adjacent photo detector lines of the sensor.

Figure 18:
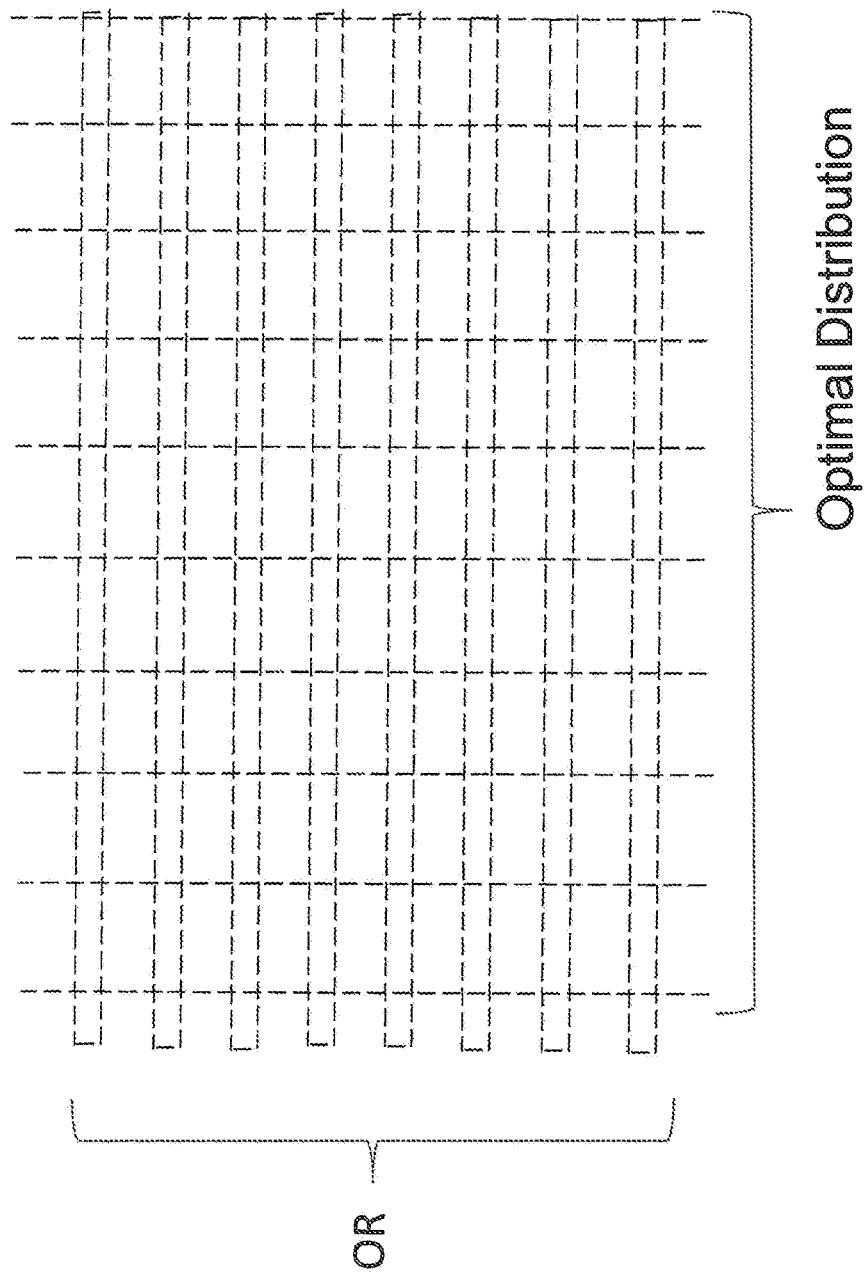
FIG. 18 shows the optimal positioning of the scanning points on a planar surface set up at a defined distance to the sensor system and the surface normal of which is oriented parallel to the measuring axis of the sensor system.

FIG. 18 is to illustrate the problem of a possibly occurring inhomogeneity of the light intensity distribution within an illumination stripe. Images of the laser diode beams after passing the emitter optical element SLE are shown as rectangles on the horizontal plane. The beam of a laser diode typically has an elliptical cross section. If the intensity is determined along a main axis of this cross-sectional ellipse or this cross-sectional oval and plotted in a diagram which shows, as the x-axis, the position along this main axis and, as the y-axis, the radiation intensity, laser diodes typically show a Gaussian intensity distribution. The optical system expands the laser beam of a laser diode in one direction, so that in the ideal case a rectangular, uniformly illuminated region should be obtained in the far field on a projection surface perpendicular to the optical axis of the expanding lens and the laser. However, due to imaging errors, this is not the case. FIG. 18 shows perpendicular lines. The area of a rectangular part of one of the horizontal rectangles, which is located between each two vertical lines, should always receive the same amount of light from rectangular part to rectangular part when illuminated by the laser associated to this rectangle. In the ideal case, all rectangular parts should be identical and be positioned as illustrated in FIG. 18. In reality, however, the optical system has flaws, and the laser beam cross section shows a Gaussian instead of a rectangular intensity distribution over the cross section.

FIGS. 18 to 22 respectively only show the upper left quadrant of the projection field of the emitter optical element SLE which is rectangular and thus comprises four quadrants separated by two mutually perpendicular symmetry axes.

The camera with the photo detectors images the irradiated points onto the n photo detector lines with q photo detector lines each. In the examples in FIGS. 18 to 22, it is assumed that the photo detector array comprises n=16 lines and q=256 pixels. Here, each of the n lasers of the laser module illuminates one line. The optical system then expands the laser beam of a j-th laser of the n lasers with $1 \leq j \leq n = 16$ of the width of the line. The laser beam of the j-th laser is thus expanded on the horizontal plane. The density or the spacing of the vertical lines in FIG. 18 represents the desired power density in the far field. Each of the n lasers of the laser module thus illuminates one line of the image which is then scanned by one line of the photo detector array, which in this case is, as an example, a photo detector array with 16 photo detector lines each with 256 photo detectors. The normal intensity distribution over the line without correction is also a Gaussian distribution because of the Gaussian intensity distribution within the laser beam cross section. It is the object of the optical system described herein to correct this.

In the examples in FIGS. 18 to 22, each of the n photo detector lines is assigned to exactly one laser.

Instead, however, by defocusing, each of the n lasers can illuminate r photo detector cells by means of reflection in the environment of the vehicle. The number of possible photo detector lines is r+n in this case. Thus, it is feasible to use (n+r)×q photodetectors in this case, which are organized in r+n photo detector lines. In this case, each of the n lasers is assigned exactly r photo detector lines.

Instead of defocusing, it is also possible to use multi-segment lenses.

The n lasers are preferably arranged within the laser module in a one-dimensional laser array, perpendicular to the expansion plane of the photo detector lines.

For the sake of completeness, it should be noted that, for brevity, elsewhere in this document n=4 lasers per laser module are assumed as an example to simplify the illustration.

Figure 19:
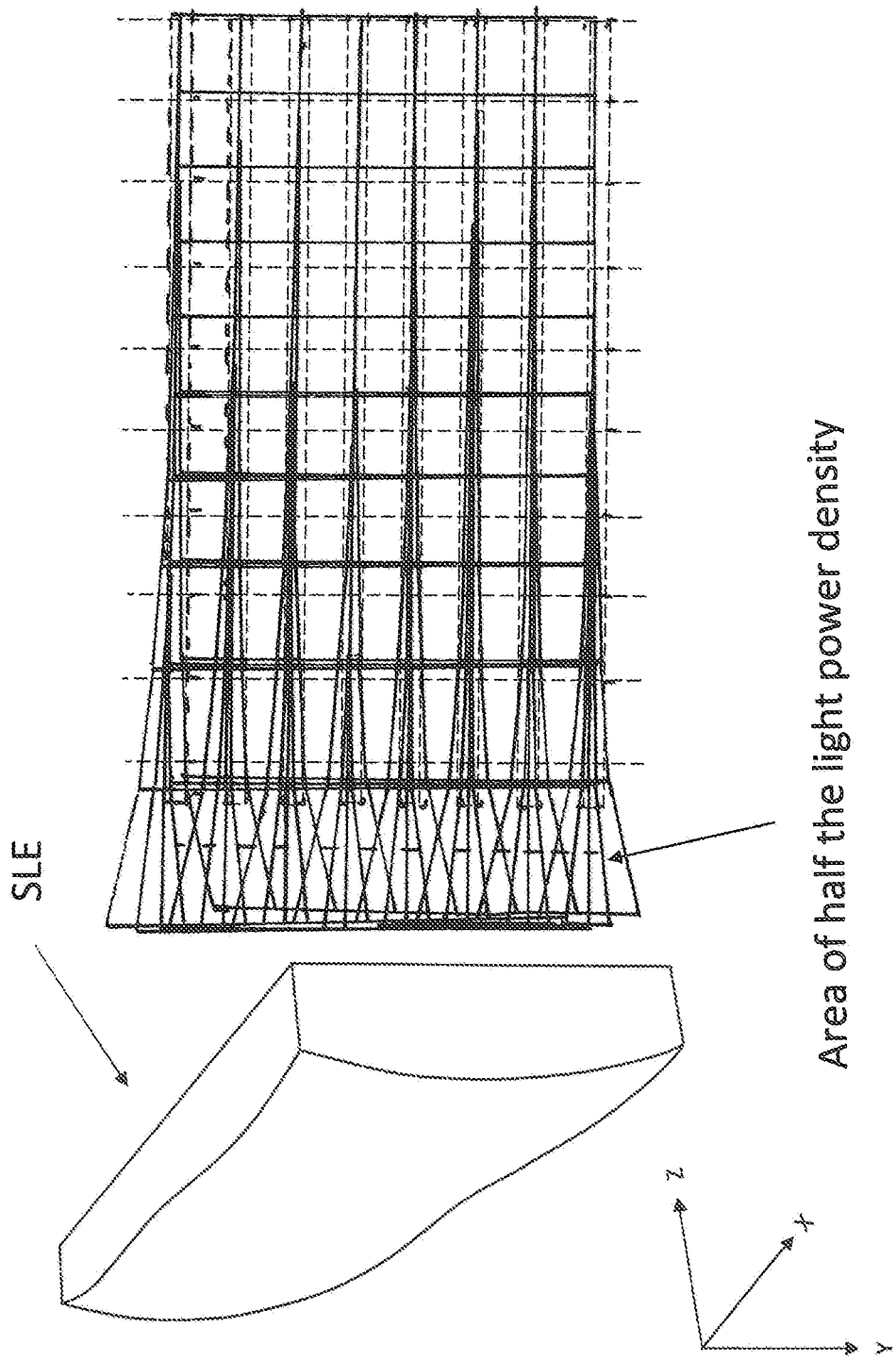
FIG. 19 shows a lens without correction polynomials.

FIG. 19 shows the lens without correction polynomials. Only the parameters B2 and B3 differ from 0. Accordingly, the equations are $$Z = R0Y - \text{Sign}(R0Y)*\text{Sqrt}(R0Y^2 - y^2) + PB2*x^2 + PB3*|x^3|$$
and $z = -d$.

As can be seen from FIG. 19, the power distribution at the edges and primarily in the corners deviates significantly from the desired distribution in FIG. 18.

Figure 20:
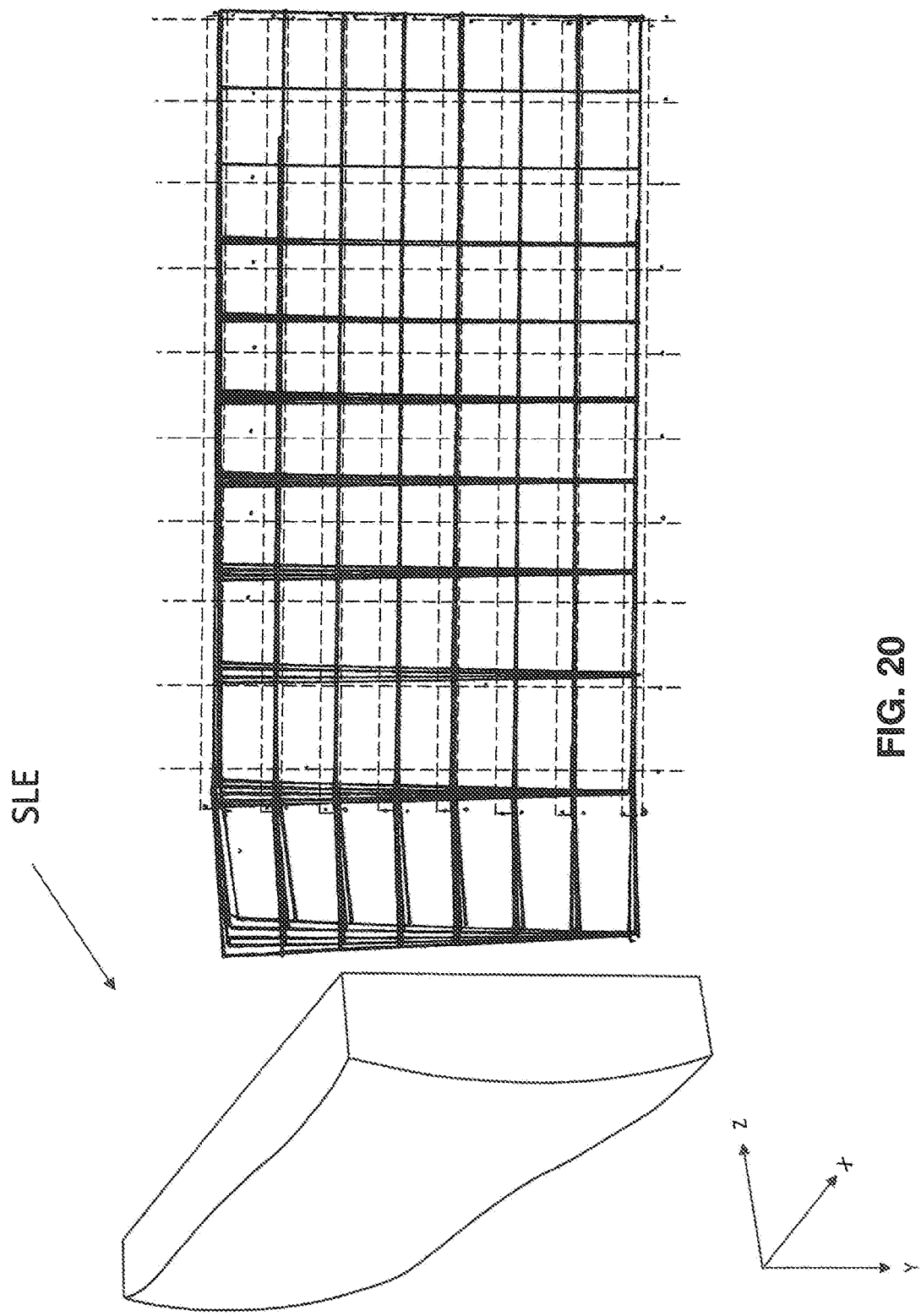
FIG. 20 shows a lens with the parameters AR2=0.01, AR3=0.0006, PB2=−0.0085, PB3=0.0008, PB4=0, B6=0, PC2=0, PC3=0.

FIG. 20 shows a lens corresponding to the parameters of the first lens with AR2=0.01, AR3=0.0006, PB2=−0.0085, PB3=0.0008, PB4=0, B6=0, PC2-0, PC3=0. Thus, the equations now are $$Z = RY + AR2*x^2 + AR3*|x^3| - \text{Sign}(RY)*qrt(RY2 - y^2) + PB2*x^2 + PB3*|x^3| \text{ where } RY = R0Y + AR2*x^2 + AR3*|x^3| \text{ and } z = -d.$$

Figure 21:
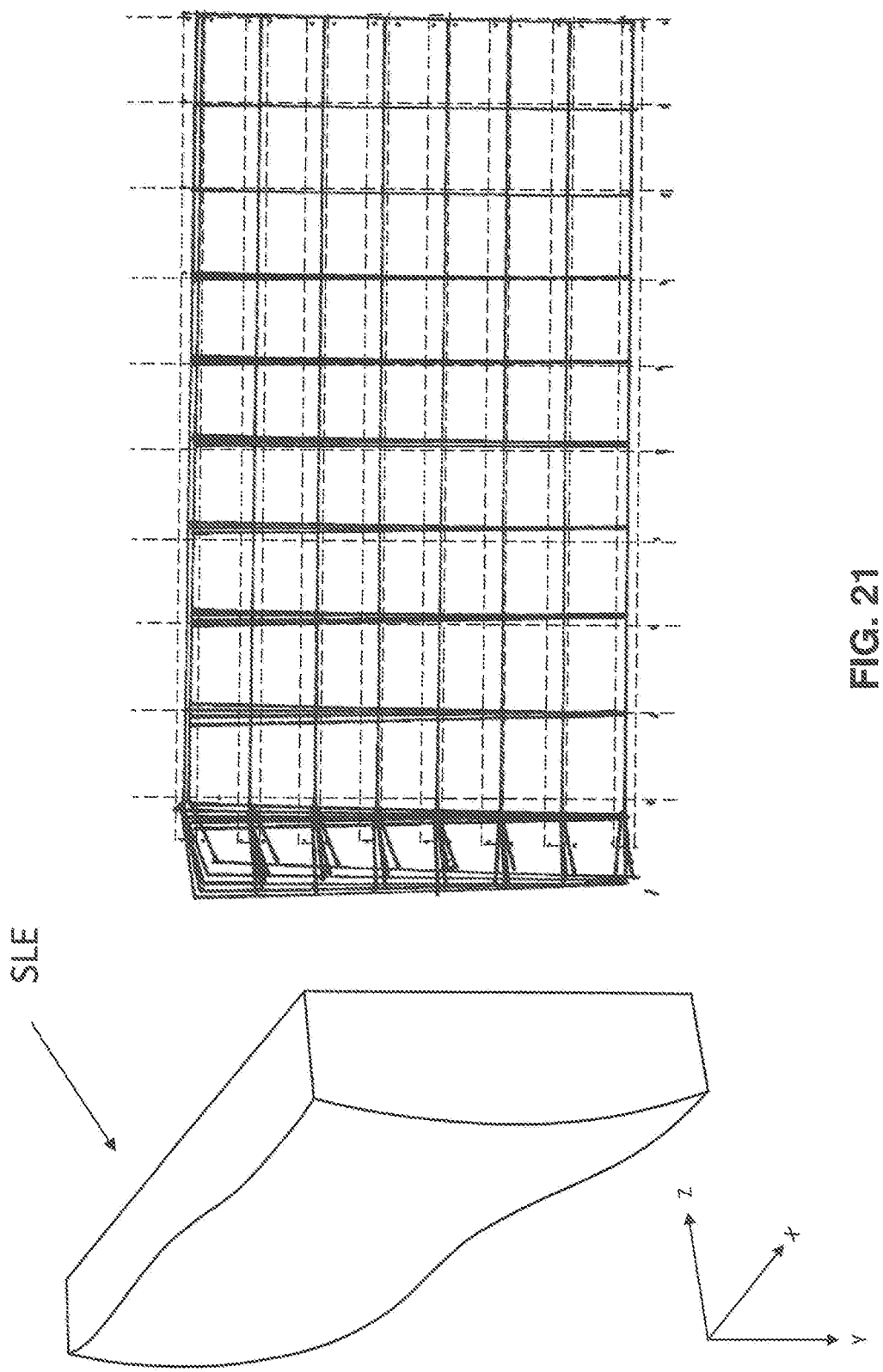
FIG. 21 shows a lens with the parameters AR2=0.01, AR3=0.0005, PB2=−0.015, PB3=0.0015, PB4=−0.000024, PB6=0, PC2=0, PC3=0.

FIG. 21 shows a lens corresponding to the parameters of the second lens with AR2=0.01, AR3=0.0005, PB2=−0.015, PB3=0.0015, PB4=−0.000024, PB6=0, PC2=0, PC3=0. Thus, the equations now are $$Z = RY + AR2*x^2 + AR3*|x3| - \text{Sign}(RY)*\text{Sqrt}(RY2 - y^2) + PB2*x^2 + PB3*|x^3| + PB4*x4 \text{ where } RY = R0Y + AR2*x^2 + AR3*|x^3| \text{ and } z = -d.$$

The distribution of energy is almost optimal.

Figure 22:
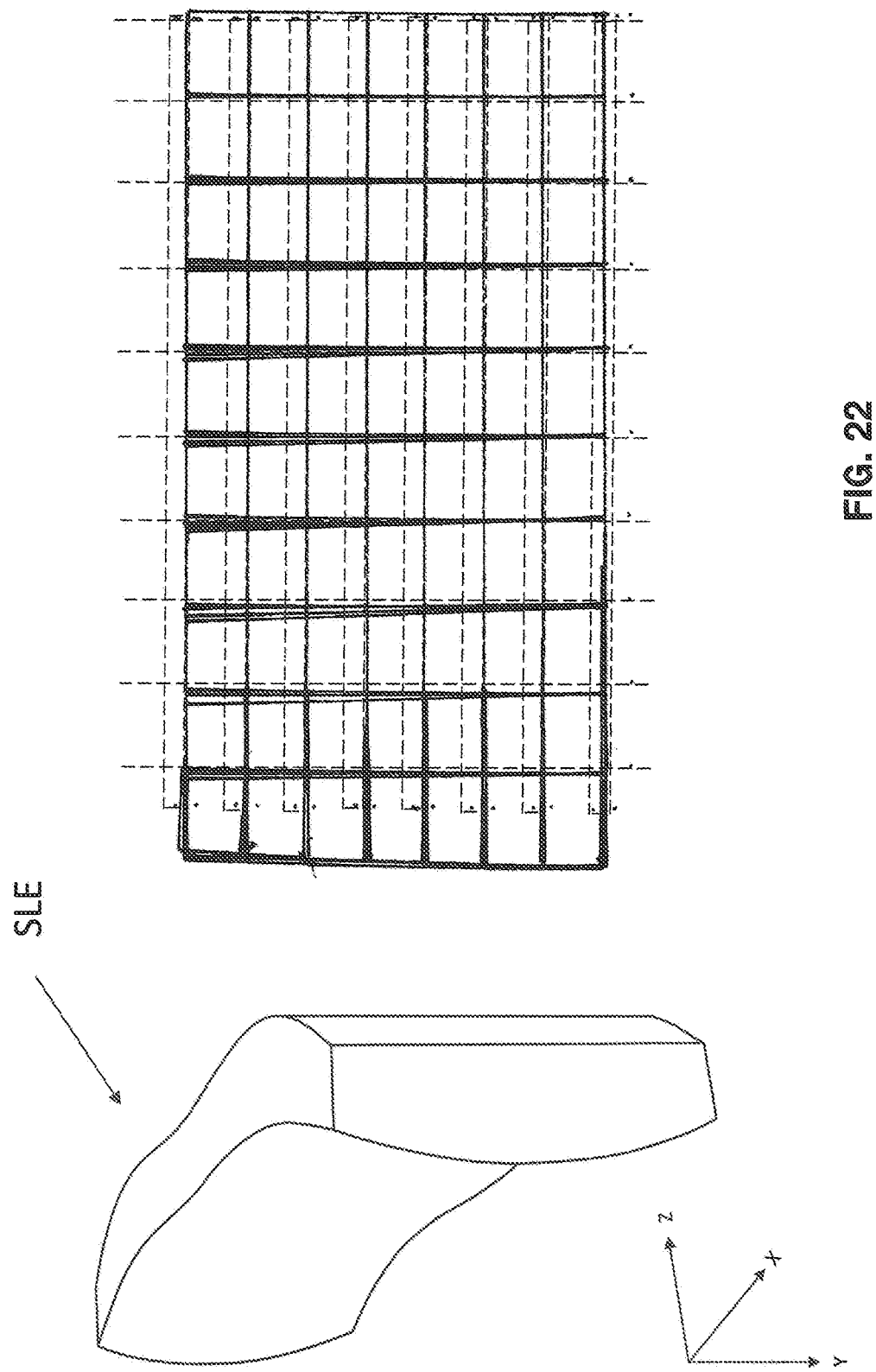
FIG. 22 shows a lens with the parameters AR2-0.028, AR3=−0.0028, PB2=−0.0115, PB3=0.00038, PB4=−0.000034, PB6=0.00000013, PC2=0.028, PC3=−0.0032.
Figure 23:
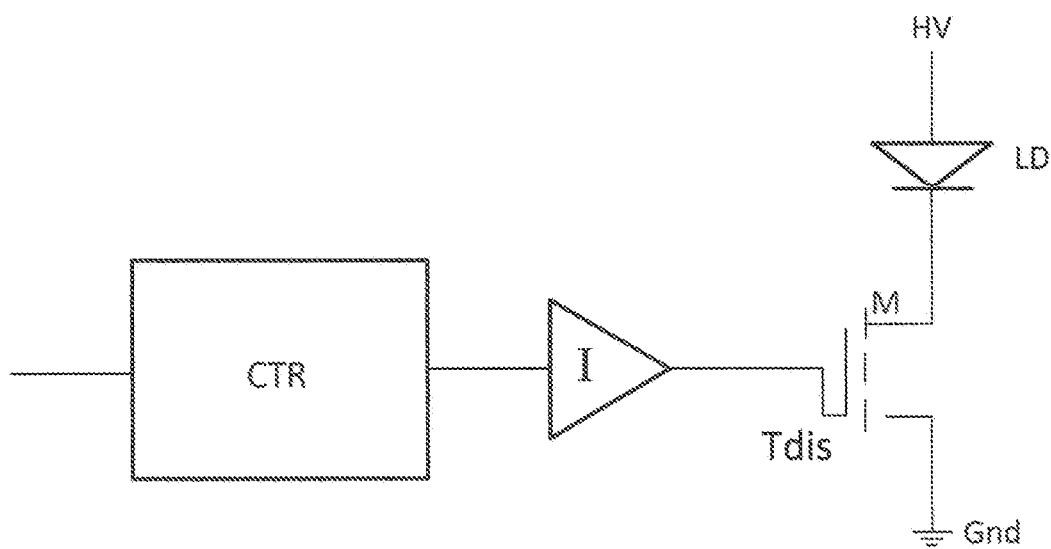
FIG. 23 illustrates an exemplary circuit according to prior art, reduced to the essentials, for driving a laser diode LD by means of a driver circuit I and an unspecified pre-driver circuit and a field effect transistor M.

FIG. 22 shows a lens corresponding to the parameters of the third lens with AR2=0.028, AR3=−0.0028, PB2=−0.0115, PB3=0.00038, PB4=−0.000034, PB6=0.00000013, PC2=0.028, PC3=−0.0032. Thus, the equations now are $$Z = RY + AR2*x^2 + AR3*|x^3| - \text{Sign}(RY)*\text{Sqrt}(RY2 - y^2) + PB2*x^2 + PB3*|x^3| + PB4*x^4 + PB6*x^6 + PC2*x^2 + PC3*|x^3| \text{ where } RY = R0Y + AR2*x^2 + AR3*|x^3| \text{ and } z = -(d + PC2*x^2 + PC3*|x^3|).$$

As can be seen from FIG. 22, the distribution is now almost optimal and the errors are negligible in the real case.

In various technical applications, laser diodes or light-emitting diodes are driven by driver circuits, typically by means of short high-current pulses. In the driver circuits, high currents flow at short switching times. CMOS transistors with high-current capabilities, used in the driver circuits and having a low drain-source resistance extend over large areas, which limits the switching speed due to the limited propagation speed of the gate signal. A LIDAR system may be mentioned as an example of application.

In present a self-similar structure of a driver structure of the type described above, the object is achieved according to the disclosure by dividing the driver circuit and the pre-driver into blocks which each contain a small part of the driver transistors with a corresponding pre-driver. The driver circuit and the pre-driver in one block are dimensioned such that the desired switching time is achieved within the block. To achieve the desired driver current, a plurality of blocks are combined and extended by another stage of the pre-driver. This interconnection of the individual blocks is affected in a self-similar structure according to the disclosure, as will be explained below. Here, the gate signal is lead to the sub-blocks in order to achieve simultaneous switching. By interleaving the hierarchically structured pre-driver and driver circuit, as well as by a direct connection of all critical networks via the upper side of the chip and a balanced signal wiring, the presented architecture on the basis of self-similar sub-structures enables massively scalable high-current switches at a consistently high switching speed.

The subdivision of the driver circuit into individual blocks, hereinafter referred to as basic structures, and the combination of these basic structures into a self-similar structure will be explained in more detail with reference to the Figures. For a simpler explanation, the driver circuit and pre-driver will not be differentiated in the following and will be referred to simply as a driver.

A basic structure in the sense of this description refers to that structure that constantly recurs in a similar manner in a self-similar structure with different dimensions and interleavings.

The present concept of interleaving an always constant design of the interconnection of each output of an individual driver circuit of one stage with the inputs of the individual driver circuits of the next stage (both on the layout level an on the circuit level) is advantageous in that the length of the circuit path from the input of the individual driver circuit of the first stage to the output of each individual driver circuit of the last stage is always the same. The course and the structure of these signal paths are also similar or symmetric or point symmetric in groups, so that, overall, also equal parasitics, such as parasitic inductances and parasitic ohmic resistances, as well as parasitic capacitances, if any, are obtained. All this ensures that the comparatively large control electrode field of a power transistor is supplied with the driver signal at a plurality of individual sub-regions, which signal is itself preferably generated digitally and is electrically stabilized due to the plurality of stages in each sub-region of the control electrode surface. This is ensured in particular by the implementation of the individual driver circuits as digital inverter circuits.

The concept presented here includes a self-similarity at the circuit level and a self-similarity at the layout level. Both types of self-similarity are claimed herein separately and in combination.

FIG. 24 is a simplified illustration of the basic concept of the self-similarity of the circuit architecture underlying the disclosure, on the basis of the circuit diagram and the circuit layout. FIG. 24 includes six FIGS. 24(a) to 24(f) which will be explained below. The three FIGS. 24(a) to 24(c) on the left are simplified illustrations of the concept of the self-similar structure on the circuit diagram side. The three FIGS. 24(d) to 24(f) on the right side are simplified illustrations the concept of the self-similar structure on the corresponding lay outside.

FIG. 24(a) illustrates the circuit diagram of a first structure B0' illustrated as an example. The first structure B0' comprises a first terminal S0 of the first structure B0' and a second terminal G0 of the first structure B0' and a third terminal GND0 of the first structure B0'. The first structure B0' comprises a first part I0 of a first driver and a first part M0 of a first field effect transistor. The first part I0 of the first driver includes a first and a second terminal. The first part M0 of the first field effect transistor has a gate terminal and a drain terminal and a source terminal. The first terminal S0 of the first basic structure B0' is connected in an electrically conductive manner to the drain terminal of the first part M0 of the first field effect transistor. The third terminal GND0 of the first structure B0' is connected in an electrically conductive manner to the source terminal of the first part M0 of the first field effect transistor. The second terminal G0 of the first structure B0' is connected in an electrically conductive manner to the first terminal of the first part I0 of the first driver. The second terminal of the first part I0 of the first driver is connected to the gate terminal of the first part M0 of the first field effect transistor in an electrically conductive manner.

Accordingly, FIG. 24(d) shows the simplified layout representation of the first structure B0'. The first part M0 of the first field effect transistor and the first part I0 of the first driver are shown as adjacent rectangles.

FIG. 24(b) shows an exemplary combination of n structures B0' of FIG. 24(a) into a first basic structure B1'. Here, the variable n represents a natural number greater than 1. Preferably, n is equal to 4. The first basis structure B1' comprises a first terminal S1 of the first basic structure B1' and a second terminal G1 of the first basic structure B1' and a third terminal GND1 of the first basic structure B1'. The first basic structure B1' comprises n structures B0'. The n first terminals S0<1; n> of the n structures B0' are connected to the first terminal S1 of the first basis structure B1' in an electrically conductive manner.

The n third terminals GND0<1; n> of the n structures B0' are connected to the third terminal GND1 of the first basic structure B1' in an electrically conductive manner.

The first basic structure B1' comprises a first part I1 of a second driver. The second part I1 of the second driver includes a first terminal and a second terminal.

The first terminal of the first part I1 of the second driver is connected in an electrically conductive manner to the second terminal G1 of the first basic structure B1'. The second terminal of the first part I1 of the second driver is connected to the n second terminals G0<1; n> of the n structures B0' in an electrically conductive manner.

FIG. 24(e) shows a simplified layout representation of the first basic structure B1'. In this case, the first basic structure B1' comprises four structures B0' and the first part I1 of the second driver. By positioning parts of the first driver adjacent to each other, another part of the first driver or the entire first driver is formed. By positioning parts of the first field effect transistor adjacent to each other, another part of the first field effect transistor or the entire first field effect transistor is formed.

FIG. 24(c) shows a combination of n first structures B1' of FIG. 24(b) into a first self-similar structure B2'. Here, the variable n represents a natural number greater than 1. Preferably, n is equal to 4. The first self-similar structure B2' comprises a first terminal S2 of the first self-similar structure B2' and a second terminal G2 of the first self-similar structure B2' and a third terminal GND2 of the first self-similar structure B2'. The first self-similar structure B2' comprises n first structures B1'. The n first terminals S1<1;

n> of the n first basic structures B1' are connected to the first terminal S1 of the first self-similar structure B2' in an electrically conductive manner. The n third terminals GND1<1; n> of the n first structures B1' are connected to the third terminal GND2 of the first self-similar structure B2' in an electrically conductive manner.

The first self-similar structure B2' comprises a first part I2 of a third driver. The first part 13 of the third driver includes a first terminal and a second terminal.

The first terminal of the first part 12 of the third driver is connected in an electrically conductive manner to the second terminal G2 of the first self-similar structure B2'. The second terminal of the first part 13 of the third driver is connected to the n second terminals G1<1; n> of the n first basic structures B1' in an electrically conductive manner.

FIG. 24(e) shows a simplified layout representation of the first self-similar structure B2'. In this case, the first self-similar structure B2' comprises four basic structures B1' and the first part 12 of the third driver. By positioning parts of the first driver adjacent to each other, another part of the first driver or the entire first driver is formed. By positioning parts of the first field effect transistor adjacent to each other, another part of the first field effect transistor or the entire first field effect transistor is formed.

The extension to larger self-similar structures on the basis of the first self-similar structure B2' and its smallest self-similar unit, the first basis structure B1', can be continued indefinitely.

With further simplification of the layout representation, the self-similarity of the structure and the subdivision of the drivers and transistors into different blocks becomes even clearer.

FIG. 25(a) shows, on the left, a simplified layout of a basic structure of the self-similar structure according to the disclosure as a stick layout. FIG. 25(b) shows how to combine further basic structures, so that eventually the self-similar structure according to the disclosure is obtained.

In FIG. 25, driver parts are shown as black dots for simplicity. A driver part in the sense of this disclosure refers to a part of a driver that is functional by itself. Therefore, a driver can be divided into a plurality of driver parts, which are possibly spatially separated from one another, said parts, due to their arrangement in the self-similar structure according to the disclosure, together providing the same functionality as a driver that is not spatially divided. In this description, the terms "driver part" and "part of a driver" are used synonymously.

Parts of field effect transistors are illustrated in a simplified manner in FIG. 25(b) as rectangular dotted areas F1, F2, F3, F4. A field effect transistor part in the sense of this disclosure refers to a part of a field effect transistor that is functional by itself. Therefore, a field effect transistor can be divided into a plurality of field effect transistor parts, which are possibly spatially separated from one another, said parts, due to their arrangement in the self-similar structure according to the disclosure, together providing the same functionality as a field effect transistor that is not spatially divided. In this description, the terms "field effect transistor part" and "part of a field effect transistor" are used synonymously.

First, the basic structure illustrated in FIG. 25(a) will be described. A first driver part T1 is connected in an electrically conductive manner to a second line L2 via a first line L1. The first line L1 and the second line L2 run at right angles with respect to each other. The junction of the first line L1 and the second line L2 is located in the center of the extension of the second line L2. The second line L2 connects a second driver part T2 and a third driver part T3 in an electrically conductive manner. The second driver part T2 and the third driver part T3 are arranged symmetrically to the junction of the first line L1 and the second line L2.

The first driver part T1 is connected in an electrically conductive manner to a fourth line L4 via a third line L3. In this example, the third line L3 and the fourth line L4 extend at right angles with respect to each other. The junction of the third line L3 and the fourth line L4 is located in the center of the extension of the fourth line L4. The fourth line L4 connects a fourth driver part T4 and a fifth driver part T5 in an electrically conductive manner. The fourth driver part T4 and the fifth driver part T5 are arranged symmetrically to the junction of the third line L3 and the fourth line L4.

Thus, the first driver part T1 is located at the center of an imaginary rectangle, at the corners of which the second driver part T2 and the third driver part T3 and the fourth driver part T4 and the fifth driver part T5 are placed.

The basic structure described can be continued as described below, whereby ever more of such basic structures are formed. This will be explained with reference to FIG. 25(b). Here, the fifth driver part T5 of the basic structure described is located at the geometrical center of a further basic structure. The fifth driver part T5 is connected in an electrically conductive manner to a sixth line L6 via a fifth line L5. The fifth line L5 and the sixth line L6 are arranged at right angles with respect to each other. The junction of the fifth line L5 and the sixth line L6 is located at the center of the sixth line L6. The sixth line L6 connects a sixth driver part T6 and a seventh driver part T7 in an electrically conductive manner. The sixth driver part T6 and the seventh driver part T7 are arranged symmetrically to the junction of the fifth line L5 and the sixth line L6.

The fifth driver part T5 is connected in an electrically conductive manner to an eighth line L8 via a seventh line L7. The seventh line L7 and the eighth line L8 are arranged at right angles with respect to each other. The junction of the seventh line L7 and the eighth line L8 is located at the center of the eighth line L8. The eighth line L8 connects an eighth driver part T8 and a ninth driver part T9 in an electrically conductive manner. The eighth driver part T8 and the ninth driver part T9 are arranged symmetrically to the junction of the seventh line L7 and the eighth line L8.

Thus, in this new basic structure, the fifth driver part T5 is now located at the center of a rectangle at the corners of which the sixth driver part T6 and the seventh driver part T7 and the eighth driver part T8 and the ninth driver part T9 are placed. Similarly, any other driver part located at a corner of such a rectangle can also be the center of a further basic structure. The first driver part T1 could also be located on the corner such a rectangle of a further basic structure which is not illustrated.

Further, each driver part located on the corner of such a rectangle, i.e., in the example illustrated, the second driver part T2 or the third driver part T3 or the fourth driver part T4 or the fifth driver part T5 or the sixth driver part T6 or the seventh driver part T7 or the eighth driver part T8 or the ninth driver part T9, can be connected to four field effect transistors in an electrically conductive manner.

In FIG. 25(b), this is shown with reference to the second driver part T2. The second driver part T2 is connected in an electrically conductive manner to a first field effect transistor part F1 and to a second field effect transistor part F2 and to a third field effect transistor part T3 and to a fourth field effect transistor part F4. Here, the first field effect transistor part F1 lies above the third field effect transistor part F3 and to the left of the second field effect transistor part F2. The fourth field effect transistor part F4 lies below the second field effect transistor part F2 and to the right of the third field effect transistor part F3. The second driver part T2 is thus located at the center of the rectangle formed by the four field effect transistor parts F1, F2, F3, F4.

As a common functional unit, the four field effect transistor parts F1, F2, F3, F4 together form a field effect transistor. In order to avoid the extension of a field effect transistor with a low drain-source resistance over large areas, the field effect transistor was correspondingly divided into four field effect transistors F1, F2, F3, F4. Analogously, the drivers are divided into the driver parts described.

FIG. 26 is a simplified illustration of the self-similarity of the circuit layout underlying the disclosure. In a simplified manner, driver parts are illustrated as black dots. Parts of field effect transistors are illustrated in a simplified manner as rectangular dotted areas. FIG. 26 now illustrates a more extensive combination of the basic structures described in FIG. 25 into a larger self-similar structure. According to the principle described in FIG. 25, such a basic structure could be added to each diver part and the illustrated self-similar structure could be continued indefinitely. Here, the field effect transistor parts are drawn in a n exemplary manner for some basic structures only and could also be added to other basic structures.

FIG. 26 shows a top plan view on a layout of the self-similar structure according to the disclosure. It can be seen that only one metallization layer is needed, since all electrically conductive connections lie in the same plane. A signal is supplied at a first signal terminal DP. The first signal terminal DP is preferably connected to a driver part in an electrically conductive manner, which is located at the geometrical center of the self-similar structure. Thereby, the balanced signal wiring resulting from the symmetry of the basic structure or the self-similar structure is used.

Such a self-similar structure of a driver circuit, in which the driver and transistors are divided in an interleaved manner, allows, at least in some examples, for an increase in the maximum achievable switching speed compared to circuits with discrete components and compared to integrated circuits with non-interleaved and/or drivers not structured in a self-similar manner. Therefore, the self-similar structure of a driver circuit can be used in all applications that profit from short switching times at high currents. The interleaved drivers and pre-drivers can be made on one die during the CMOS process, which allows for monolithic driver ICs with additional CMOS-typical functions (digital configuration, integrated pulse shaping and diagnostic circuits). Compared to a Coarchitect with separate driver and pre-driver blocks, the interleaved architecture according to the invention can be scaled better, achieving faster rise times and more compact system solutions than with discrete structures.

However, the advantages are not limited to that. In particular, the above-described driver circuit is not limited to an application for the pulsed operation of a light-emitting or laser diode or to the application of such a pulsed operation in a LIDAR device. The pulsed operation of the transistor can also be used in a switching power supply, a DC-DC converter and everywhere, where generating steep rising edges is required.

The driver circuit was explained above using terms such as "driver part" and "field effect transistor part". These terms should be considered equivalent to individual driver circuit (as driver part) and individual transistor (as field effect transistor part). In FIG. 26, GSA denotes the overall control terminal of the transistor $T_{dis}$. This overall control terminal has an overall control terminal area GF which is regularly subdivided into a plurality of individual control terminal areas GFE for individual transistors (not illustrated) of the transistor $T_{dis}$. The four outputs of an individual driver circuit T1 to T9 are assigned to each of four of these individual control terminal areas or four individual control terminals ESA (see, for example, the individual driver circuit T2 and T9 in FIG. 26 whose outputs are connected to the four individual transistors corresponding to F1 to F4).

In FIG. 25(a), the penultimate stage of the driver circuit is shown, for example. FIG. 25(b) shows the last stage of the driver circuit, i.e., only for the driver circuit structure starting from T5, which, for example, corresponds to the lower right corner region of FIG. 26.

As can be seen in particular from FIG. 26, the driver circuit illustrated there comprises four stages, with the circular dot connected to the terminal DP representing the individual driver circuit of the first stage and the individual driver circuits corresponding to the circular dots T6, T7, T8 and T9 (see also FIG. 25) representing the individual driver circuits of the last stage. The H-shaped structures in the example in FIGS. 25 and 26 become smaller from stage to stage. The advantage of this regular arrangement of self-similar structures is that the signal paths, starting from the terminal DP to the individual driver circuits of the fourth stage, are always the same length and are also always configured the same or similarly in terms of circuitry. This is illustrated in FIG. 26 by two broken lines leading from the terminal DP to different individual driver circuits of the fourth stage.

Due to the particular design of the interleaving of the individual driver stages of the driver circuit, it is possible to provide the driver circuit implemented in digital circuit technology with a plurality of digital outputs which are now evenly distributed over the comparatively large electrode of the power transistor implemented in analog circuit technology and at which digital output signals are simultaneously outputted when a signal is applied to the input of the driver circuit. Each digital output signal now "supplies" one control terminal individual surface of an individual transistor, whereby all individual transistors now switch simultaneously, and the overall transistor quickly and effectively generates a current pulse that is highly energetic and causes the laser to generate a strong light pulse.

The disclosure comprises at least one or several of the feature groups below or one or several of the features of one or a plurality of the feature groups below:

Feature 1. A laser module with
    a linear laser array of n lasers,
    a linear capacitor array of n capacitors,
    a driver circuit,
    n charging circuits,
    wherein n is a positive integer greater than 2, and
    wherein a capacitor of the capacitor array has a first terminal and a second terminal, and
    wherein a charging circuit of the n charging circuits can selectively charge a respective capacitor of the n capacitors, hereinafter referred to as the capacitor associated with this charging circuit, via a charging line inductance associated with this charging circuit and to this capacitor, and the first terminal of this capacitor, and
    wherein each capacitor of the n capacitors is associated with a respective one of the n lasers as the laser associated with this capacitor, and
    wherein the driver switch discharges the capacitor of the n capacitors that is charged via the laser associated with this capacitor and a discharging inductance arranged between the laser and the first terminal of this capacitor and associated with this capacitor and this laser, wherein this associated laser then emits a laser pulse only when the capacitor associated therewith was charged, and the driver switch connects the laser to a reference potential, and wherein the value of the charging line inductance associated with a capacitor is higher than the value of the discharging line inductance associated with this capacitor, and wherein the value of the inductance between the laser and the driver switch and the value of the inductance between the driver switch and the reference potential is smaller than the value of the charging line inductance and smaller than the value of the discharging line inductance.

Feature 2. The laser module according to feature 1, with an integrated circuit,
wherein the cathodes of the n lasers of the linear laser array of n lasers are interconnected without bonding wires to form a star point, and
wherein the driver switch is a part of the integrated circuit, and
wherein the driver switch is connected to the star point without bonding wires.

Feature 3. The laser module according to one or a plurality of the preceding features,
with an integrated circuitry in a monolithic crystal having an active surface,
wherein the n charging circuits are a part of the active surface of the integrated circuit, and
wherein, parallel to the linear laser array of n lasers, the linear capacitor array of n capacitors is mounted on the active surface of the monolithic crystal of the integrated circuit,
wherein the first terminal of the capacitor of the linear capacitor array is connected to the anode of the laser of the linear laser array associated with this capacitor by a multiple bonding with a first bonding wire length, and
wherein the second terminals of the n capacitors of the capacitor array are interconnected to form a second star point, and
wherein the second star point is connected, via a plurality of bonding wires having a second bonding wire length, to a reference potential contact on the upper side of the crystal of the integrated circuit, and
wherein the first terminal of the capacitor is connected to the charging circuit associated with this capacitor by a bonding wire with a third bonding wire length intersecting the second star point, and
wherein the third bonding wire length is longer than the second bonding wire length, and
wherein the second bonding wire length is longer than the first bonding wire length.

Feature 4. A LIDAR system with
a linear laser array of n lasers,
a linear photo detector array of m photo detectors, and
a driver circuit for the n lasers, and
a receiver circuit for the m photo detectors, and
an evaluation circuit for the measuring signals of the m receiver circuits, and
a Powell lens, or a functionally equivalent optical system, which hereinafter is encompassed by the term Powell lens,
a second optical system, hereinafter referred to as a receiver lens, wherein, when energized by electric current, each laser emits a laser beam, and
wherein the Powell lens expands such a laser beam into a light fan with a light fan plane and a fan origin, and
wherein the n lasers generate n laser beams whose n light fans are tilted perpendicular to their respective fan plane about a substantially common fan origin,
wherein the receiver lens deforms the receiving lobes of the m photo detectors into m receiver fans, each having a receiver fan plane, and
wherein each receiver fan plane of the receiver fan planes is non-parallel to the laser fan plane, and
wherein in particular each receiver fan plane of the receiver fan planes is perpendicular to the laser fan surface,
wherein, at an emission time, the driver circuit causes one of the n lasers to emit a laser light pulse, and
wherein the m photo detectors and their respective receiver circuit sense the respective reflected light of this respective laser pulse and the respective receiving time within their respective receiver fan, and
wherein the respective receiver circuit transmits the respective measured value for the receiving time of the respective laser pulse at the respective photo diode to the evaluation circuit, and
wherein the evaluation circuit forms a three-dimensional pixel cloud from the angle of the laser fan of the respective laser pulse and the angle of the respective receiver fan of the respective photo detector and the respective receiving time of the respective laser pulse at the respective photo detector relative to the respective time of emission.

Feature 5. The LIDAR system according to the preceding feature,
wherein the n surface normals of the n light fans have angular distances ($a_{1,2}$, $a_{2,3}$, $a_{3,4}$, bis $a_{n-2,n-1}$, $a_{n-1,n}$) that are substantially the same between two respective adjacent light fans.

Feature 6. The LIDAR system according to one or more of the two preceding features, comprising a laser module according to one or more of features 1 to 3.

Feature 7. A driver circuit, wherein
the drivers I0, I1, I2 and transistors M0, T1 bis T9 are divided into blocks B0', B1', B2', and
the interconnection of the individual blocks B0', B1', B2' is a self-similar structure.

Feature 8. A driver circuit, wherein
the drivers I0, I1, I2 and transistors M0, T1 bis T9 are divided into blocks B0', B1', B2', and
the interconnection of the individual blocks B0', B1', B2' is a self-similar structure at circuit level.

Feature 9. A driver circuit, wherein
the drivers I0, I1, I2 and transistors M0, T1 bis T9 are divided into blocks B0', B1', B2', and
the interconnection of the individual blocks B0', B1', B2' is a self-similar structure at layout level.

Feature 10. A driver circuit comprising
a first driver part T1 and
a second driver part T2 and
a third driver part T3 and
a fourth driver part T4 and
a fifth driver part T5 and
a first line L1 and
a second line L2 and
a third line L3 and
a fourth line L4, and wherein the first driver part T1 is connected to the second line L2 in an electrically conductive manner via the first line L1, and wherein the first line L1 and the second line L2 are rectangular to each other, and wherein the junction of the first line L1 and the second line L2 is located on the center of the extension of the second line L2, and wherein the second line L2 connects a second driver part T2 and a third driver part T3 in an electrically conductive manner, and wherein the second driver part T2 and the third driver part T3 are arranged symmetrically to the junction of the first line L1 and the second line L2, and wherein the first driver part T1 is connected to the fourth line L4 in an electrically conductive manner via the third line L3, and wherein the third line L3 and the fourth line L4 are rectangular to each other, and wherein the junction of the third line L3 and the fourth line L4 is located in the center of the extension of the fourth line L4, and wherein the fourth line L4 connects the fourth driver part T4 and the fifth driver part T5 in an electrically conductive manner, and wherein the fourth driver part T4 and the fifth driver part T5 are arranged symmetrically to the junction of the third line L3 and the fourth line L4, and wherein each driver part T1, T2, T3, T4, T5 can be connected to transistor parts in an electrically conductive manner, and wherein each driver part T1, T2, T3, T4, T5 can simultaneously also be a part of a further, identically designed driver circuit, so that the combination of these driver circuits is a self-similar structure.

Feature 11. A LIDAR system comprising at least one driver circuit according to one or more of features 1 to 4 for driving at least one laser diode or light-emitting diode LD.

Feature 12. An integrated electric circuit comprising
Drivers I0, I1, I2 and
Transistors N0, T1 to T9, wherein the drivers I0, I1, I2 and transistors N0, T1 bis T9 are divided into individual interconnected blocks B0', B1', B2', and the interconnection of the individual blocks B0', B1', B2' forms a self-similar structure.

Feature 13. The integrated electric circuit according to feature 12, wherein the interconnection of the individual blocks B0', B1', B2' forms a self-similar structure at circuit level.

Feature 14. The integrated electric circuit according to feature 12, wherein the interconnection of the individual blocks B0', B1', B2' forms a self-similar structure at layout level.

Feature 15. The integrated electric circuit according to one of features 12 to 14, wherein the self-similar structure comprises a first driver part T1 with an input and an output, a second driver part T2 with an input and an output, a third driver part T3 with an input and an output, a fourth driver part T4 with an input and an output, as well as a fifth driver part T5 with an input and an output and a straight first line L1 extending from the first driver part T1, straight second line L2 extending at right angles to the first line L1, a straight third line L3 extending from the output of the first driver part T1 in a direction opposite the direction of extension of the first line L1, and a straight fourth line L4 extending at right angles to the third line L3 and thus parallel to the second line L2, wherein the first line L1 is connected to the second line L2 and their junction is located at the center of the extension of the second line L2, wherein the second line L2 connects the inputs of the second driver part T2 and the third driver part T3, whereby the second driver part T2 and the third driver part T3 are arranged symmetrically to the junction of the first line L1 and the second line L2, wherein the third line L3 is connected to the fourth line L4 and their junction is located at the center of the extension of the fourth line L4, wherein the fourth line L4 connects the inputs of the fourth driver part T4 and the fifth driver part T5, whereby the fourth driver part T4 and the fifth driver part T5 are arranged symmetrically to the junction of the third line L3 and the fourth line L4, and wherein the first driver part T1 is located at the center between the junction of the first line L1 with the second line L2 and the junction of the third line L3 with the fourth line L4.

Feature 16. The integrated electric circuit according to feature 15, wherein the first line L1 is formed as two first line sections extending parallel to each other, from which two second line sections extend in mutually opposite directions, wherein the one first line section and the one second line section connect the output of the first driver part T1 to the input of the second driver part T2 and the other first line section and the other second line section connect the output of the first driver part T1 to the input of the third driver part T3, and the third line is formed as two third line sections extending parallel to each other, from which two fourth line sections extend in mutually opposite directions, wherein the one third line section and the one fourth line section connect the output of the first driver part T1 to the input of the fourth driver part T4 and the other third line section and the other fourth line section connect the output of the first driver part T1 to the input of the fifth driver part T5.

Feature 17. The integrated electric circuit according to feature 15 or 16, wherein each of the second, third, fourth and fifth driver parts T2, T3, T4, T5 is connected to at least one transistor part M0, T1 to T9 or to a group of transistor parts M0, T1 to T9 arranged point-symmetrically with respect to said driver parts T2, T3, T4, T5.

Feature 18. The integrated electric circuit according to feature 15 or 16, wherein each of the second, third, fourth and fifth driver parts T2, T3, T4, T5 can form the first driver part of another group of five driver parts T1, T2, T3, T4, T5 and of four lines L1, L2, L3, L4, which are configured, arranged and connected according to feature 4.

Feature 19. A LIDAR system comprising
at least one diode in the form of a laser or a light-emitting diode, and
a driver circuit for the pulse-like driving of the at least one diode,
wherein the driver circuit is configured according to one or more of the preceding features.

Feature 20. A laser module comprising
a linear laser array of n lasers, where n is a positive integer,
a linear capacitor array of n capacitors with a driver switch,
n charging circuits,
wherein n is a positive integer greater than 2, and
wherein a capacitor of the capacitor array has a first terminal and a second terminal, and
wherein a charging circuit of the n charging circuits can selectively charge a respective capacitor of the n capacitors, hereinafter referred to as the capacitor associated with this charging circuit, via a charging line inductance associated with this charging circuit and to this capacitor, and the first terminal of this capacitor, and wherein each capacitor of the n capacitors is associated with a respective one of the n lasers as the laser associated with this capacitor, and wherein the driver switch discharges the capacitor of the n capacitors that is charged via the laser associated with this capacitor and a discharging inductance arranged between the laser and the first terminal of this capacitor and associated with this capacitor and this laser, wherein this associated laser then emits a laser pulse only when the capacitor associated therewith was charged, and the driver switch connects the laser to a reference potential, and wherein the value of the charging line inductance associated with a capacitor is higher than the value of the discharging line inductance associated with this capacitor, and wherein the value of the inductance between the laser and the driver switch and the value of the inductance between the driver switch and the reference potential is smaller than the value of the charging line inductance and smaller than the value of the discharging line inductance.

Feature 21. The laser module according to the preceding feature with an integrated circuit, wherein the cathodes of the n lasers of the linear laser array of n lasers are interconnected without bonding wires to form a star point, and wherein the driver switch is a part of the integrated circuit, and wherein the driver switch is connected to the star point without bonding wires.

Feature 22. The laser module according to one or a plurality of the two preceding features, with an integrated circuitry in a monolithic crystal having an active surface, wherein the n charging circuits are a part of the active surface of the integrated circuit, and wherein, parallel to the linear laser array of n lasers, the linear capacitor array of n capacitors is mounted on the active surface of the monolithic crystal of the integrated circuit, wherein the first terminal of the capacitor of the linear capacitor array is connected to the anode of the laser of the linear laser array associated with this capacitor by a multiple bonding with a first bonding wire length, and wherein the second terminals of the n capacitors of the capacitor array are interconnected to form a second star point, and wherein the second star point is connected, via a plurality of bonding wires having a second bonding wire length, to a reference potential contact on the upper side of the crystal of the integrated circuit, and wherein the first terminal of the capacitor is connected to the charging circuit associated with this capacitor by a bonding wire with a third bonding wire length intersecting the second star point, and wherein the third bonding wire length is longer than the second bonding wire length, and wherein the second bonding wire length is longer than the first bonding wire length.

Feature 23. A laser module comprising a linear laser array of n lasers, where n is a positive integer, wherein the n lasers are preferably mounted on a module carrier and/or a driver IC, and wherein each laser beam of each laser has a laser beam axis, and wherein all laser beam axes and/or at least two laser beam axes intersect at one point.

Feature 24. A combination of p laser modules, where p is a positive integer, wherein each comprises a linear laser array of n lasers, where n is a positive integer, and wherein the laser of each module can be numbered in the same way, and wherein each laser beam of each laser has a laser beam axis, and wherein the laser beam axes of the k-th lasers, where $0<k\leq n$, of all p laser modules intersect at one point and/or wherein the laser beam axes of the k-th lasers, where $0<k\leq n$, of at least two of the p laser modules intersect at one point.

Feature 25. A combination of p laser modules, where p is a positive integer, wherein each comprises a linear laser array of n lasers, where n is a positive integer, and wherein each laser beam of each laser of each laser module has a laser beam axis, and wherein all p×b laser beam axes of all p×b lasers of all p laser modules intersect at one point and/or wherein at least two laser beam axes of at least two lasers of the n×p lasers of all p laser modules intersect at one point.

Feature 26. A driver IC for a laser module according to one or more of features 20 to 23 of for a combination of laser modules according to feature 24 or 25, wherein the driver IC is rectangular in shape, and wherein the driver IC has two short sides and two long sides as its edges, and wherein, at a first edge of its rectangular shape, which is a short side, the driver IC has contacts or a contact DisC that are intended and suitable to contact one or a plurality of backside contacts of lasers, wherein, at its second edge of its rectangular shape, which is a short side, the IC has contacts DDA, GNDA, VDDD, GNDD, VDDP, GNDP, VDDH, GND that serve to supply power to the driver ICs and/or said lasers D1 to Dn and/or associated power storages C1 to Cn, and wherein the first edge is located opposite the second edge.

Feature 27. The driver IC according to feature 26, wherein, at a third edge of the driver IC, which is a long side, the driver IC has at least one transfer contact for a signal that can be transferred to other driver ICs, and wherein, at a fourth edge of the driver IC, which is a long side, the driver IC has another transfer contact that is electrically connected to the transfer contact.

Feature 28. The driver IC according to feature 27, wherein one transfer contact is a contact for a reset signal RES which transfers the driver IC to a defined state.

Feature 29. Driver IC according to feature 27, wherein one transfer contact is a contact for a trigger signal TRIG which causes the driver IC in a predefined state to fire its lasers D1 to Dn if this is provided based on the state of the system.

Feature 30. The driver IC according to feature 27,
wherein one or a plurality of transfer contacts are designated for receiving to contact signals of a data bus, and
wherein the one or the plurality of transfer contacts at the one edge of the driver IC, which is a long side, is electrically connected directly to one or a plurality of corresponding transfer contacts at the opposite edge of the driver IC, which is the opposite long side,
wherein the signals of the one or the plurality of transfer contacts at the one edge of the driver IC, which is a long side, are processed in a sub-device of the driver IC, in particular a data bus interface, prior to being transferred to one or a plurality of corresponding transfer contacts at the opposite edge of the driver IC, which is the opposite long side.

Feature 31. A combination of laser modules, in particular a LIDAR system,
with a plurality, at least two laser modules, a first laser module and a second laser module,
wherein the laser modules are rectangular in shape with two short sides and two long sides, and
wherein the laser modules are arranged adjacent to one another by their long sides, and the laser modules each comprise a driver IC according to one or a plurality of features 17 to 30, and
wherein the driver ICs of the laser modules are identical in design with regard to the used transfer contacts of their driver ICs,
wherein one respective transfer contact of the driver IC of the first laser module is electrically connected with the corresponding transfer contact of the driver IC of the second laser module by an individual bonding wire per such pair of transfer contacts.

Feature 32. A LIDAR system with
a linear laser array of n lasers, and
a linear photo detector array of m photo detectors, and
a driver circuit for the n lasers, and
a receiver circuit for the m photo detectors, and
an evaluation circuit for the measuring signals of the m receiver circuits, and
a Powell lens, or a functionally equivalent optical system, which hereinafter is encompassed by the term Powell lens,
a second optical system, hereinafter referred to as a receiver lens,
wherein, when energized by electric current, each laser emits a laser beam, and
wherein the Powell lens expands such a laser beam into a light fan with a light fan plane and a fan origin, and
wherein the n lasers generate n laser beams whose n light fans are tilted perpendicular to their respective fan plane about a substantially common fan origin,
wherein the receiver lens deforms the receiving lobes of the m photo detectors into m receiver fans, each having a receiver fan plane, and
wherein each receiver fan plane of the receiver fan planes is non-parallel to the laser fan plane, and
wherein in particular each receiver fan plane of the receiver fan planes is perpendicular to the laser fan surface,
wherein, at an emission time, the driver circuit causes one of the n lasers to emit a laser light pulse, and
wherein the m photo detectors and their respective receiver circuit sense the respective reflected light of this respective laser pulse and the respective receiving time within their respective receiver fan, and
wherein the respective receiver circuit transmits the respective measured value for the receiving time of the respective laser pulse at the respective photo diode to the evaluation circuit, and
wherein the evaluation circuit forms a three-dimensional pixel cloud from the angle of the laser fan of the respective laser pulse and the angle of the respective receiver fan of the respective photo detector and the respective receiving time of the respective laser pulse at the respective photo detector relative to the respective time of emission.

Feature 33. The LIDAR system according to the preceding feature, wherein the n surface normals of the n light fans have angular distances $a_{1,2}$, $a_{2,3}$, $a_{3,4}$, to $a_{n-2,n-1}$, $a_{n-1,n}$ that are substantially the same between two respective adjacent light fans.

Feature 34. The LIDAR system of one or more of the two preceding features
comprising a laser module according to one or more of features 20 to 23 and/or comprising a combination of laser modules according to feature 24 and/or 25 and/or 31 and/or comprising a driver IC according to one or more of features 26 to 30.

Feature 35. A capacitor array for a laser module in particular according to one or more of features 20 to 23 and/or for a combination of laser modules according to feature 24 and/or 25 and/or 31 and/or for use together with a driver IC according to one or more of features 26 to 30.
wherein the capacitor array is rectangular, and
wherein the capacitor array has an upper side and a lower side, and
wherein the capacitor array has n contacts K1' to Kn' arranged sequentially along a first edge of the rectangle on the upper side of the capacitor array, and
wherein the capacitor array has a further contact KG' that extends along a second edge of the rectangle on the upper side of the capacitor array, and
wherein the second side of the rectangle is located opposite the first side of the rectangle, and
wherein the extension of the further contact KG' along the third and the fourth side is shorter than the extension of the contact of the n contacts K1' to Kn', which is closest to the third edge of the rectangle, along the third edge of the rectangle, and
wherein the extension of the further contact KG' along the third and the fourth side is shorter than the extension of the contact of the n contacts K1' to Kn', which is closest to the fourth edge of the rectangle, along the fourth edge of the rectangle, and
wherein the capacitor array has a backside contact KR that covers the lower side of the capacitor array, and
wherein each of the n contacts K1' to Kn' forms a capacitance C1 to Cn together with the backside contact KR, and
wherein the further contact KG' forms another capacitance CVDD together with the backside contact KR, and wherein the capacitors Ca to Cn and CVDD comprise a common dielectric that extends between the n contacts K1' to Kn' and the further KG' on the one hand and the backside contact KR on the other hand.

Feature 36. Use of
a laser module according to one or more of features 20 to 23 and/or
a combination of laser modules according to one or more of features 24 and/or 25 and/or 31 and/or
a driver IC according to one or more of features 26 to 30 and/or a LIDAR system according to one or more of features 32 to 34 and/or a capacitor array according to feature 35 in a mobile device, wherein the mobile device may be in particular a robot or a missile or a space missile or a hull or a watercraft or a vehicle or a rail vehicle or a plane or a spacecraft.

Feature 37. Use of a laser module according to one or more of features 20 to 23 and/or a combination of laser modules according to one or more of features 24 and/or 25 and/or 31 and/or a driver IC according to one or more of features 26 to 30 and/or a LIDAR system according to one or more of features 32 to 34 and/or a capacitor array according to feature 35 in a device for detecting the shape of an object or a building, or in a device for the automation of processes, or in a device for the three-dimensional detection of the shape of three-dimensional bodies.

Feature 38. A lens for use in a LIDAR system.

wherein the LIDAR system comprises a laser module, and wherein the laser module comprises a linear laser array of n lasers, where n is a positive integer greater than 1, and wherein each of the n lasers can emit a laser beam with an ellipsoidal or circular intensity cross section, and wherein each of the laser beams has a laser beam axis, and wherein the laser beam axes substantially lie on o common laser beam axis plane with an optical axis, and wherein the lens expands each of the laser beams in a direction perpendicular to the laser beam axis plane, so that, for each of the n laser beams, a light fan is obtained on a light fan plane perpendicular to the light beam axis plane, and wherein the LIDAR system comprises a photo detector array and imaging optics, and wherein the photodetector array has n photo detector lines with m photo detector pixels, where m is a positive integer, and wherein the imaging optics image the projection of the laser beam fans in the far field onto an ideally homogeneously white and/or substantially ideally diffusely uniformly and homogeneously reflecting projection plane perpendicular to the optical axis in the form of a projection image of the laser beam fans onto the n photo detector lines as an image of the laser beam fans, and wherein the lens is formed such that, with given imaging optics, the value of the illumination intensity of an associated first section of the image of the projection of a first laser beam fan onto a first optional photo detector pixel of the photo detector array differs by no more than 10% and/or by no more than 5% and/or by no more than 2% from the value of the illumination intensity of an associated second section of the image of the projection of a second laser beam fan onto a second optional photo detector pixel of the photo detector array of the photo sensor, wherein the first section differs from the first section, and wherein the first laser beam fan can be different from the first laser beam fan, but does not have to be, and wherein the first photo pixel is different from the second photo pixel, and wherein the lens has a first surface and a second surface opposite thereto, and wherein the first surface is described by a function of the form of $$Z = RY + AR2 \cdot x^2 + AR3 \cdot |x^3| - \text{Sign}(RY) \cdot \text{Sqrt}(RY2 - y^2) + PB2 \cdot x^2 + PB3 \cdot |x^3| + PB4 \cdot x4 + PB6 \cdot x6 + PC2 \cdot x^2 + PC3 \cdot |x^3|$$

where $RY = R0Y + AR2 \cdot x2 + AR3 \cdot |x3|$, and wherein the second surface is described by a function of the form of $$z = -(d + PC2 \cdot x^2 + PC3 \cdot |x^3|),$$ and wherein the parameters PB2 and PB3 are different from zero, and wherein at least two of the parameters AR2 and/or AR3 and/or PB4 and/or PB6 and/or PC2 and/or PC3 are different from zero.

Feature 39. The lens according to feature 38, wherein the parameters AR2 and AR3 are different from zero, and wherein at least two of the parameters PB4 and/or PB6 and/or PC2 and/or PC3 are different from zero.

Feature 40. The lens according to feature 39, wherein the parameters PB4 and PB6 are different from zero, and wherein at least two of the parameters PC2 and/or PC3 are different from zero.

Feature 41. The lens according to feature 40, wherein the parameters PC2 and PC3 are different from zero.

Glossary

Powell Lenses

Powell lenses serve to generate a linear beam profile from an ellipsoidal or an oval Gaussian beam (i.e., with a Gaussian intensity distribution). Along the line, a homogeneous intensity distribution is preferably generated, while perpendicular thereto, the Gaussian distribution of the laser is maintained. Line optics can be fabricated with an opening angle of a few degrees to over 90°.

However, the Powel function is merely a secondary object of these lenses in the context of the technical teaching described herein. The primary object is the focusing of all laser beams in the vertical direction. Optics that fulfill that function are already denoted as a Powell lens in the sense of this document and are encompassed by the claims. The focusing of all laser beams in the vertical direction is achieved, for example, by the other side of the lenses illustrated e.g., in FIGS. 14 and 19 to 22. Thus, the Powell function is not ultimately necessary, since a Gaussian distribution in the horizontal direction would be acceptable for the purpose described herein. In such a case, the device would have a greater measuring range in the forward direction than in the lateral direction, which may actually be desired depending on the application. It is possible to integrate both functions in one surface. In this case, the other side of such a lens is flat. This lens would also be encompassed by the claims. Such a lens in the sense of the disclosure is thus characterized by vertical focusing. Consequently, instead of a Powell lens, one could also refer to such a lens as a "scanning lens" which, of course, is also encompassed by the disclosure.

LIST OF REFERENCE SYMBOLS

A1 first axis

A2 second axis

AF terminal area of the charging circuit

B0' first structure

B1 first charging structure for the first capacitor C1 which supplies electrical energy to the first laser D1 for generating a light pulse B1' first basic structure
B2 second charging structure for the second capacitor C2 which supplies electrical energy to the second laser D2 for generating a light pulse
B2' first self-similar structure
B3 third charging structure for the third capacitor C3 which supplies electrical energy to the third laser D3 for generating a light pulse
BD1 first bonding wire
BD2 second bonding wire
BD3 third bonding wire
Bn n-th charging circuit for the n-th capacitor Cn which, if applicable, supplies electrical energy to the n-th laser Dn in case of the generation of a light pulse
Buf driver that boosts the pulse pre-signal PL into the pulse signal $G_{dis}$
C1 first capacitor as energy reserve for the first laser D1
C2 second capacitor as energy reserve for the second laser D2
C3 third capacitor as energy reserve for the third laser D3
Cn n-th capacitor as energy reserve for the n-th laser Dn
CS select signal
CTR control circuit controlling the n charging circuits B1 to Bn and generating the pulse pre-signal PL The control circuit causes one of the n charging circuits to typically charge one of the n capacitors prior to the generation of a light pulse by one of the n lasers, then preferably switches off all charging circuits or preferably switches the charging outputs of preferably all charging circuits to high impedance and then closes the driver switch $T_{dis}$, whereby the light pulse generation is initiated. The control circuit repeats this process until all n lasers have emitted a light pulse preferably exactly once and then starts the next iteration from the beginning.
CVDD backup capacitor for stabilizing the operating voltage VDD
D1 first laser
DID laser diode die
D2 second laser
D3 third laser
D4 fourth laser
DAF1 first terminal area of a laser diode die
DAF2 second terminal area of a laser diode die
DisC first star point and contact surface for the first star point Preferably, the cathodes of the lasers D1 to Dn are connected to the first star point. The first star point is connected with the reference potential GND via the driver switch $T_{dis}$ when the pulse signal $G_{dis}$ arrives. If one of the capacitors C1 to Cn was charged before, this capacitor is then discharged via the corresponding laser which then emits a light pulse.
DisK second star point as a common connection point of the capacitors C1 to Cn
Dn n-th laser
DP first signal terminal
DR drone
EL receiver lens
ESA individual control terminal of an individual transistor
F1 first field effect transistor
F2 second field effect transistor
F3 third field effect transistor
F4 fourth field effect transistor
G0 second terminal of the first structure B0'
G1 second terminal of the first basic structure B1'
G0<1; n>n second terminals of the n structures B0'
G0<1; n>n second terminals of the n first basic structures B1'
$G_{dis}$ pulse signal
GF overall surface of the control terminal
GFE individual surface of the control terminal
GND contact surface for reference potential, reference potential
GNDA analog reference potential
GNDD digital reference potential
GNDH reference potential for the high supply potential
GNDP reference potential of the interfaces
GND0 third terminal of the first structure B0'
GND1 third terminal of the first structure B1'
GND2 third terminal of the first self-similar structure B2'
GND0<1; n>n third terminals of the n structures B0'
GND0<1; n>n third terminals of the n first basic structures B1'
GSA overall control terminal of the transistor
$GT_{dis}$ control terminal of the transistor
HV first reference potential
I driver circuit
I0 first part of the first driver
I1 first part of the second driver
I2 first part of the third driver
L1 first line
L2 second line
L3 third line
L4 fourth line
L5 fifth line
L6 sixth line
L7 seventh line
L8 eighth line
LD laser diode
M field effect transistor
M0 first part of the first field effect transistor
K1 first charging line via which the first charging circuit B1 charges the first capacitor C1 prior to a generation of a light pulse by the first laser D1
K1' first discharging line via which the first laser D1 discharges the first capacitor C1 if the driver switch $T_{dis}$ is closed by the pulse signal $G_{dis}$
K2 second charging line via which the second charging circuit B2 charges the second capacitor C2 prior to a generation of a light pulse by the second laser D2
K2' second discharging line via which the second laser D2 discharges the second capacitor C2 if the driver switch $T_{dis}$ is closed by the pulse signal $G_{dis}$
K3 third charging line via which the third charging circuit B3 charges the third capacitor C3 prior to a generation of a light pulse by the third laser D3
K3' third discharging line via which the third laser D3 discharges the third capacitor C3 if the driver switch $T_{dis}$ is closed by the pulse signal $G_{dis}$
KA capacitor array
KG' virtual node of the supply voltage VDD
KL optional curved line along which the laser modules and/or their lasers are aligned
Kn n-th charging line via which the n-th charging circuit Bn of charges the b-th capacitor Cn prior to a generation of a light pulse by the n-th laser Dn
Kn' n-th discharging line via which the n-th laser Dn discharges the n-th capacitor Cn if the driver switch $T_{dis}$ is closed by the pulse signal $G_{dis}$
KR lower side contact of the capacitor array
L LIDAR system
LAF1 first terminal area of the charge storage component LAF2 second terminal area of the charge storage component LC1 inductance of the line by which the second contact of the first capacitor C1 is connected to the reference potential LC2 inductance of the line by which the second contact of the second capacitor C2 is connected to the reference potential LC3 inductance of the line by which the second contact of the third capacitor C3 is connected to the reference potential LCn inductance of the line by which the second contact of the n-th capacitor Cn is connected to the reference potential LCV line inductance between the second terminal of the backup transistor CVDD and the reference potential GND LF1 first light fan of the first Laser D1

LF2 second laser fan of the second laser D2

LF3 third laser fan of the third laser D3

LF4 fourth laser fan of the fourth laser D4

LDZ laser diode line

LPF conduction path of the transistor

LPF1 first end portion of the conduction path

LPF2 second end portion of the conduction path

LSBT charge storage part

LZ1 inductance of the first charging line K1 via which the first charging circuit B1 charges the first capacitor C1 prior to a generation of a light pulse by the first laser D1

LZ2 inductance of the second charging line K2 via which the second charging circuit B2 charges the second capacitor C2 prior to a generation of a light pulse by the second laser D2

LZ3 inductance of the third charging line K3 via which the third charging circuit B3 charges the third capacitor C3 prior to a generation of a light pulse by the third laser D3

LZn inductance of the n-th charging line via which the n-th charging circuit Bn of charges the n-th capacitor Cn prior to a generation of a light pulse by the n-th laser Dn LZV line inductance of the supply line to the backup capacitor CVDD ME center plane of the lens MOSI input of the SPI data bus MISO output of the SPI data bus OF1 first lens surface OF2 second lens surface PL Powell lens Pulse exemplary signal supplied to all modules R1 exemplary first local radius vector for the curvature of the first surface OF1 about an exemplary first axis A1

R2 exemplary second local radius vector for the curvature of the second surface OF2 about an exemplary second axis A2

PL pulse pre-signal

RC1 resistance of the line by which the second contact of the first capacitor C1 is connected to the reference potential RC2 resistance of the line by which the second contact of the second capacitor C2 is connected to the reference potential RC3 resistance of the line by which the second contact of the third capacitor C3 is connected to the reference potential RCn resistance of the line by which the second contact of the n-th capacitor Cn is connected to the reference potential RCV line resistance between the second terminal of the backup transistor CVDD and the reference potential GND RST reset signal RZ1 resistance of the first charging line K1 via which the first charging circuit B1 charges the first capacitor C1 prior to a generation of a light pulse by the first laser D1

RZ2 resistance of the second charging line K2 via which the second charging circuit B2 charges the second capacitor C2 prior to a generation of a light pulse by the second laser D2

RZ3 resistance of the third charging line K3 via which the third charging circuit B3 charges the third capacitor C3 prior to a generation of a light pulse by the third laser D3

RZV line inductance of the supply line to the backup capacitor CVDD

Rzn resistance of the n-th charging line via which the n-th charging circuit Bn of charges the n-th capacitor Cn prior to a generation of a light pulse by the n-th laser Dn S photo sensor S0 first terminal of the first structure B0'

S1 first terminal of the first structure B1'

S2 first terminal of the first self-similar structure B2'

S0<1; n>n first terminals of the n structures B0'

S1<1; n>n first terminals of the n first basic structures B1'

SCK clock signal of the SPI data bus

SL emitter lens

SLE emitter optical element

TAF1 first conduction path terminal area

TAF2 second conduction path terminal area $T_{dis}$ driver switch, preferably designed as a transistor TR carrier TRIG terminal for the ignition signal TRO upper side of the carrier T1 first driver part T2 second driver part T3 third driver part T4 fourth driver part T5 fifth driver part T6 sixth driver part T7 seventh driver part T8 eighth driver part T9 ninth driver part VDD supply voltage and contact surface for supply voltage VDDA analog supply voltage VDDD digital supply voltage VDDH high supply voltage VDDP supply voltage of the interfaces ZL cylindrical lens

LIST OF DOCUMENTS

DE-A-195 14 062
DE-C-195 46 563
DE-A-199 14 362
DE-B-10 2006 036 167
DE-A-10 2008 021 588
DE-A-10 2008 062 544
DE-A-10 2009 060 873
DE-A-10 2014 105 482
DE-A-10 2016 116 368
DE-A-10 2016 116 369

DE-A-10 2016 116 875
DE-A-10 2017 100 879
DE-A-10 2017 121 713
DE-A-10 2018 106 860
DE-A-10 2018 106 861
EP-A-2 002 519
EP-A-3 301 473
EP-A-3 660 574
US-A-2018/0045882
US-A-2020/0264426
U.S. Pat. No. 6,697,402
U.S. Pat. No. 9,115,146
U.S. Pat. No. 9,185,762
U.S. Pat. No. 9,368,936
U.S. Pat. No. 10,193,304
WO-A-2008/035983
WO-A-2018/154139

The invention claimed is:

1. A light module comprising:
a carrier provided with an upper side, in which a circuit die with integrated circuits is arranged,
the circuit die having an upper side,
a transistor, in particular a power transistor, formed in the upper side of the circuit die,
the transistor having a conduction path which can be switched to a conducting or blocking state, said path having a first end portion and a second end portion, of which the first end portion is electrically connected with a first conduction path terminal area and the second end portion is electrically connected with a second conduction path terminal area, which are both exposed at the upper side of the carrier, and the transistor comprising a control terminal for switching the conduction path to a conducting state or blocking state,
a light-emitting diode die comprising a light-emitting diode or a laser diode, with a lower side comprising a first terminal area and an upper side comprising a second terminal area,
the light-emitting diode die being arranged with its first terminal area located on the first conduction path terminal area of the transistor ($T_{dis}$) and these two terminal areas being electrically connected with one another,
a charge storage component comprising a charge storage, the charge storage component comprising a lower side having a first terminal area and an upper side having a second terminal area,
the charge storage component being arranged with its first terminal area located on the second conduction path terminal area of the transistor and these two terminal areas being electrically connected with one another,
at least one first bonding wire which electrically connects the second terminal area of the light-emitting diode die with the second terminal area of the charge storage component,
a charging circuit for charging the charge storage component with electric charge, the charging circuit being integrated in the circuit die and having an output, and
a control circuit for driving the transistor and the charging circuit, the control circuit being integrated in the circuit die,
the charging circuit having assigned thereto a charge terminal area exposed on the upper side of the carrier, with which the output of the charging circuit is electrically connected,
the charge terminal area of the charging circuit being electrically connected with the second terminal area of the charge storage component via at least one second bonding wire, and
the control circuit controlling the charging circuit to charge the charge storage component up to a degree of charge necessary for generation of a light pulse by the light-emitting diode die, the control circuit subsequently driving the transistor to switch its conduction path to a conducting state.

2. The light module according to claim 1, wherein:
the at least one first bonding wire has a first parasitic inductance and a first parasitic ohmic resistance,
the at least one second bonding wire has a second parasitic inductance and a second parasitic ohmic resistance,
the electric connection of the first terminal area of the light-emitting diode die with the first end portion of the conduction path of the transistor comprises a third parasitic inductance and a third parasitic ohmic resistance, and
the electric connection between the first terminal area of the charge storage component and the second end portion of the conduction path of the transistor comprises a fourth parasitic inductance and a fourth parasitic inductance,
the electric connection of the output of the charging circuit with the charge terminal area assigned to the charging circuit comprises a fifth parasitic inductance and a fifth parasitic ohmic resistance,
wherein the first parasitic inductance, the third parasitic inductance and the fourth parasitic inductance have a magnitude that is, in total, less than the total of the magnitude of the third parasitic inductance and the fifth parasitic inductance or less than ½ or less than ¼ or less than ⅕ of the total of the third parasitic inductance and the fifth parasitic inductance.

3. The light module according to claim 2, wherein: the first parasitic ohmic resistance, the third parasitic ohmic resistance and the fourth parasitic ohmic resistance in total have a magnitude that is smaller than the magnitude of the third ohmic resistance and the fifth ohmic resistance in total or smaller than ½ or smaller than ¼ or smaller than ⅕ of the third ohmic resistance and the fifth ohmic resistance in total.

4. The light module according to claim 1, wherein:
electrically interconnected components, i.e. the light-emitting diode die, the charge storage component, the at least one first bonding wire and the transistor with its conduction path together form a discharging circuit with a first parasitic inductance and a first parasitic ohmic resistance,
the charge storage component with its electric connection to the output of the charging circuit forms a charging circuitry via the at least one second bonding wire, which circuitry has a second parasitic inductance and a second parasitic ohmic resistance,
wherein the first parasitic inductance is smaller than the second parasitic inductance or smaller than ½ or smaller than ¼ or smaller than ⅕ of the second inductance.

5. The light module according to claim 4, wherein the first parasitic ohmic resistance is less than the second parasitic ohmic resistance or less than ½ or less than ¼ or less than ⅕ of the second parasitic ohmic resistance.

6. The light module according to claim 1, comprising a plurality of first bonding wires and a plurality of second bonding wires.

7. The light module according to claim 1, wherein:
the light module comprises a plurality of light-emitting diode dies and a plurality of charge storage components,
each light-emitting diode die includes a charge storage component assigned thereto,
the upper side of the carrier comprises, for each light-emitting diode die, an exposed first terminal area that is electrically connected with the first end portion of the conduction path of the transistor, and, for each charge storage component, an exposed second terminal area that is electrically connected with the second end portion of the conduction path of the transistor,
in the circuit die for each charge storage component, a charging circuit assigned thereto is integrated, and a charge terminal area is arranged exposed on the upper side of the carrier for each charging circuit,
each light-emitting diode die is arranged with its first terminal area lying on the first conduction path terminal area of the transistor and these two terminal areas are electrically connected with one another,
each charge storage component is arranged with its first charge terminal area lying on the second conduction path terminal area of the transistor and these two terminal areas are electrically connected with one another,
the second terminal area of each light-emitting diode die is connected, by means of at least one first bonding wire, with the second terminal area of the charge storage component assigned to the respective light-emitting diode die,
the charge terminal area of each charging circuit is connected, by means of at least one second bonding wire, with the second terminal area of the charge storage component assigned to the respective charging circuit, and
the control circuit sequentially controls the charging circuits to charge the respective charge storage components up to a charge degree necessary to generate a light pulse by the light-emitting diode die assigned to the respective charge storage component and, prior to controlling a next charging circuit, controls the transistor to switch its conduction path to be conductive.

8. The light module according to claim 7, wherein: the first conduction path terminal areas are formed as subsections of a single common first conduction path terminal area and/or that the second conduction path terminal areas are formed as subsections of a single common second conduction path terminal area.

9. The light module according to claim 1, wherein the at least one light-emitting diode die is realized as a laser diode die with a laser diode configured as an edge emitter.

10. The light module according to claim 1, wherein a first supply voltage terminal area for a supply voltage potential is provided exposed on the upper side of the carrier, a supply voltage reference potential is adapted to be supplied to the second conduction path terminal area of the transistor or, if a plurality of such second conduction path terminal areas are present, to all of these second conduction path terminal areas of the transistor or to a second conduction path terminal area common to all of these second conduction path terminal areas.

11. The light module according to claim 10, further comprising a buffer capacitor component forming a buffer capacitor and having a lower side on which a first terminal area is arranged, and an upper side on which a second terminal area is arranged, wherein the buffer capacitor component is arranged resting with its first terminal area on the second conduction path terminal area or the second terminal areas or the second conduction terminal area common to all of these second conduction path terminal areas and the terminal areas on both sides are connected to one another, and wherein the second terminal area of the buffer capacitor component is electrically connected with the first supply voltage terminal area via at least one third bonding wire.

12. The light module according to claim 7 wherein the light-emitting diode dies and the charge storage components are each arranged in succession along two adjacent lines, each light-emitting diode die and the respective charge storage component associated thereto are arranged opposite each other to minimize a length of the first bonding wires electrically connecting their second terminal areas.

13. The light module according to claim 12, wherein each light-emitting diode die defines an optical axis along which a light beam emanating from the respective light-emitting diode die is directed, the line along which the light-emitting diode dies are arranged in succession either
extends in a shape of an arc around a center and optical axes of the light-emitting diode dies extend radially with respect to this arc-shaped line, or
extends in a straight line and the optical axes of the light-emitting diode dies (DID) extend perpendicularly thereto.

14. The light module according to claim 11, wherein each charge storage component comprises a charge storage capacitor.

15. The light module according to claim 14, wherein the charge storage component and the buffer capacitor component are formed as a common component which has a lower side with a common lower-side terminal area and an upper side with at least one first upper-side terminal area and a second upper-side terminal area and a dielectric between the lower-side terminal area and each of the first upper-side terminal area, and the second upper-side terminal area, wherein the buffer capacitor is formed between the second upper-side terminal area and the portion of the lower-side terminal area lying under this second upper-side terminal area, and each charge storage capacitor is formed between another one of the first upper-side terminal areas and the portion of the lower-side terminal area lying under this respective first upperside terminal area.

16. The light module according to claim 1, wherein: the carrier comprises a potting compound in which a lead frame with a plurality of conductor tongues and the circuit die electrically connected with the conductor tongues are embedded, wherein the conductor tongues comprising the terminal areas are exposed on the upper side of the carrier.

17. The light module according to claim 1, wherein:
if the transistor of the circuit die is formed therein as a voltage-controlled overall transistor, implemented in analog circuit technology and having an overall control terminal and an overall conduction path, for conducting an electric current via the overall conduction path and for blocking the current,
the overall control terminal extending over an overall control terminal surface of the circuit die,
if the control circuit comprises a driver circuit, implemented in digital circuit technology, for driving the overall driver terminal of the overall transistor for conducting and blocking the current, or that the circuit die comprises a driver circuit, implemented in digital circuit technology and controllable by the control circuit for driving the overall control terminal of the overall transistor for conducting and blocking the current, the overall transistor is subdivided into a plurality of single transistors implemented in analog circuit technology or comprising a plurality of such single transistors, each individual transistor comprising an individual control terminal and the individual control terminals of the individual transistors each extending over individual control terminal areas of the die which are equal in size and/or are uniformly distributed over the overall control terminal area of the overall transistor, the driver circuit comprises a plurality of individual driver circuits, each with one input and u outputs, where u is a natural integer greater than or equal to 2, being hierarchically divided into different stages, the output of an individual transistor circuit of an i-th stage, where i is 1 to v and v is a natural integer greater than or equal to 2, being connected with the inputs of u individual driver circuits of an (i−1)-th stage, the arrangement of an individual driver circuit of the i-th stage and the individual driver circuits of an (i+1)-th stage, whose inputs are connected with the outputs of the individual driver circuit of the i-th stage, forms a self-similar structure, the self-similar structures of an i-th stage being larger in area than the self-similar structures of an (i+1)-th stage, and the self-similar structures of the i-th stage being interleaved with an (i+1)-th stage with the self-similar structure of an i-th stage from which it originates, and the outputs of the individual driver circuits of a v-th stage being connected with the individual control terminal areas of the individual transistors.

18. The light module according to claim 17, wherein: each individual driver circuit comprises one input and four outputs, that each of the individual driver circuits of the i-th stage and the four individual driver circuits of the (i+1)-th stage together with the electric connection of the four outputs of the individual driver circuit of the i-th stage with the inputs of the four individual driver circuits of the (i+1)-th stage forms an H-shaped structure, wherein the individual driver circuits of the (i+1)-th stage are arranged at the four ends of the H-shaped structure and the individual driver circuit of the i-th stage is arranged in a middle between the four ends, and that the H-shaped structures have a same orientation from stage to stage.

19. The light module according to claim 18, wherein: each individual driver circuit comprises one input and two outputs, that each of the individual driver circuits of the i-th stage is arranged in the middle between the two individual driver circuits of the (i+1)-th stage and, together with the electric connection of the two outputs of the individual driver circuit of the i-th stage with the inputs of the two individual driver circuits of the (i+1)th stage, forms a straight structure, and that these self-similar structures are respectively rotated by 90° to each other from stage to stage.

20. The light module according to claim 17, wherein: the individual driver circuits are configured as inverter circuits and that the individual transistors are configured as power transistors or metal-oxide-semiconductor area-effect transistors (MOSFETs).

21. The light module according to claim 1, wherein the upper side of the carrier has a rectangular shape with two longitudinal edges and two transverse edges shorter in comparison to these longitudinal edges, the at least one first conduction path terminal area of the transistor being arranged at one of the two transverse edges and terminal areas for a power supply of the control circuit, the at least one charging circuit, at least one charge storage component and the at least one light-emitting diode die being arranged at the other transverse edge.

22. The light module according to claim 21, wherein: on each of the longitudinal edges of the upper side of the carrier, one of two transfer signal terminal areas of at least one pair of transfer signal terminal areas is arranged, which are electrically connected with each other and serve to supply transfer signals intended for the circuit die, such as a reset signal, a diagnosis signal, a bus communication signal, a trigger signal for triggering the generation of a light pulse by the at least one light-emitting diode die, the transfer signals being adapted to be transferred, if a plurality of light modules are arranged side-by-side, from one light module to a respective adjacent light module or from one light module, after processing in the circuit die thereof, to the respective adjacent light module.

23. An arrangement of a plurality of light modules according to claim 22, wherein, when the light modules are arranged side by side with the longitudinal edges of their upper sides, the transfer signal terminal areas of identical pairs of transfer signal terminal areas of two respectively adjacent light modules are electrically interconnected.

24. The arrangement according to claim 23, wherein the light-emitting diode dies of all light modules arranged side by side are arranged on a common arcuately bent line or on a straight line.

\* \* \* \* \*